(12) United States Patent
Ishizu et al.

(10) Patent No.: US 10,236,884 B2
(45) Date of Patent: Mar. 19, 2019

(54) WORD LINE DRIVER COMPRISING NAND CIRCUIT

(71) Applicant: Semiconductor Energy Laboratory Co., Ltd., Atsugi-shi, Kanagawa-ken (JP)

(72) Inventors: Takahiko Ishizu, Kanagawa (JP); Wataru Uesugi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 90 days.

(21) Appl. No.: 15/017,879

(22) Filed: Feb. 8, 2016

(65) Prior Publication Data

US 2016/0233866 A1 Aug. 11, 2016

(30) Foreign Application Priority Data

Feb. 9, 2015 (JP) .................................. 2015-023048

(51) Int. Cl.
| | |
|---|---|
| *G11C 7/00* | (2006.01) |
| *H03K 19/0175* | (2006.01) |
| *H03K 19/00* | (2006.01) |
| *G11C 8/08* | (2006.01) |
| *G11C 11/412* | (2006.01) |
| *G11C 29/50* | (2006.01) |

(52) U.S. Cl.
CPC ....... *H03K 19/017509* (2013.01); *G11C 8/08* (2013.01); *G11C 11/4125* (2013.01); *G11C 29/50016* (2013.01); *H03K 19/0008* (2013.01); *G11C 2029/5002* (2013.01)

(58) Field of Classification Search
CPC ... G11C 8/08; G11C 11/4082; G11C 11/4074; H03K 19/0175; H03K 19/0008; H03K 19/0013; H03K 19/017509
USPC ........................................ 365/189.11, 185.05
See application file for complete search history.

(56) References Cited

U.S. PATENT DOCUMENTS

| | | |
|---|---|---|
| 5,744,864 A | 4/1998 | Cillessen et al. |
| 8,476,626 B2 | 7/2013 | Yamazaki et al. |

(Continued)

FOREIGN PATENT DOCUMENTS

| | | |
|---|---|---|
| JP | 06-275697 A | 9/1994 |
| JP | 11-505377 A | 5/1999 |

(Continued)

*Primary Examiner* — Gene Auduong
(74) *Attorney, Agent, or Firm* — Fish & Richardson P.C.

(57) ABSTRACT

A semiconductor device with lower power consumption and an electronic device including the same are provided. To reduce leakage current flowing in a word line driver circuit, a switching element is provided, specifically, between the word line driver circuit and a high or low voltage power source. When there is no memory access, the switching element is turned off, thereby interrupting application of voltage (or current) from the high or low voltage power source to the word line driver circuit. Furthermore, to reduce the stand-by power due to precharge of a bit line, a switching element is provided in a bit line driver circuit, specifically, between the bit line and a high or low voltage power source. When there is no memory access, the switching element is turned off, thereby interrupting application of voltage (or current) from the high or low voltage power source to the bit line driver circuit.

5 Claims, 57 Drawing Sheets

(56) References Cited

U.S. PATENT DOCUMENTS

| | | | |
|---|---|---|---|
| 2003/0042955 A1* | 3/2003 | Nakayama | G11C 7/22 327/200 |
| 2007/0121406 A1* | 5/2007 | Oh | G11C 8/10 365/222 |
| 2016/0232956 A1 | 8/2016 | Ishizu et al. | |

FOREIGN PATENT DOCUMENTS

| | | |
|---|---|---|
| JP | 2011-129893 A | 6/2011 |
| WO | 97/06554 A2 | 2/1997 |

* cited by examiner

102

103

FIG. 46A
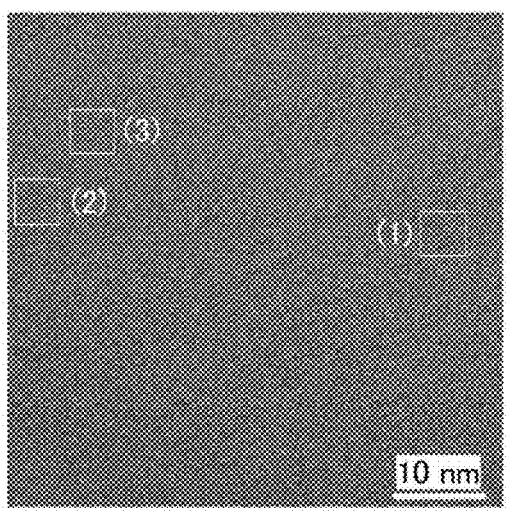
FIG. 46B  FIG. 46C  FIG. 46D
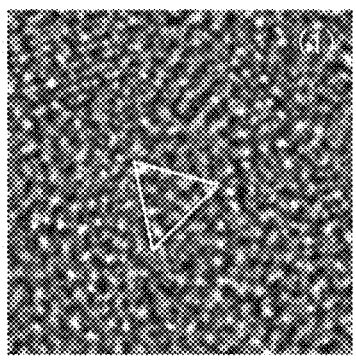 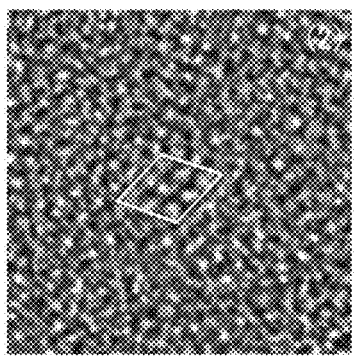 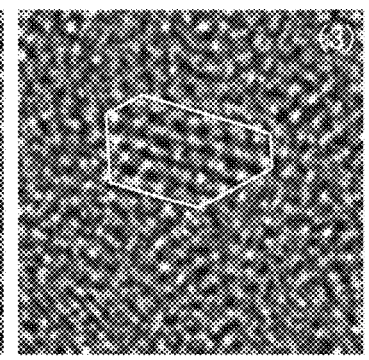

WORD LINE DRIVER COMPRISING NAND CIRCUIT

BACKGROUND OF THE INVENTION

1. Field of the Invention

One embodiment of the present invention relates to a semiconductor device or an electronic device including the semiconductor device.

Note that one embodiment of the present invention is not limited to the above technical field. The technical field of the invention disclosed in this specification and the like relates to an object, a method, or a manufacturing method. One embodiment of the present invention also relates to a process, a machine, manufacture, or a composition of matter. Specifically, examples of the technical field of one embodiment of the present invention disclosed in this specification include a semiconductor device, a display device, a liquid crystal display device, a light-emitting device, a power storage device, an imaging device, a memory device, a processor, an electronic device, a method for driving any of them, a method for manufacturing any of them, and a method for testing any of them.

2. Description of the Related Art

In recent years, semiconductor devices such as central processing units (CPUs), memories, and sensors have been used in various electronic devices such as personal computers, smart phones, and digital cameras. The performance of the semiconductor devices has been improved to achieve miniaturization, lower power consumption, and other various objectives.

One of the ways that have been proposed to achieve higher performance such as lower power consumption and miniaturization is the use of an oxide semiconductor for a semiconductor layer (hereinafter also referred to as an active layer, a channel layer, or a channel formation region) of a transistor in a semiconductor device. An example of the transistor includes an oxide of indium, gallium, and zinc (hereinafter also referred to as an In—Ga—Zn oxide) for a channel layer (see Patent Document 1).

REFERENCES

Patent Documents

[Patent Document 1] Japanese Translation of PCT International Application No. H11-505377
[Patent Document 2] Japanese Published Patent Application No. 2011-129893

SUMMARY OF THE INVENTION

Memories consume power even in a stand-by mode such as a write request mode and a read request mode (hereinafter, such power is also referred to as stand-by power). The stand-by power of the memories can be classified into that of memory cell arrays and that of peripheral circuits.

For example, in a static random access memory (SRAM), a common semiconductor memory, a leakage current flows through transistors in cells, increasing the stand-by power of a memory cell array. The use of a transistor including an oxide semiconductor in a channel formation region (hereinafter also referred to as an oxide semiconductor (OS) transistor) leads to, in some cases, a decrease in leakage current to reduce the stand-by power of the memory cell array (Patent Document 2).

Furthermore, for example, memories of recent years have a smaller size and a larger capacity; as a result, a leakage current is likely to flow also in a peripheral circuit such as a word driver circuit, increasing the stand-by power of the peripheral circuit.

In addition, a bit line needs to be precharged to a predetermined voltage in write and read operations of the memory cells. Accordingly, a leakage current sometimes flows in the memory cells connected to the bit line, causing a large stand-by power.

Thus, to reduce the power consumption of the entire memory, not only the stand-by power of the memory cell array but also the stand-by power of the peripheral circuit should be reduced.

An object of one embodiment of the present invention is to provide a novel semiconductor device. Another object of one embodiment of the present invention is to provide a memory device including the novel semiconductor device. Another object of one embodiment of the present invention is to provide an electronic device using the memory device including the novel semiconductor device.

Another object of one embodiment of the present invention is to provide a novel semiconductor device with lower power consumption. Another object of one embodiment of the present invention is to provide a driving method of a semiconductor device capable of reducing the power consumption of the semiconductor device.

Note that the objects of one embodiment of the present invention are not limited to those listed above. The above objects do not exclude the existence of other objects. The other objects are the ones that are not described above and will be described below. The other objects will be apparent from and can be derived from the description of the specification, the drawings, and the like by those skilled in the art. One embodiment of the present invention solves at least one of the above objects and the other objects. One embodiment of the present invention need not solve all the above objects and the other objects.

(1) One embodiment of the present invention is a semiconductor device including a first circuit, a first transistor, and a second transistor. The first circuit includes a NAND circuit and an inverter circuit. The inverter circuit includes a first input terminal, a first output terminal, a first potential input terminal, and a second potential input terminal. The NAND circuit includes a second input terminal, a third input terminal, a second output terminal, a third potential input terminal, and a fourth potential input terminal. The second output terminal is electrically connected to the first input terminal. The first potential input terminal is electrically connected to one of a source and a drain of the first transistor. The fourth potential input terminal is electrically connected to one of a source and a drain of the second transistor. A potential from a high potential power source is input to the other of the source and the drain of the first transistor. A potential from a low potential power source is input to the other of the source and the drain of the second transistor. The first transistor is a p-channel transistor and the second transistor is an n-channel transistor.

(2) Another embodiment of the present invention is the semiconductor device according to (1), further including a second circuit. The second circuit includes a plurality of first circuits, the first transistor, and the second transistor. In the second circuit, the second input terminal of one of the NAND circuits is electrically connected to the second input terminals of the other NAND circuits. The first potential input terminal of each of the inverter circuits is electrically connected to one of the source and the drain of the first transistor. The fourth potential input terminal of each of the NAND circuits is electrically connected to one of the source and the drain of the second transistor.

(3) Another embodiment of the present invention is a semiconductor device including a first circuit, a first transistor, and a second transistor. The first circuit includes a NAND circuit and an inverter circuit. The inverter circuit includes a first input terminal, a first output terminal, a first potential input terminal, and a second potential input terminal. The NAND circuit includes a second input terminal, a third input terminal, a second output terminal, a third potential input terminal, and a fourth potential input terminal. The second output terminal is electrically connected to the first input terminal. The third potential input terminal is electrically connected to one of a source and a drain of the first transistor. The second potential input terminal is electrically connected to one of a source and a drain of the second transistor. A potential from a high potential power source is input to the other of the source and the drain of the first transistor. A potential from a low potential power source is input to the other of the source and the drain of the second transistor. The first transistor is a p-channel transistor and the second transistor is an n-channel transistor.

(4) Another embodiment of the present invention is a semiconductor device including a first circuit, a first transistor, and a second transistor. The first circuit includes an AND circuit and an inverter circuit. The inverter circuit includes a first input terminal, a first output terminal, a first potential input terminal, and a second potential input terminal. The AND circuit includes a second input terminal, a third input terminal, a second output terminal, a third potential input terminal, and a fourth potential input terminal. The second output terminal is electrically connected to the first input terminal. The third potential input terminal is electrically connected to one of a source and a drain of the first transistor. The second potential input terminal is electrically connected to one of a source and a drain of the second transistor. A potential from a high potential power source is input to the other of the source and the drain of the first transistor. A potential from a low potential power source is input to the other of the source and the drain of the second transistor. The first transistor is a p-channel transistor and the second transistor is an n-channel transistor.

(5) Another embodiment of the present invention is the semiconductor device according to any one of (3) and (4), further including a second circuit. The second circuit includes a plurality of first circuits, the first transistor, and the second transistor. In the second circuit, the second input terminal of one of the NAND circuits or one of the AND circuits is electrically connected to the second input terminals of the other NAND circuits or the other AND circuits. The third potential input terminal of each of the NAND circuits or the AND circuits is electrically connected to one of the source and the drain of the first transistor. The second potential input terminal of each of the inverter circuits is electrically connected to one of the source and the drain of the second transistor.

(6) Another embodiment of the present invention is the semiconductor device according to any one of (2) and (5), further including a plurality of second circuits. The second input terminal of one of the NAND circuits or one of the AND circuits is electrically connected to the second input terminals of the other NAND circuits or the other AND circuits.

(7) Another embodiment of the present invention is a semiconductor device including a first circuit, a first transistor, and a second transistor. The first circuit includes third to fifth transistors and an inverter circuit. The inverter circuit includes a first input terminal, a first output terminal, a first potential input terminal, and a second potential input terminal. One of a source and a drain of the third transistor is electrically connected to one of a source and a drain of the fourth transistor. The other of the source and the drain of the third transistor is electrically connected to the other of the source and the drain of the fourth transistor, one of a source and a drain of the fifth transistor, and the first input terminal. A gate of the fourth transistor is electrically connected to a gate of the fifth transistor. The first potential input terminal is electrically connected to one of a source and a drain of the first transistor. The other of the source and the drain of the fifth transistor is electrically connected to one of a source and a drain of the second transistor. A potential from a high potential power source is input to the other of the source and the drain of the first transistor. A potential from a low potential power source is input to the other of the source and the drain of the second transistor. The first, third, and fourth transistors are p-channel transistors and the second and fifth transistors are n-channel transistors.

(8) Another embodiment of the present invention is the semiconductor device according to (7), further including a second circuit. The second circuit includes a plurality of first circuits, the first transistor, and the second transistor. In the second circuit, all the first potential input terminals are electrically connected to the one of the source and the drain of the first transistor, a gate of each of the third transistors is electrically connected to a gate of the second transistor, and the other of the source and the drain of each of the fifth transistors is electrically connected to the one of the source and the drain of the second transistor.

(9) Another embodiment of the present invention is the semiconductor device according to (8), further including a plurality of second circuits.

(10) Another embodiment of the present invention is the semiconductor device according to any one of (1) to (6), further including a first level shifter and a second level shifter. An output terminal of the first level shifter is electrically connected to all the second input terminals, and an output terminal of the second level shifter is electrically connected to all the third input terminals.

(11) Another embodiment of the present invention is the semiconductor device according to any one of (7) to (9), further including a first level shifter and a second level shifter. An output terminal of the first level shifter is electrically connected to the gates of all the third transistors, and an output terminal of the second level shifter is electrically connected to the third input terminal.

(12) Another embodiment of the present invention is the semiconductor device according to any one of (1) to (11), in which the first transistor and the second transistor each include an oxide semiconductor in a channel formation region.

(13) Another embodiment of the present invention is a semiconductor device including a memory cell, a first wiring, a second wiring, and a transistor. One of a source and a drain of the transistor is electrically connected to the first wiring, and the other of the source and the drain of the transistor is electrically connected to the second wiring. The memory cell is electrically connected to the first wiring. A potential is supplied from the second wiring to the first wiring through the transistor.

(14) Another embodiment of the present invention is the semiconductor device according to (13), in which the transistor includes an oxide semiconductor in a channel formation region.

(15) Another embodiment of the present invention is a memory device including the semiconductor device according to any one of (1) to (14).

(16) Another embodiment of the present invention is an electronic device including the memory device according to (15) and a housing.

One embodiment present invention can provide a novel semiconductor device. Another embodiment of the present invention can provide a memory device including the novel semiconductor device. Another embodiment of the present invention can provide an electronic device using the memory device including the novel semiconductor device.

Another embodiment of the present invention can provide a novel semiconductor device with lower power consumption. Another embodiment of the present invention can provide a driving method of a semiconductor device capable of reducing the power consumption of the semiconductor device.

Note that the effects of one embodiment of the present invention are not limited to those listed above. The above effects do not exclude the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Hence, one embodiment of the present invention does not have all the above effects in some cases.

BRIEF DESCRIPTION OF THE DRAWINGS

In the accompanying drawings:

FIGS. 46A to 46D are Cs-corrected high-resolution TEM images of a plane of a CAAC-OS;

DETAILED DESCRIPTION OF THE INVENTION

Embodiment 1

Described in this embodiment is a structure example of a circuit of a semiconductor device according to one embodiment of the present invention.

Structure Example 1 of Word Line Driver Circuit

First, a structure example of a word line driver circuit electrically connected to a row of memory cells in a memory cell array of this embodiment will be described.

Figure 2A:
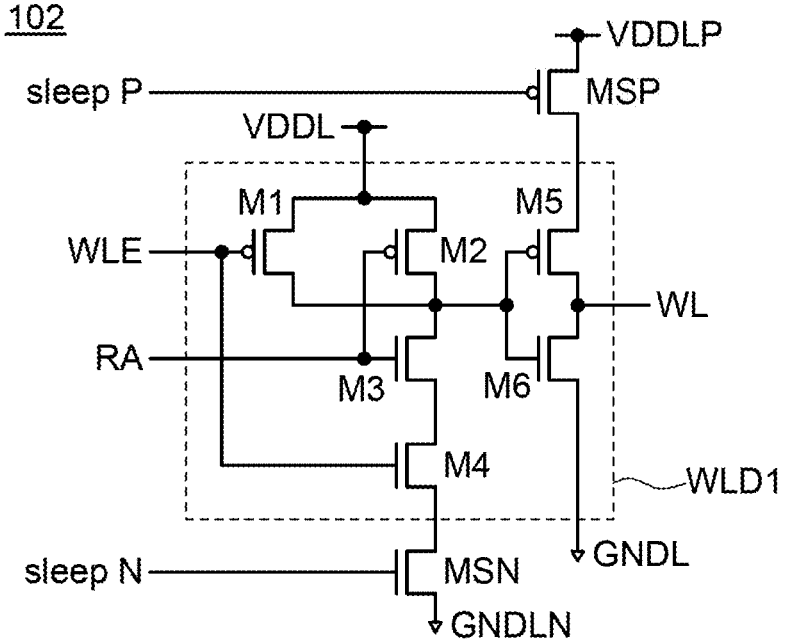
FIGS. 2A and 2B are circuit diagrams each showing an example of a semiconductor device of one embodiment of the present invention.

FIG. 2A shows a structure example of a word line driver circuit. A word line driver circuit 102 includes a transistor MSP, a transistor MSN, and a circuit WLD1. The circuit WLD1 (in this specification, also referred to as a unit word line driver) includes transistors M1 to M6. The transistors MSP, M1, M2, and M5 are p-channel transistors, and the transistors MSN, M3, M4, and M6 are n-channel transistors.

A gate of the transistor M1 is electrically connected to a gate of the transistor M4 and a wiring WLE. One of a source and a drain of the transistor M1 is electrically connected to one of a source and a drain of the transistor M2, and the other of the source and the drain of the transistor M1 is electrically connected to the other of the source and the drain of the transistor M2, one of a source and a drain of the transistor M3, a gate of the transistor M5, and a gate of the transistor M6. A gate of the transistor M2 is electrically connected to a gate of the transistor M3 and a wiring RA. The other of the source and the drain of the transistor M3 is electrically connected to one of a source and a drain of the transistor M4. One of a source and a drain of the transistor M5 is electrically connected to one of a source and a drain of the transistor M6 and a wiring WL.

A wiring VDDL is electrically connected to the one of the source and the drain of the transistor M1 and the one of the source and the drain of the transistor M2. The other of the source and the drain of the transistor M4 is electrically connected to one of a source and a drain of the transistor MSN, and the other of the source and the drain of the transistor MSN is electrically connected to a wiring GNDLN. The other of the source and the drain of the transistor M5 electrically connected to one of a source and a drain of the transistor MSP, and the other of the source and the drain of the transistor MSP is electrically connected to a wiring VDDLP. A wiring GNDL is electrically connected to the other of the source and the drain of the transistor M6. A gate of the transistor MSN is electrically connected to a wiring sleepN, and a gate of the transistor MSP is electrically connected to a wiring sleepP.

The circuit WLD1 needs to be connected to a high potential power source and a low potential power source to be driven. The aforementioned wirings VDDL and VDDLP are used to connect any circuit to the high potential power source. The aforementioned wirings GNDL and GNDLN are used to connect any circuit to the low potential power source. Here, the high potential power source is configured to supply a power source voltage VDD and the low potential power source is configured to supply a fixed potential GND.

The wirings WLE and RA are used to input an external signal to the word line driver circuit 102, and the wiring WL is used to output a writing selection signal from the word line driver circuit 102 to a predetermined memory cell.

Figure 2B:
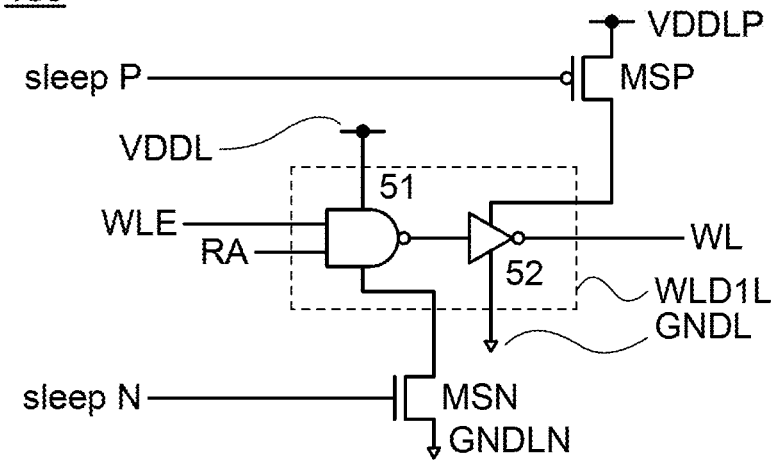

The circuit WLD1 is obtained by connecting an output terminal of a NAND circuit and an input terminal of an inverter circuit in series. Thus, the circuit WLD1 in the word line driver circuit 102 in FIG. 2A can be replaced with a circuit WLD1L in a word line driver circuit 103 in FIG. 2B. Specifically, the transistors M1 to M4 in the word line driver circuit 102 in FIG. 2A are replaced with a NAND circuit 51 in FIG. 2B, and the transistors M5 and M6 in the word line driver circuit 102 in FIG. 2A are replaced with an inverter circuit 52 in FIG. 2B.

Since the circuit WLD1 is obtained by connecting the output terminal of the NAND circuit and the input terminal of the inverter circuit in series, it can be collectively regarded as an AND circuit. That is, when a high-level potential is input to the wirings WLE and RA, the high-level potential is output from the wiring WL; and when a low-level potential is input to at least one of the wirings WLE and RA, the low-level potential is output from the wiring WL.

Structure Example 2 of Word Line Driver Circuit

Described here is a structure example of 128 unit word line drivers which are driven for every 16 unit word line drivers.

Figure 1:
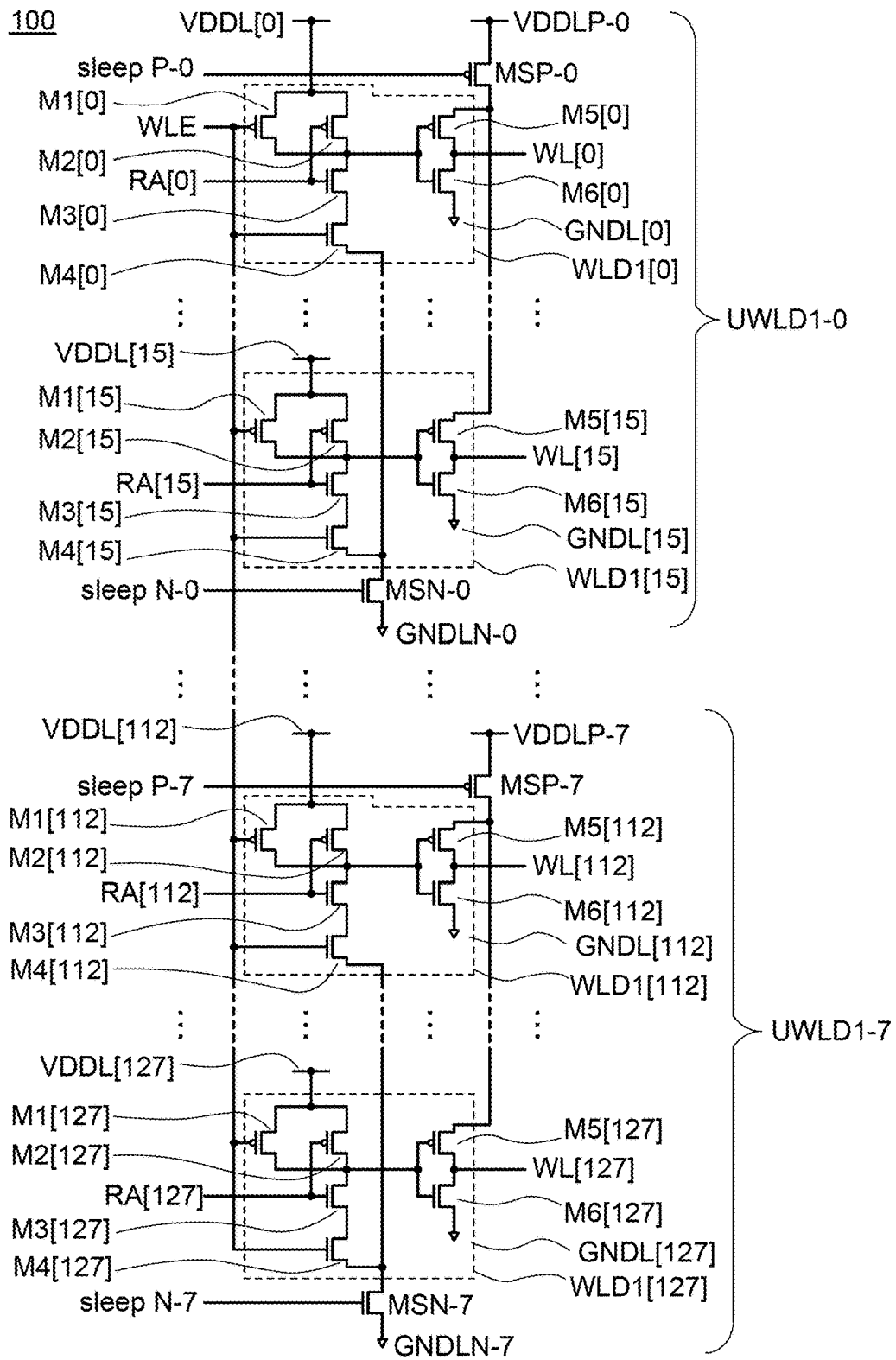
FIG. 1 is a circuit diagram showing an example of a semiconductor device of one embodiment of the present invention.

FIG. 1 shows an example of a word line driver circuit of one embodiment of the present invention. A word line driver circuit 100 shown in FIG. 1 consists of 8 stages: each stage includes 16 circuits WLD1 and 2 sleep transistors (denoted by transistors MSP-j and MSN-j in FIG. 1).

The word line driver circuit 100 includes p-channel transistors M1[0] to M1[127], p-channel transistors M2[0] to M2[127], n-channel transistors M3[0] to M3[127], n-channel transistors M4[0] to M4[127], p-channel transistors M5[0] to M5[127], n-channel transistors M6[0] to M6[127], p-channel transistors MSP-0 to MSP-7, and n-channel transistors MSN-0 to MSN-7.

As shown in FIG. 1, a circuit WLD1[$i$] ($i$ is an integer of 16×j to 16×(j+1)−1, and j is an integer of 0 to 7; for example, i is an integer of 112 to 127 when j=7) includes transistors M1[$i$] to M6[$i$]. A circuit UWLD1-$j$ includes circuits WLD1[16×j] to WLD1[16×(j+1)−1] and transistors MSP-j and MSN-j.

A gate of the transistor M1[$i$] is electrically connected to a gate of the transistor M4[$i$] and the wiring WLE. One of a source and a drain of the transistor M1[$i$] is electrically connected to one of a source and a drain of the transistor M2[$i$] and a wiring VDDL[i], and the other of the source and the drain of the transistor M1[$i$] is electrically connected to the other of the source and the drain of the transistor M2[$i$], one of a source and a drain of the transistor M3[$i$], a gate of the transistor M5[$i$], and a gate of the transistor M6[$i$].

A gate of the transistor M2[$i$] is electrically connected to a gate of the transistor M3[$i$] and a wiring RA[$i$]. The other of the source and the drain of the transistor M3[$i$] is electrically connected to one of a source and a drain of the transistor M4[$i$]. A gate of the transistor M4[$i$] is electrically connected to the wiring WLE. The other of the source and the drain of the transistor M4[$i$] is electrically connected to one of a source and a drain of the transistor MSN-j (j is an integer of 0 to 7). One of a source and a drain of the transistor M5[$i$] is electrically connected to one of a source and a drain of the transistor M6[$i$] and a wiring WL[$i$], and the other of the source and the drain of the transistor M5[$i$] is electrically connected to one of a source and a drain of the transistor MSP-j. The other of the source and the drain of the transistor M6[$i$] is electrically connected to a wiring GNDL[$i$].

A gate of the transistor MSP-j is electrically connected to a wiring sleepP-j, and the other of the source and the drain of the transistor MSP-j is electrically connected to a wiring VDDLP-j. A gate of the transistor MSN-j is electrically connected to a wiring sleepN-j, and the other of the source and the drain of the transistor MSN-j is electrically connected to a wiring GNDLN-j.

Note that some reference numerals are omitted in FIG. 1. Specifically, FIG. 1 does not show reference numerals except for the following: the wiring sleepP-0, the wiring sleepP-7, the wiring sleepN-0, the wiring sleepN-7, the wiring WLE, the wiring RA[0], the wiring RA[15], the wiring RA[112], the wiring RA[127], the wiring WL[0], the wiring WL[15], the wiring WL[112], the wiring WL[127], the wiring VDDL[0], the wiring VDDL[15], the wiring VDDL[112], the wiring VDDL[127], the wiring GNDL[0], the wiring GNDL[15], the wiring GNDL[112], the wiring GNDL[127], the wiring VDDLP-0, the wiring VDDLP-7, the wiring GNDLN-0, the wiring GNDLN-7, the transistor MSN-0, the transistor MSN-7, the transistor MSP-0, the transistor MSP-7, the transistor M1[0], the transistor M2[0], the transistor M3[0], the transistor M4[0], the transistor M5[0], the transistor M6[0], the transistor M1[15], the transistor M2[15], the transistor M3[15], the transistor M4[15], the transistor M5[15], the transistor M6[15], the transistor M1[112], the transistor M2[112], the transistor M3[112], the transistor M4[112], the transistor M5[112], the transistor M6[112], the transistor M1[127], the transistor M2[127], the transistor M3[127], the transistor M4[127], the transistor M5[127], the transistor M6[127], the circuit WLD1[0], the circuit WLD1[15], the circuit WLD1[112], the circuit WLD1[127], the circuit UWLD1-0, and the circuit UWLD1-7.

Note that as in the word line driver circuit 102, the circuit WLD1[$i$] in the word line driver circuit 100 needs to be connected to a high potential power source and a low potential power source to be driven. Although not shown, the wirings VDDL[0] to VDDL[127] and the wirings VDDLP-0 to VDDLP-7 are connected to a high potential power source and supplied with the power source voltage VDD from the high potential power source. Although not shown, the wirings GNDL[0] to GNDL[127] and the wirings GNDLN-0 to GNDLN-7 are connected to a low potential power source and supplied with the fixed potential GND (also referred to as a reference potential or a ground potential in some cases) from the low potential power source.

The wirings WLE and RA[i] are used to input an external signal to the word line driver circuit 100, and the wiring WL[i] is used to output a writing selection signal from the word line driver circuit 100 to a predetermined memory cell.

<Operation Example of Word Line Driver Circuit>

Figure 3:
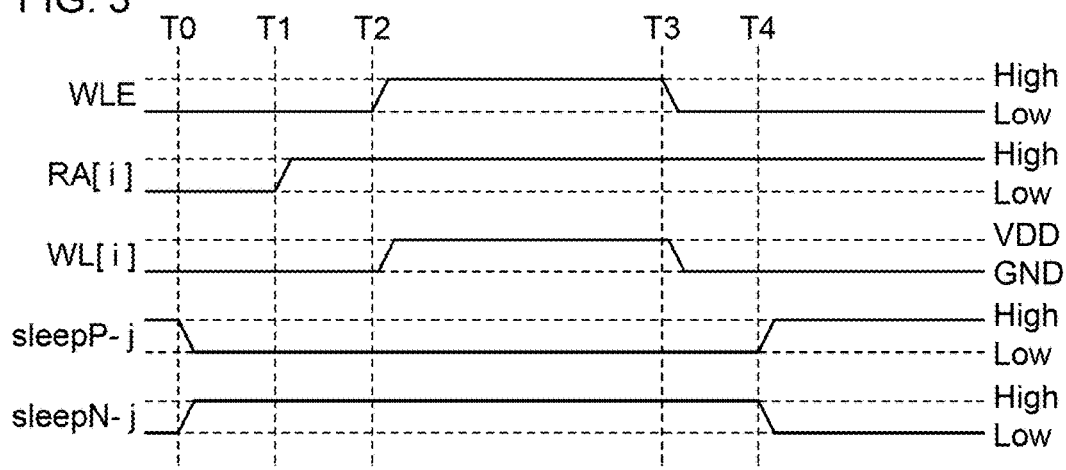
FIG. 3 is a timing chart showing an operation example of the semiconductor device shown in FIG. 1.

Described is an operation example of the word line driver circuit 100 shown in FIG. 1. FIG. 3 is a timing chart showing an operation example of the word line driver circuit 100. Note that for simplicity, the timing chart of FIG. 3 shows an operation example of the circuit WLD1[$i$] in a j-th stage, and specifically shows changes in the potentials of the wiring WLE, the wiring RA[i], the wiring WL[i], the wiring sleepP-j, and the wiring sleepN-j. Note that "Low" denotes a low-level potential and "High" denotes a high-level potential. The power source voltage VDD or the fixed potential GND is input to each of the wirings WLE and RA[i]. However, as long as the on/off states of the transistors M1[$i$] to M4[$i$] connected to the wirings WLE and RA[i] can be controlled, a voltage lower than the power source voltage VDD and a voltage higher than the fixed potential GND may be input as the high-level potential (High) and the low-level potential (Low), respectively. Hence, the high-level potential and the low-level potential of the wirings WLE and RA[i] are denoted by "High" and "Low" in FIG. 3, respectively.

At Time T0, the potential of the wiring sleepP-j is Low and the potential of the wiring sleepN-j is High. As a result, the transistor MSP-j connected to the wiring sleepP-j and the transistor MSN-j connected to the wiring sleepN-j are turned on. That is, the power source voltage VDD is applied to the one of the source and the drain of the transistor M5[$i$] through the transistor MSP-j, and the fixed potential GND is applied to the other of the source and the drain of the transistor M4[$i$] through the transistor MSN-j.

From Time T0 to Time T1, a low-level potential is applied to the wirings WLE and RA[i]. That is, a low-level potential is applied to the gates of the transistors M1[$i$] to M4[$i$]; accordingly, the transistors M1[$i$] and M2[$i$] are turned on whereas the transistors M3[$i$] and M4[$i$] are turned off. Then, the power source voltage VDD is applied to the gates of the transistors M5[$i$] and M6[$i$] through the transistors M1[$i$] and M2[$i$]. As a result, the transistor M5[$i$] is turned off and the transistor M6[$i$] is turned on; thus, the fixed potential GND is output to the wiring WL[i] through the transistor M6[$i$].

At Time T1, a high-level potential is applied to the wiring RA[i]. At this time, a high-level potential is applied to the gates of the transistors M2[i] and M3[i]; accordingly, the transistor M2[i] is turned off and the transistor M3[i] is turned on. Since the transistor M1[i] is still on at this time, the power source voltage VDD is applied to the gates of the transistors M5[i] and M6[i] as in the time before Time T1. Since the transistor M4[i] is off, the fixed potential GND is not applied to the other of the source and the drain of the transistor M3[i] through the transistor M4[i]. In other words, a low-level potential is output to the wiring WL[i] as in the time before Time T1.

At Time T2, a high-level potential is applied to the wiring WLE. At this time, a high-level potential is applied to the gates of the transistors M1[i] and M4[i]; accordingly, the transistor M1[i] is turned off and the transistor M4[i] is turned on. Since the transistor M2[i] is still off, the power source voltage VDD ceases to be applied to the gates of the transistors M5[i] and M6[i] through the transistors M1[i] and M2[i]. Since the transistor M3[i] is on, the fixed potential GND is applied to the gates of the transistors M5[i] and M6[i] through the transistors M3[i] and M4[i]. Thus, the transistor M5[i] is turned on whereas the transistor M6[i] is turned off, and accordingly, the power source voltage VDD is output to the wiring WL[i] through the transistor M5[i].

Note that from Time T2 to Time T3, the power source voltage VDD is applied from the wiring WL[i] to memory cells in the i-th row, i.e., data is written thereto at this time. In other words, when a high-level potential is input to the wiring WLE while a high-level potential is input to at least one of the wirings RA[0] to RA[127], data can be simultaneously written to the memory cells in a row of any of the wirings RA[0] to RA[127] that has a high-level potential.

In addition, when all the wirings RA[16×j] to RA[16×(j+1)−1] in the j-th stage have a low-level potential, no data is written to the memory cells in all the rows of the j-th stage. At this time, the transistors MSN-j and MSP-j are preferably off because the circuits WLD1[16×j] to WLD1[16×(j+1)−1] in the j-th stage, namely, the circuit UWLD1-j does not need to operate. This results in interrupted supply of the power source voltage VDD and the fixed potential GND to the circuit UWLD1-j from which no writing selection signal is output, reducing power consumption.

At Time T3, a low-level potential is applied to the wiring WLE. At this time, a low-level potential is applied to the gates of the transistors M1[i] and M4[i]; accordingly, the transistor M1[i] is turned on and the transistor M4[i] is turned off. In other words, the on/off states of the transistors M1[i] to M4[i] are returned to the states from Time T1 to Time T2; thus, the fixed potential GND is output to the wiring WL[i].

At Time T4, the potential of the wiring sleepP-j is High and the potential of the wiring sleepN-j is Low. As a result, the transistor MSP-j and the transistor MSN-j are turned off. This results in interrupted supply of the power source voltage VDD and the fixed potential GND to the word line driver circuit 100, reducing power consumption.

Note that in the timing chart of FIG. 3, the potential of the wiring sleepP-j is Low and the potential of the wiring sleepN-j is High at Time T0; however, the operation of the word line driver circuit 100 is not limited to this. For example, from Time T1 to Time T2, a low-level potential and a high-level potential may be applied to the wirings sleepP-j and sleepN-j, respectively.

Structure Example 3 of Word Line Driver Circuit

Described here is a structure example of 128 unit word line drivers which can be driven simultaneously.

Figure 4:
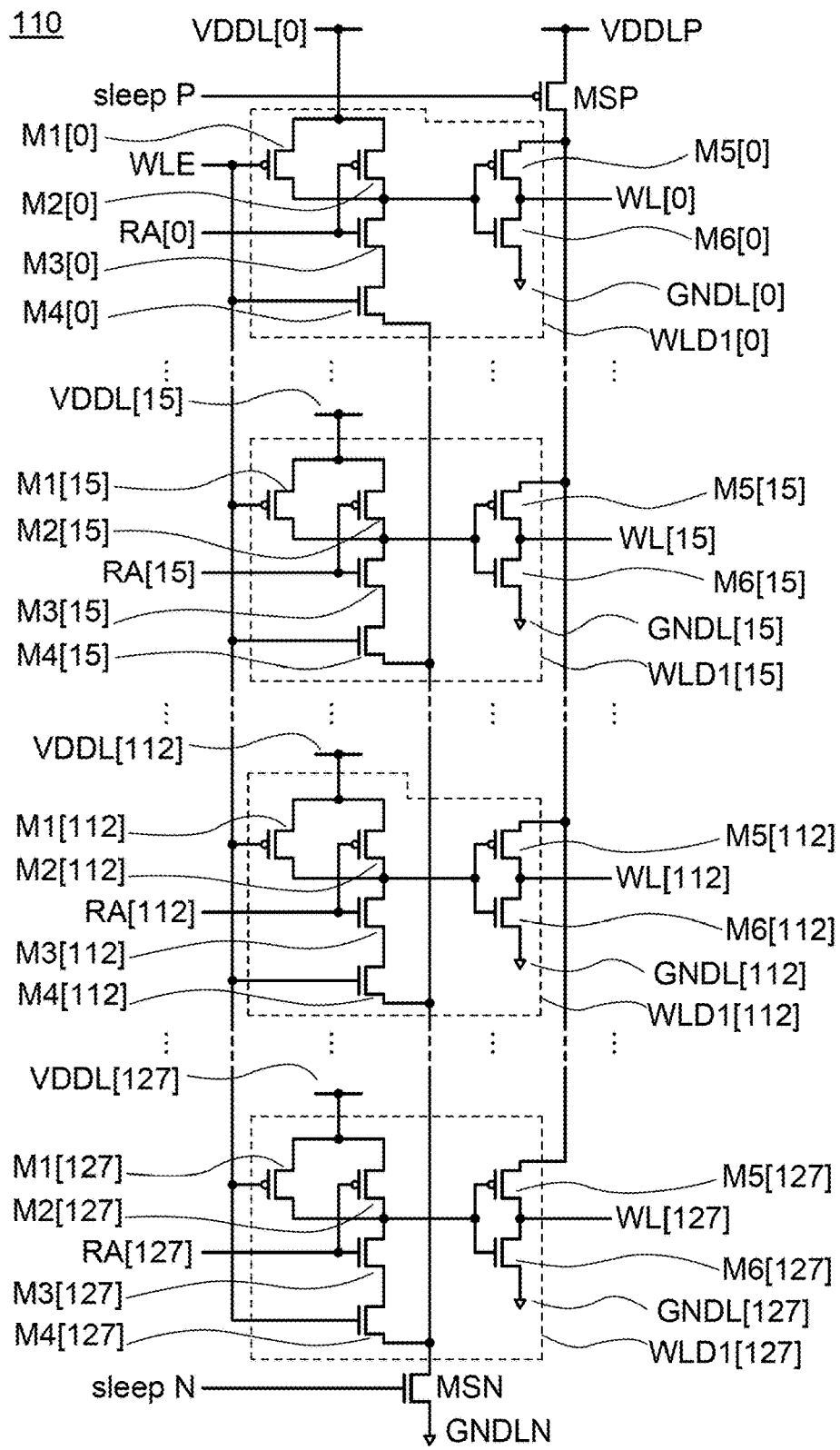
FIG. 4 is a circuit diagram showing an example of a semiconductor device of one embodiment of the present invention.

The word line driver circuit shown in FIG. 1 consists of 8 stages, each of which includes the 16 circuits WLD1 and the transistors MSP-j and MSN-j as sleep transistors. FIG. 4 shows another example of the word line driver circuit different from that in FIG. 1. A word line driver circuit 110 includes 128 circuits WLD1 and two sleep transistors (denoted by transistors MSP and MSN in FIG. 4).

The word line driver circuit 110 includes the p-channel transistors M1[0] to M1[127], the p-channel transistors M2[0] to M2[127], the n-channel transistors M3[0] to M3[127], the n-channel transistors M4[0] to M4[127], the p-channel transistors M5[0] to M5[127], the n-channel transistors M6[0] to M6[127], the p-channel transistor MSP, and the n-channel transistor MSN.

The gate of the transistor M1[i] (i is an integer of 0 to 127) is electrically connected to the wiring WLE. One of the source and the drain of the transistor M1[i] is electrically connected to one of the source and the drain of the transistor M2[i] and a wiring VDDL[i], and the other of the source and the drain of the transistor M1[i] is electrically connected to the other of the source and the drain of the transistor M2[i], one of the source and the drain of the transistor M3[i], the gate of the transistor M5[i], and the gate of the transistor M6[i].

The gate of the transistor M2[i] is electrically connected to the gate of the transistor M3[i] and the wiring RA[i]. The other of the source and the drain of the transistor M3[i] is electrically connected to one of the source and the drain of the transistor M4[i]. The gate of the transistor M4[i] is electrically connected to the wiring WLE. The other of the source and the drain of the transistor M4[i] is electrically connected to one of a source and a drain of the transistor MSN. One of the source and the drain of the transistor M5[i] is electrically connected to one of a source and a drain of the transistor MSP, and the other of the source and the drain of the transistor M5[i] is electrically connected to one of the source and the drain of the transistor M6[i], and the wiring WL[i]. The other of the source and the drain of the transistor M6[i] is electrically connected to the wiring GNDL[i].

The gate of the transistor MSP is electrically connected to the wiring sleepP, and the other of the source and the drain of the transistor MSP is electrically connected to the wiring VDDLP. The gate of the transistor MSN is electrically connected to the wiring sleepN, and the other of the source and the drain of the transistor MSN is electrically connected to the wiring GNDLN.

Note that some reference numerals are omitted in FIG. 4. Specifically, FIG. 4 does not show reference numerals except for the following: the wiring sleepP, the wiring sleepN, the wiring WLE, the wiring RA[0], the wiring RA[15], the wiring RA[112], the wiring RA[127], the wiring WL[0], the wiring WL[15], the wiring WL[112], the wiring WL[127], the wiring VDDL[0], the wiring VDDL[15], the wiring VDDL[112], the wiring VDDL[127], the wiring GNDL[0], the wiring GNDL[15], the wiring GNDL[112], the wiring GNDL[127], the wiring VDDLP, the wiring GNDLN, the transistor MSN, the transistor MSP, the transistor M1[0], the transistor M2[0], the transistor M3[0], the transistor M4[0], the transistor M5[0], the transistor M6[0], the transistor M1[15], the transistor M2[15], the transistor M3[15], the transistor M4[15], the transistor M5[15], the transistor M6[15], the transistor M1[112], the transistor M2[112], the transistor M3[112], the transistor M4[112], the transistor M5[112], the transistor M6[112], the transistor M1[127], the transistor M2[127], the transistor M3[127], the transistor M4[127], the transistor M5[127], the transistor M6[127], the circuit WLD1[0], the circuit WLD1[15], the circuit WLD1[112], and the circuit WLD1[127].

Note that as in the word line driver circuits 100 and 102, the circuit WLD1[i] in the word line driver circuit 110 needs to be connected to a high potential power source and a low potential power source to be driven. Although not shown, the wirings VDDL[0] to VDDL[127] and the wiring VDDLP are connected to a high potential power source and supplied with the power source voltage VDD from the high potential power source. Although not shown, the wirings GNDL[0] to GNDL[127] and the wiring GNDLN are connected to a low potential power source and supplied with the fixed potential GND (also referred to as a reference potential or a ground potential in some cases) from the low potential power source.

Note that the structure example of the word line driver circuit 110 is equivalent to that of the circuit UWLD1-j in the word line driver circuit 100, which includes 128 circuits WLD1. Therefore, for the operation of the word line driver circuit 110, the description of the operation of the circuit UWLD1-j in the word line driver circuit 100 is referred to.

Other Circuit Structure Examples

In FIG. 1, the two sleep transistors (the transistors MSP-j and MSN-j) are provided for the 16 circuits WLD1, and in FIG. 4, the two sleep transistors (the transistors MSP and MSN) are provided for the 128 circuits WLD1. However, this embodiment is not limited to these structures. For example, two sleep transistors may be provided for one circuit WLD1. Alternatively, each stage may include a different number of circuits WLD1; for example, two sleep transistors are provided for 16 circuits WLD1 in each of four stages and two sleep transistors are provided for each of the other 64 circuits WLD1. In addition, for example, the number of the circuits WLD1 is not limited to 128 and may be greater than or smaller than 128.

In the word line driver circuit 100 shown in FIG. 1 and the word line driver circuit 110 shown in FIG. 4, the transistors M1[i] to M6[i] may be replaced with the NAND circuit 51 and the inverter circuit 52. Circuit structure examples in such a case are shown in FIGS. 5 and 6.

Figure 5:
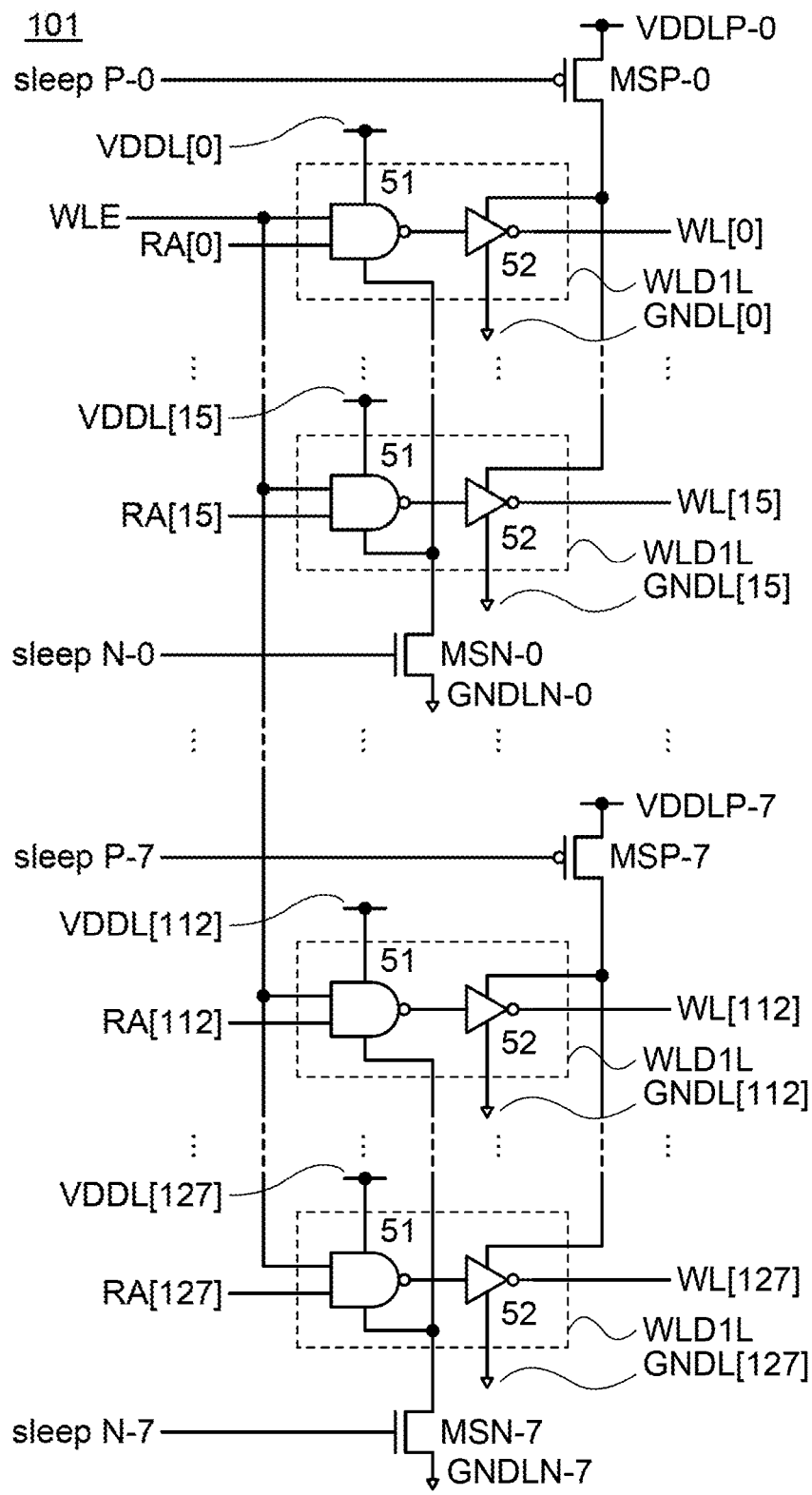
FIG. 5 is a circuit diagram showing an example of a semiconductor device of one embodiment of the present invention.
Figure 6:
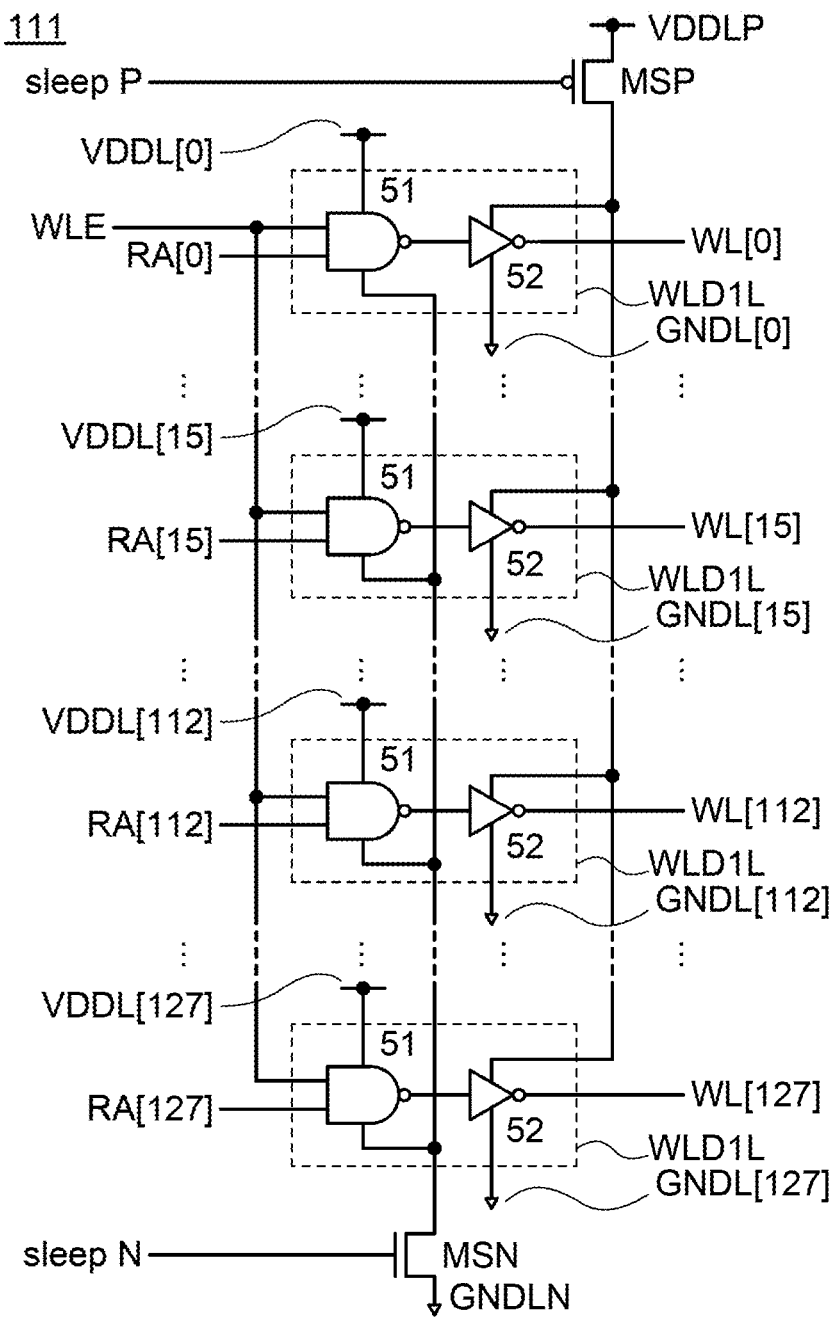
FIG. 6 is a circuit diagram showing an example of a semiconductor device of one embodiment of the present invention.

A word line driver circuit 101 in FIG. 5 is obtained by replacing the transistors M1[i] to M6[i] in the word line driver circuit 100 in FIG. 1 with the NAND circuit 51 and the inverter circuit 52. A word line driver circuit 111 in FIG. 6 is obtained by replacing the transistors M1[i] to M6[i] in the word line driver circuit 110 in FIG. 4 with the NAND circuit 51 and the inverter circuit 52.

Figure 7:
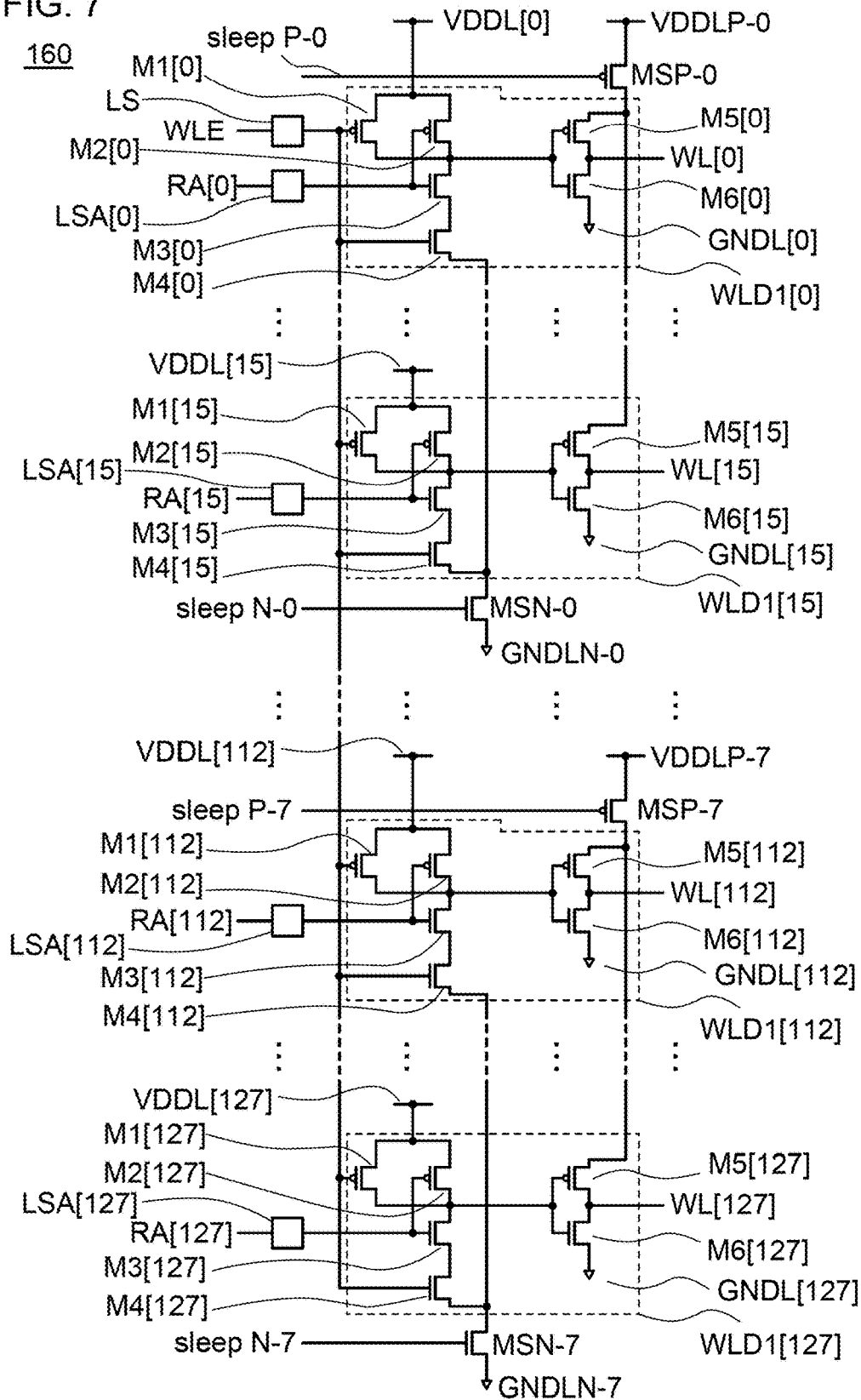
FIG. 7 is a circuit diagram showing an example of a semiconductor device of one embodiment of the present invention.

When a level shifter is used in the word line driver circuit 100, a voltage higher than the voltage VDD (hereinafter referred to as VDDH) can be used. FIG. 7 shows an example of providing a level shifter in the word line driver circuit 100. A word line driver circuit 160 is different from the word line driver circuit 100 in having a level shifter LS and level shifters LSA[0] to LSA[127].

Note that some level shifters are omitted in the word line driver circuit 160 in FIG. 7. Specifically, FIG. 7 does not show level shifters except for the level shifters LS, LSA[0], LSA[15], LSA[112], and LSA[127].

An input terminal of the level shifter LS is electrically connected to the wiring WLE, and an output terminal of the level shifter LS is electrically connected to the gate of the transistor M1[i] and the gate of the transistor M4[i]. An input terminal of the level shifter LSA[i] is electrically connected to the wiring RA[i], and an output terminal of the level shifter LSA[i] is electrically connected to the gate of the transistor M2[i] and the gate of the transistor M3[i].

The level shifter LS enables the voltage VDD applied to the wiring WLE to increase to VDDH, and the level shifter LSA[i] enables the voltage VDD applied to the wiring RA[i] to increase to VDDH.

Figure 8:
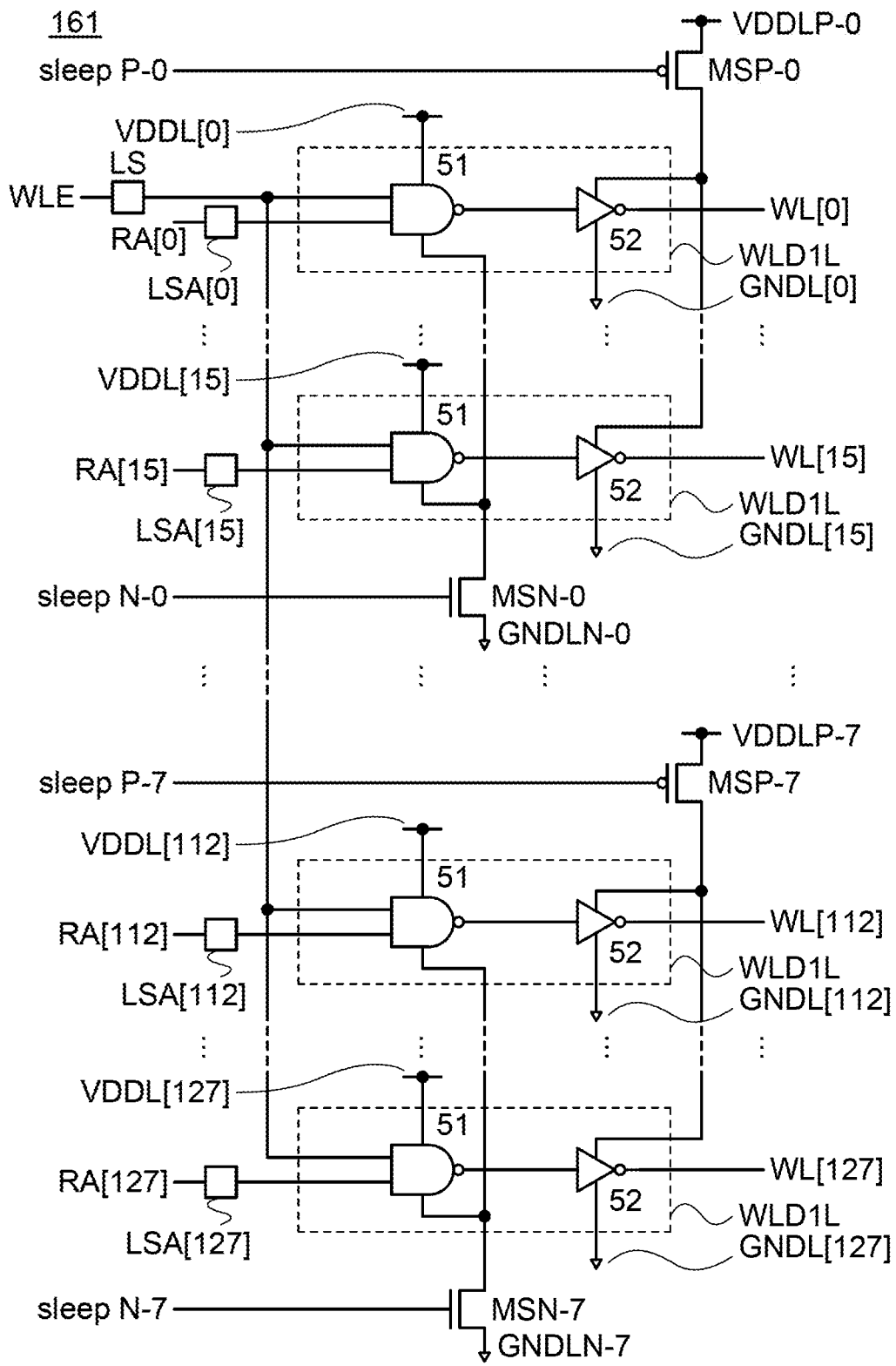
FIG. 8 is a circuit diagram showing an example of a semiconductor device of one embodiment of the present invention.

In the word line driver circuit 160 shown in FIG. 7, the transistors M1[i] to M6[i] may be replaced with the NAND circuit 51 and the inverter circuit 52. A word line driver circuit 161 with such a structure is shown in FIG. 8. The circuit WLD1L in the word line driver circuit 161 is obtained by replacing the transistors M1[i] to M6[i] with the NAND circuit 51 and the inverter circuit 52. In the word line driver circuit 160 in FIG. 7, the level shifter LSA[i] is provided outside the circuit WLD1; however, this embodiment is not limited to this structure and the level shifter LSA[i] may be provided in the circuit WLD1.

Furthermore, a voltage lower than the fixed potential GND (hereinafter referred to as VSSL) may be used. In that case, a level shifter is provided as in the above to reduce the fixed potential GND to VSSL.

Although not shown, the level shifter configured to increase the voltage VDD to VDDH or the level shifter configured to reduce the fixed potential GND to VSSL can be provided in the word line driver circuit 110 in FIG. 4 as well as in the word line driver circuit 160 in FIG. 7. Specifically, a level shifter is provided between the wiring WLE and a contact point between the gates of the transistors M1[i] and M4[i], and a level shifter is provided between the wiring RA[i] and a contact point between the gates of the transistors M2[i] and M3[i].

A transistor with a low off current (or a low leakage current) is preferably used as the transistors M1[i] to M6[i] described in this embodiment, and particularly as the transistors MSP-j and MSN-j (or the transistors MSP and MSN) serving as sleep transistors. For example, a transistor including an oxide semiconductor in a channel formation region, which will be described later, is preferably used. Alternatively, a mechanical switch, a MEMS element, or the like may be used as long as its on/off state can be controlled.

This embodiment can be combined with any of the other embodiments in this specification as appropriate.

Embodiment 2

Described in this embodiment is a structure example of a circuit according to one embodiment of the present invention.

Structure Example 1 of Word Line Driver Circuit

First, a structure of a word line driver circuit electrically connected to a row of memory cells in a memory cell array of this embodiment will be described.

Figure 9A:
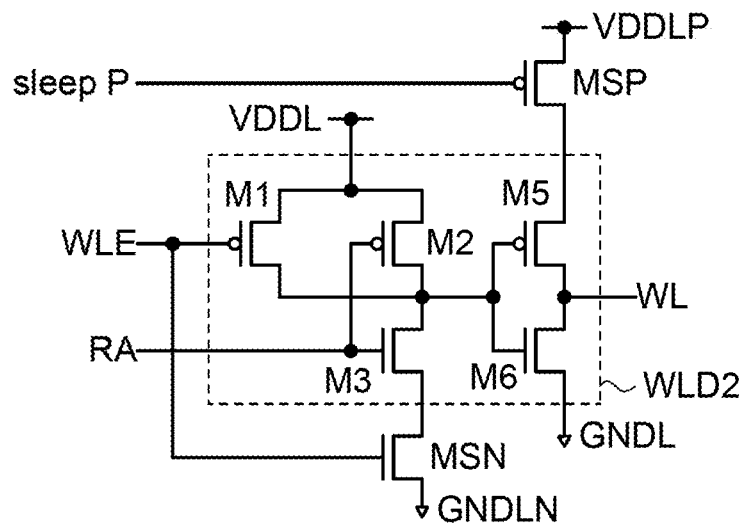
FIGS. 9A and 9B are circuit diagrams each showing an example of a semiconductor device of one embodiment of the present invention.

FIG. 9A shows a structure example of a word line driver circuit. A word line driver circuit 122 includes a circuit WLD2 (in this specification, also referred to as a unit word line driver), the transistor MSP, the transistor MSN, the transistors M1 to M3, and the transistors M5 and M6. The transistors M1, M2, and M5 are p-channel transistors, and the transistors M3 and M6 are n-channel transistors.

The gate of the transistor M1 is electrically connected to the wiring WLE. One of the source and the drain of the transistor M1 is electrically connected to one of the source and the drain of the transistor M2, and the other of the source and the drain of the transistor M1 is electrically connected to the other of the source and the drain of the transistor M2, one of the source and the drain of the transistor M3, the gate of the transistor M5, and the gate of the transistor M6. The gate of the transistor M2 is electrically connected to the gate of the transistor M3 and the wiring RA. One of the source and the drain of the transistor M5 is electrically connected to one of the source and the drain of the transistor M6 and the wiring WL.

The wiring VDDL is electrically connected to the one of the source and the drain of the transistor M1 and the one of the source and the drain of the transistor M2. The other of the source and the drain of the transistor M3 is electrically connected to one of the source and the drain of the transistor MSN. The gate of the transistor MSN is electrically connected to the gate of the transistor M1 and the wiring WLE, and the other of the source and the drain of the transistor MSN is electrically connected to the wiring GNDLN. The other of the source and the drain of the transistor M5 is electrically connected to one of the source and the drain of the transistor MSP, and the other of the source and the drain of the transistor MSP is electrically connected to the wiring VDDLP. The other of the source and the drain of the transistor M6 is electrically connected to the wiring GNDL. The gate of the transistor MSN is electrically connected to the wiring WLE, and the gate of the transistor MSP is electrically connected to the wiring sleepP.

The circuit WLD2 needs to be connected to a high potential power source and a low potential power source to be driven. The aforementioned wirings VDDL and VDDLP are used to connect circuits to the high potential power source. The aforementioned wirings GNDL and GNDLN are used to connect circuits to the low potential power source. Here, the high potential power source is configured to supply a power source voltage VDD and the low potential power source is configured to supply a fixed potential GND.

The wirings WLE and RA are used to input an external signal to the word line driver circuit 122, and the wiring WL is used to output a writing selection signal from the word line driver circuit 122 to a predetermined memory cell.

Figure 9B:
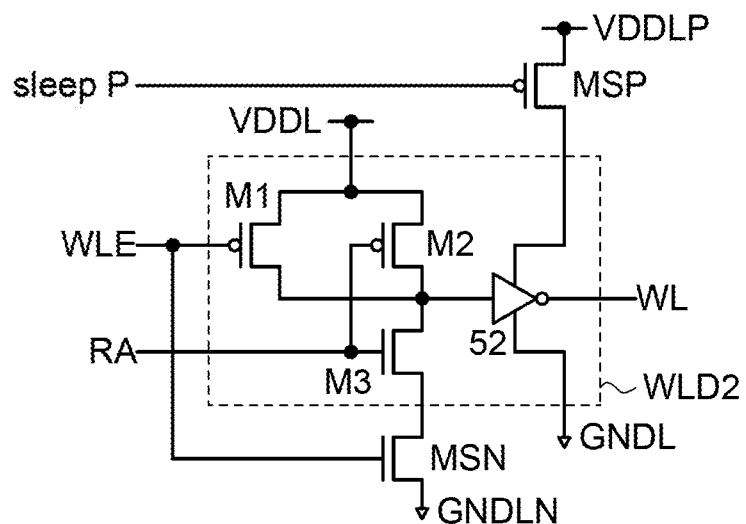

The transistors M5 and M6 connected as in the circuit WLD2 serve as an inverter circuit. Thus, the circuit WLD2 in the word line driver circuit 122 in FIG. 9A can be replaced with a circuit WLD2L in a word line driver circuit 123 in FIG. 9B. Specifically, the transistors M5 and M6 in the word line driver circuit 122 in FIG. 9A are replaced with the inverter circuit 52 in the word line driver circuit 123 in FIG. 9B.

Since the circuit WLD2 and the transistor MSN are obtained by connecting the output terminal of a NAND circuit and the input terminal of the inverter circuit in series, it can be collectively regarded as an AND circuit. That is, when a high-level potential is input to the wirings WLE and RA, the high-level potential is output from the wiring WL; and when a low-level potential is input to at least one of the wirings WLE and RA, the low-level potential is output from the wiring WL.

Structure Example 2 of Word Line Driver Circuit

Described here is a structure example of 128 unit word line drivers which are driven for every 16 unit word line drivers.

Figure 10:
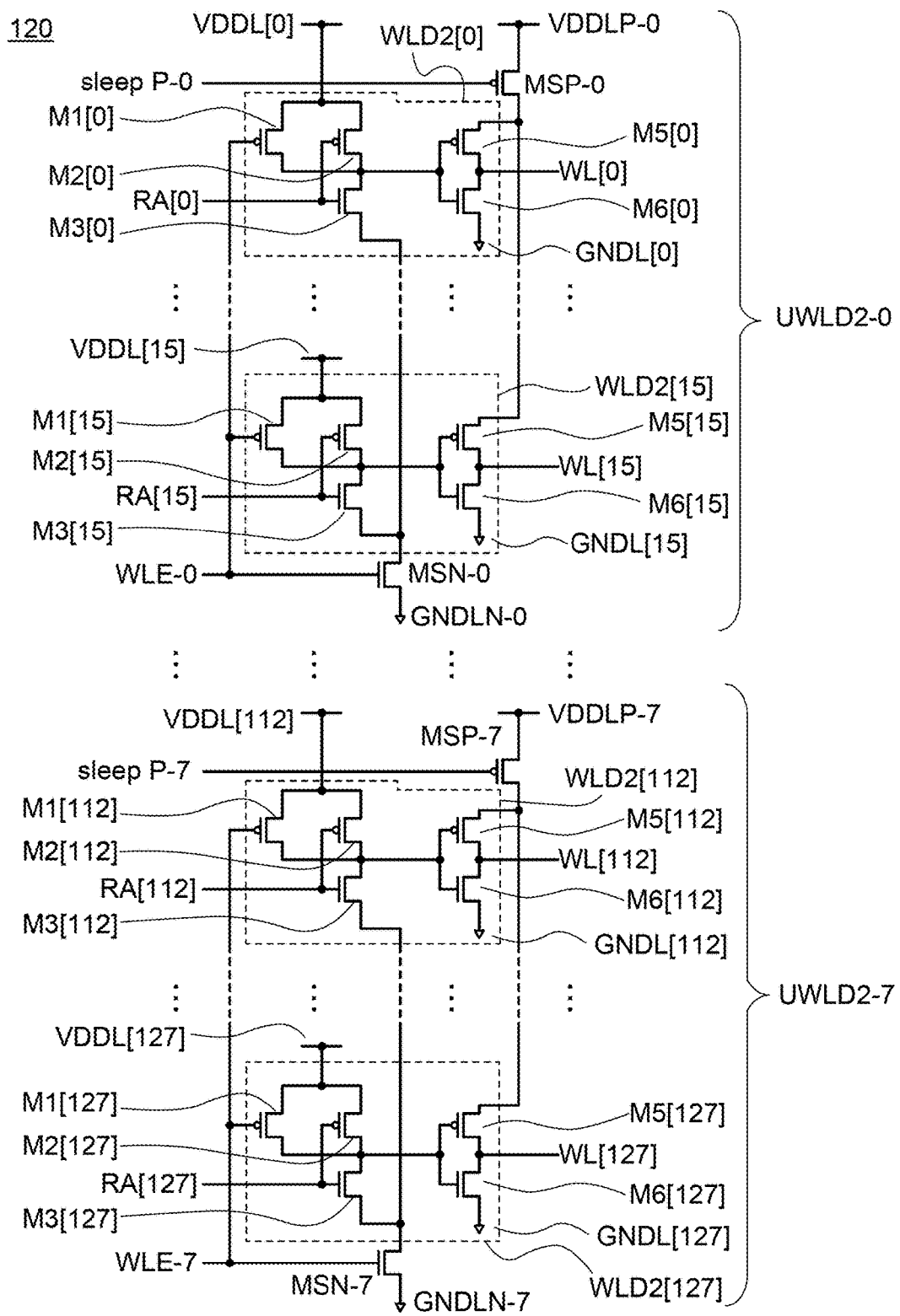
FIG. 10 is a circuit diagram showing an example of a semiconductor device of one embodiment of the present invention.

FIG. 10 shows an example of a word line driver circuit of one embodiment of the present invention. A word line driver circuit 120 consists of 8 stages: each stage includes 16 circuits WLD2 and a sleep transistor (denoted by a transistor MSP-j in FIG. 10). Note that the word line driver circuit 120 in FIG. 10 is different from the word line driver circuit 100 in FIG. 1 in that the transistor M4[i] is provided as a transistor MSN-j.

The word line driver circuit 120 includes the p-channel transistors M1[0] to M1[127], the p-channel transistors M2[0] to M2[127], the n-channel transistors M3[0] to M3[127], the p-channel transistors M5[0] to M5[127], the n-channel transistors M6[0] to M6[127], the p-channel transistors MSP-0 to MSP-7, and the n-channel transistors MSN-0 to MSN-7.

As shown in FIG. 10, a circuit WLD2[i] (i is an integer of 16×j to 16×(j+1)−1, and j is an integer of 0 to 7; for example, i is an integer of 112 to 127 when j=7) includes transistors M1[i] to M6[i]. A circuit UWLD2-j includes circuits WLD2[16×j] to WLD2[16×(j+1)−1] and the transistors MSP-j and MSN-j.

The gate of the transistor M1[i] is electrically connected to a wiring WLE-j. One of the source and the drain of the transistor M1[i] is electrically connected to one of the source and the drain of the transistor M2[i] and the wiring VDDL[i], and the other of the source and the drain of the transistor M1[i] is electrically connected to the other of the source and the drain of the transistor M2[i], one of the source and the drain of the transistor M3[i], the gate of the transistor M5[i], and the gate of the transistor M6[i]. The gate of the transistor M2[i] is electrically connected to the gate of the transistor M3[i] and the wiring RA[i]. The other of the source and the drain of the transistor M3[i] is electrically connected to one of a source and a drain of the transistor MSN-j. One of the source and the drain of the transistor M5[i] is electrically connected to one of a source and a drain of the transistor MSP-j. The other of the source and the drain of the transistor M5[i] is electrically connected to one of the source and the drain of the transistor M6[i] and the wiring WL[i]. The other of the source and the drain of the transistor M6[i] is electrically connected to the wiring GNDL[i].

The gate of the transistor MSP-j is electrically connected to the wiring sleepP-j, and the other of the source and the drain of the transistor MSP-j is electrically connected to the wiring VDDLP-j. The gate of the transistor MSN-j is electrically connected to a wiring WLE-j, and the other of the source and the drain of the transistor MSN-j is electrically connected to the wiring GNDLN-j.

Note that some reference numerals are omitted in FIG. 10. Specifically, FIG. 10 does not show reference numerals except for the following: the wiring sleepP-0, the wiring sleepP-7, the wiring RA[0], the wiring RA[15], the wiring RA[112], the wiring RA[127], the wiring WL[0], the wiring WL[15], the wiring WL[112], the wiring WL[127], the wiring WLE-0, the wiring WLE-7, the wiring VDDL[0], the wiring VDDL[15], the wiring VDDL[112], the wiring VDDL[127], the wiring GNDL[0], the wiring GNDL[15], the wiring GNDL[112], the wiring GNDL[127], the wiring VDDLP-0, the wiring VDDLP-7, the wiring GNDLN-0, the wiring GNDLN-7, the transistor MSN-0, the transistor MSN-7, the transistor MSP-0, the transistor MSP-7, the transistor M1[0], the transistor M2[0], the transistor M3[0], the transistor M5[0], the transistor M6[0], the transistor M1[15], the transistor M2[15], the transistor M3[15], the transistor M5[15], the transistor M6[15], the transistor M1[112], the transistor M2[112], the transistor M3[112], the transistor M5[112], the transistor M6[112], the transistor M1[127], the transistor M2[127], the transistor M3[127], the transistor M5[127], the transistor M6[127], the circuit WLD2[0], the circuit WLD2[15], the circuit WLD2[112], the circuit WLD2[127], the circuit UWLD2-0, and the circuit UWLD2-7.

Note that as in the word line driver circuit 122, the circuit WLD2[i] in the word line driver circuit 120 needs to be connected to a high potential power source and a low potential power source to be driven. Although not shown, the wirings VDDL[0] to VDDL[127] and the wirings VDDLP-0 to VDDLP-7 are connected to a high potential power source and supplied with the power source voltage VDD from the high potential power source. Although not shown, the wirings GNDL[0] to GNDL[127] and the wirings GNDLN-0 to GNDLN-7 are connected to a low potential power source and supplied with the fixed potential GND (also referred to as a reference potential or a ground potential in some cases) from the low potential power source.

The wirings WLE-j and RA[i] are used to input an external signal to the word line driver circuit 120, and the wiring WL[i] is used to output a writing selection signal from the word line driver circuit 120 to a predetermined memory cell.

<Operation Example of Word Line Driver Circuit>

Figure 11:
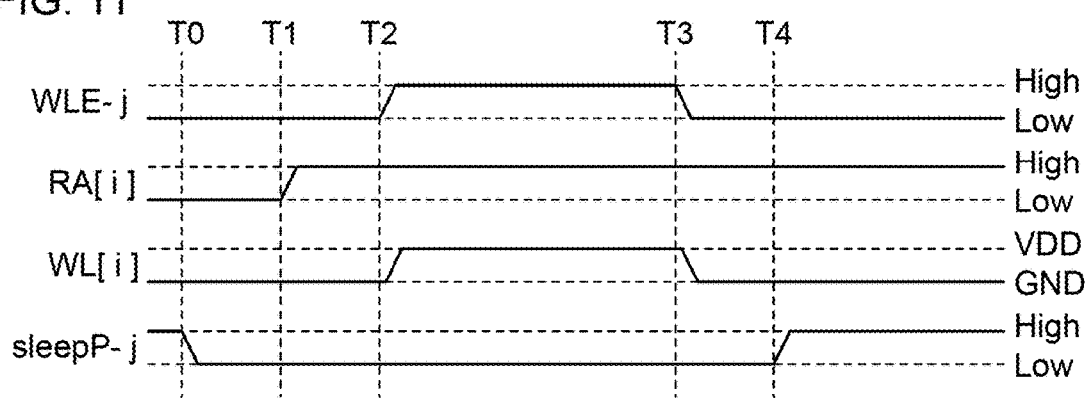
FIG. 11 is a timing chart showing an operation example of the semiconductor device shown in FIG. 10.

Described is an operation example of the word line driver circuit 120 shown in FIG. 10. FIG. 11 is a timing chart for the word line driver circuit 100. Note that for simplicity, the timing chart of FIG. 11 shows an operation example of the circuit WLD2[i] in the j-th stage, and specifically shows changes in the potentials of the wiring WLE-j, the wiring RA[i], the wiring WL[i], and the wiring sleepP-j. Note that "Low" denotes a low-level potential and "High" denotes a high-level potential. The power source voltage VDD or the fixed potential GND is input to each of the wirings WLE-j and RA[i]. However, as long as the on/off states of the transistors M1[i], M2[i], M3[i], and MSN-j connected to the wirings WLE-j and RA[i] can be controlled, a voltage lower than the power source voltage VDD and a voltage higher than the fixed potential GND may be input as the high-level potential (High) and the low-level potential (Low), respectively. Hence, the high-level potential and the low-level potential of the wirings WLE-j and RA[i] are denoted by "High" and "Low" in FIG. 11, respectively.

At Time T0, the potential of the wiring sleepP-j is Low. As a result, the transistor MSP-j connected to the wiring sleepP-j is turned on. That is, the power source voltage VDD is applied to the one of the source and the drain of the transistor M5[i] through the transistor MSP-j.

From Time T0 to Time T1, a low-level potential is applied to the wirings WLE-j and RA[i]. That is, a low-level potential is applied to the gates of the transistors M1[i] to M3[i]; accordingly, the transistors M1[i] and M2[i] are turned on whereas the transistor M3[i] is turned off. Then, the power source voltage VDD is applied to the gates of the transistors M5[i] and M6[i] through the transistors M1[i] and M2[i]. As a result, the transistor M5[i] is turned off and the transistor M6[i] is turned on; thus, the fixed potential GND is output to the wiring WL[i] through the transistor M6[i].

At Time T1, a high-level potential is applied to the wiring RA[i]. At this time, a high-level potential is applied to the gates of the transistors M2[i] and M3[i]; accordingly, the transistor M2[i] is turned off and the transistor M3[i] is turned on. Since the transistor M1[i] is still on at this time, the power source voltage VDD is applied to the gates of the transistors M5[i] and M6[i] as in the time before Time T1. Since the transistor MSN-j is off, the fixed potential GND is not applied to the other of the source and the drain of the transistor M3[i] through the transistor MSN-j. In other words, a low-level potential is output to the wiring WL[i] as in the time before Time T1.

At Time T2, a high-level potential is applied to the wiring WLE-j. At this time, a high-level potential is applied to the gates of the transistors M1[i] and MSN-j; accordingly, the transistor M1[i] is turned off and the transistor MSN-j is turned on. Since the transistor M2[i] is still off, the power source voltage VDD ceases to be applied to the gates of the transistors M5[i] and M6[i] through the transistors M1[i] and M2[i]. Since the transistor M3[i] is on, the fixed potential GND is applied to the gates of the transistors M5[i] and M6[i] through the transistors M3[i] and MSN-j. Thus, the transistor M5[i] is turned on whereas the transistor M6[i] is turned off, and accordingly, the power source voltage VDD is output to the wiring WL[i] through the transistor M5[i].

Note that from Time T2 to Time T3, the power source voltage VDD is applied from the wiring WL[i] to memory cells in the i-th row, i.e., data is written thereto at this time. In other words, when a high-level potential is input to the wiring WLE-j while a high-level potential is input to at least one of the wirings RA[16×j] to RA[16×(j+1)−1], data can be simultaneously written to the memory cells in a row of any of the wirings RA[16×j] to RA[16×(j+1)−1] that has a high-level potential.

In addition, when all the wirings RA[16×j] to RA[16×(j+1)−1] in the j-th stage have a low-level potential, no data is written to the memory cells in all the rows of the j-th stage. At this time, the transistors MSN-j and MSP-j are preferably off because the circuits WLD2[16×j] to WLD2[16×(j+1)−1] in the j-th stage, namely, the circuit UWLD2-j does not need to operate. This results in interrupted supply of the power source voltage VDD and the fixed potential GND to the circuit UWLD2-j from which no writing selection signal is output, reducing power consumption.

At Time T3, a low-level potential is applied to the wiring WLE-j. At this time, a low-level potential is applied to the gates of the transistors M1[i] and MSN-j; accordingly, the transistor M1[i] is turned on and the transistor MSN-j is turned off. In other words, the on/off states of the transistors M1[i], M2[i], M3[i], and MSN-j are returned to the states from Time T1 to Time T2; thus, the fixed potential GND is output to the wiring WL[i]. Since the transistor MSN-j is off at this time, the fixed potential GND is not supplied to the word line driver circuit 120.

At Time T4, the potential of the wiring sleepP-j is High, so that the transistor MSP-j is turned off. This results in interrupted supply of the power source voltage VDD to the word line driver circuit 120, reducing power consumption.

Note that in the timing chart of FIG. 11, the potential of the wiring sleepP-j is Low at Time T0; however, the operation of the word line driver circuit 120 is not limited to this. For example, a low-level potential may be applied to the wiring sleepP-j from Time T1 to Time T2.

Structure Example 3 of Word Line Driver Circuit

Described here is a structure example of 128 unit word line drivers which can be driven simultaneously.

Figure 12:
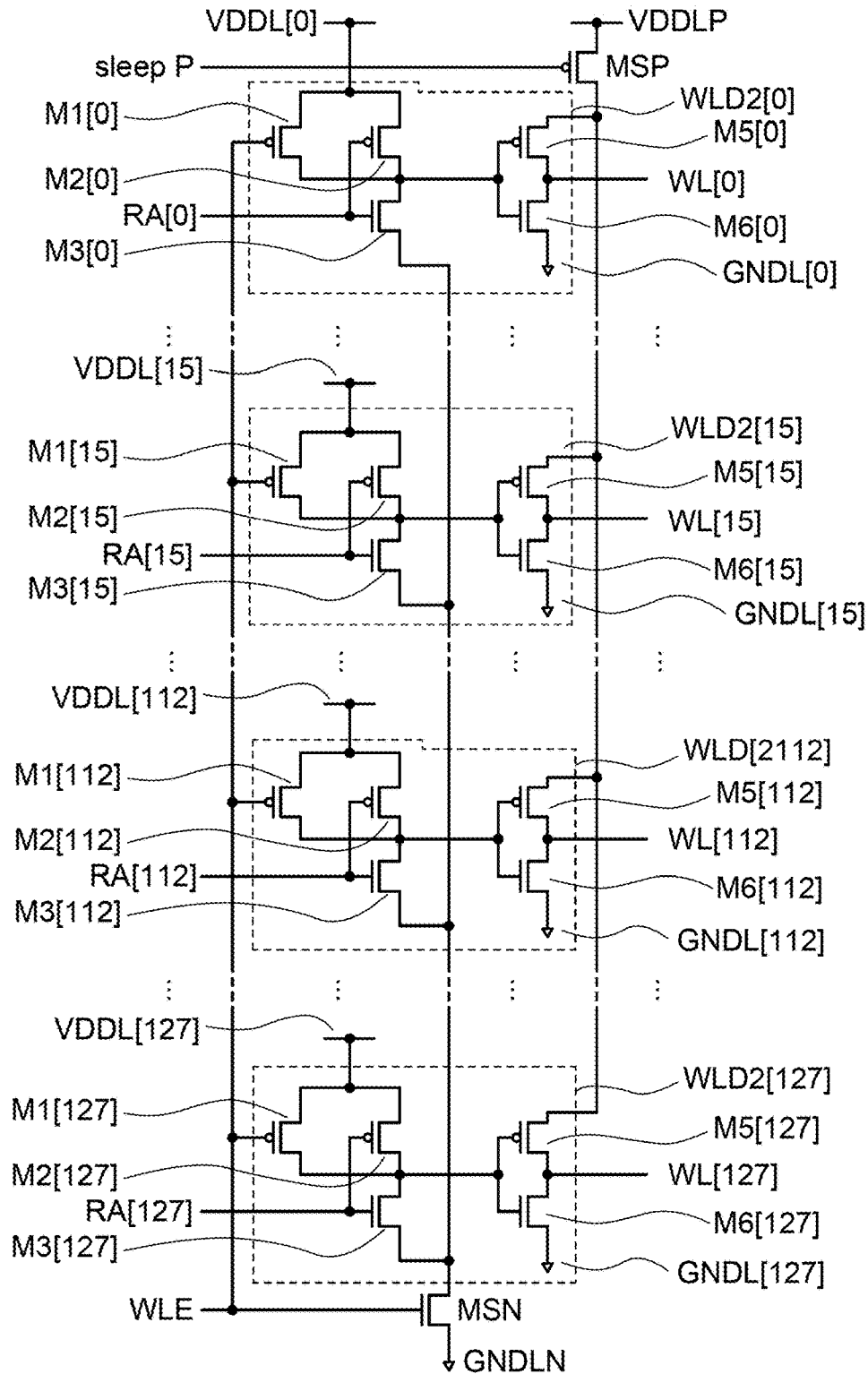
FIG. 12 is a circuit diagram showing an example of a semiconductor device of one embodiment of the present invention.

The word line driver shown in FIG. 10 consists of 8 stages, each of which includes the 16 circuits WLD2 and the transistors MSP-j and MSN-j as sleep transistors. FIG. 12 shows another example of the word line driver circuit different from that in FIG. 10. A word line driver circuit 130 in FIG. 12 includes 128 circuits WLD2 and two sleep transistors (denoted by transistors MSP and MSN in FIG. 12).

The word line driver circuit 130 includes the p-channel transistors M1[0] to M1[127], the p-channel transistors M2[0] to M2[127], the n-channel transistors M3[0] to M3[127], the p-channel transistors M5[0] to M5[127], the n-channel transistors M6[0] to M6[127], the p-channel transistor MSP, and the n-channel transistor MSN.

The gate of the transistor M1[i] (i is an integer of 0 to 127) is electrically connected to the wiring WLE. One of the source and the drain of the transistor M1[i] is electrically connected to one of the source and the drain of the transistor M2[i] and the wiring VDDL[i], and the other of the source and the drain of the transistor M1[i] is electrically connected to the other of the source and the drain of the transistor M2[i], one of the source and the drain of the transistor M3[i], the gate of the transistor M5[i], and the gate of the transistor M6[i].

The gate of the transistor M2[i] is electrically connected to the gate of the transistor M3[i] and the wiring RA[i]. The other of the source and the drain of the transistor M3[i] is electrically connected to one of the source and the drain of the transistor MSN. One of the source and the drain of the transistor M5[i] is electrically connected to one of the source and the drain of the transistor MSP, and the other of the source and the drain of the transistor M5[i] is electrically connected to one of the source and the drain of the transistor M6[i], and the wiring WL[i]. The other of the source and the drain of the transistor M6[i] is electrically connected to the wiring GNDL[i].

The gate of the transistor MSP is electrically connected to the wiring sleepP, and the other of the source and the drain of the transistor MSP is electrically connected to the wiring VDDLP. The gate of the transistor MSN is electrically connected to the wiring WLE, and the other of the source and the drain of the transistor MSN is electrically connected to the wiring GNDLN.

Note that some reference numerals are omitted in FIG. 12. Specifically, FIG. 12 does not show reference numerals except for the following: the wiring sleepP, the wiring RA[0], the wiring RA[15], the wiring RA[112], the wiring RA[127], the wiring WL[0], the wiring WL[15], the wiring WL[112], the wiring WL[127], the wiring WLE, the wiring VDDL[0], the wiring VDDL[15], the wiring VDDL[112], the wiring VDDL[127], the wiring GNDL[0], the wiring GNDL[15], the wiring GNDL[112], the wiring GNDL[127], the wiring VDDLP, the wiring GNDLN, the transistor MSN, the transistor MSP, the transistor M1[0], the transistor M2[0], the transistor M3[0], the transistor M5[0], the transistor M6[0], the transistor M1[15], the transistor M2[15], the transistor M3[15], the transistor M5[15], the transistor M6[15], the transistor M1[112], the transistor M2[112], the transistor M3[112], the transistor M5[112], the transistor M6[112], the transistor M1[127], the transistor M2[127], the transistor M3[127], the transistor M5[127], the transistor M6[127], the circuit WLD2[0], the circuit WLD2[15], the circuit WLD2[112], and the circuit WLD2[127].

Note that as in the word line driver circuits 120 and 122, the circuit WLD2[i] in the word line driver circuit 130 needs to be connected to a high potential power source and a low potential power source to be driven. Although not shown, the wirings VDDL[0] to VDDL[127] and the wiring VDDLP are connected to a high potential power source and supplied with the power source voltage VDD from the high potential power source. Although not shown, the wirings GNDL[0] to GNDL[127] and the wiring GNDLN are connected to a low potential power source and supplied with the fixed potential GND (also referred to as a reference potential in some cases) from the low potential power source.

Other Circuit Structure Examples

In FIG. 10, the two sleep transistors (the transistors MSP-j and MSN-j) are provided for the 16 circuits WLD2, and in FIG. 12, the two sleep transistors (the transistors MSP and MSN) are provided for the 128 circuits WLD2. However, this embodiment is not limited to these structures. For example, one sleep transistor may be provided for eight circuits WLD2. Alternatively, each stage may include a different number of circuits WLD2; for example, one sleep transistor is provided for 16 circuits WLD2 in each of four stages and one sleep transistor is provided for eight circuits WLD2 in each of eight stages. In addition, for example, the number of the circuits WLD2 is not limited to 128 and may be greater than or less than 128.

In the word line driver circuit 120 shown in FIG. 10 and the word line driver circuit 130 shown in FIG. 12, the transistors M5[i] and M6[i] may be replaced with the inverter circuit 52. Circuit structures in such a case are shown in FIGS. 13 and 14.

Figure 13:
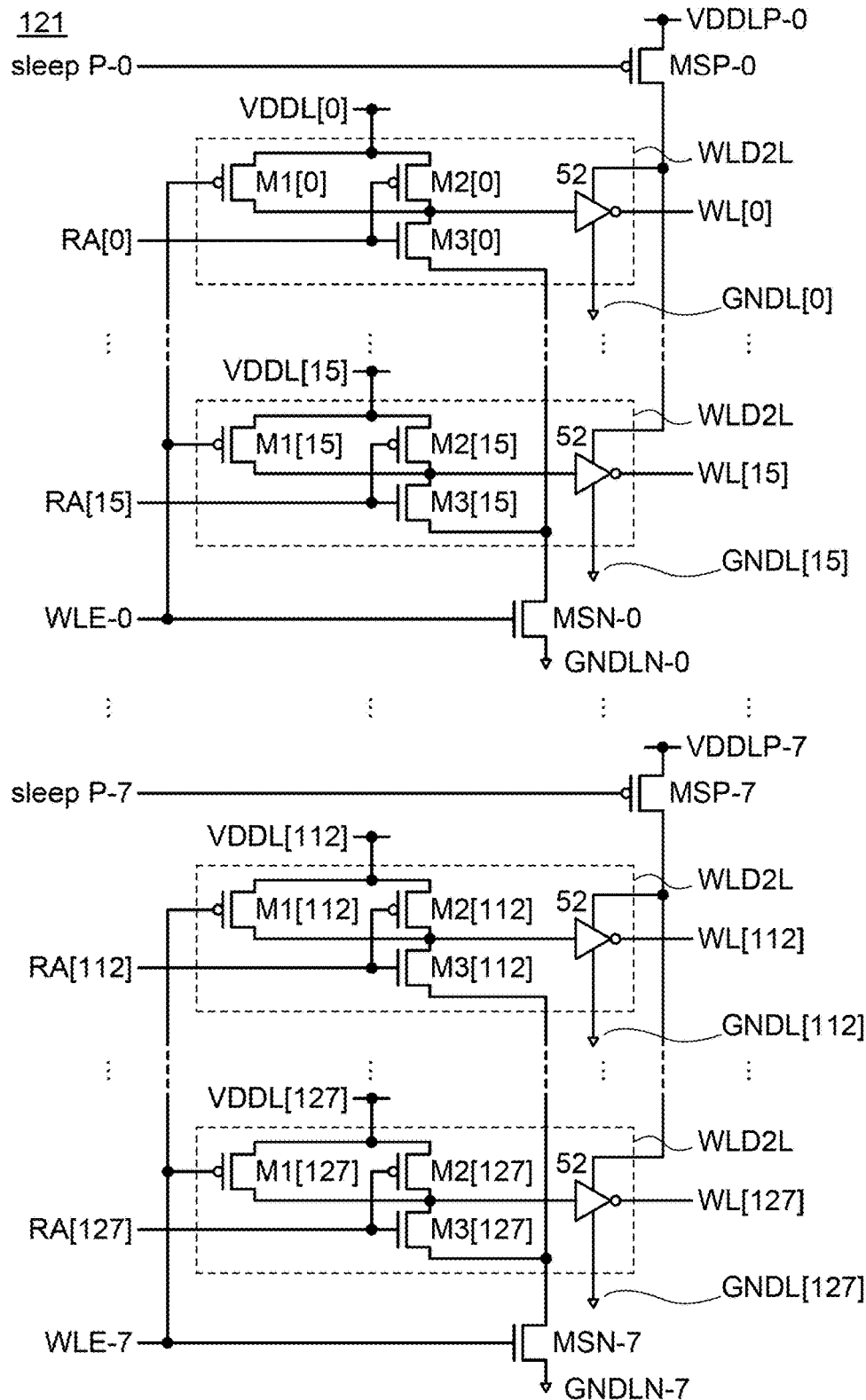
FIG. 13 is a circuit diagram showing an example of a semiconductor device of one embodiment of the present invention.
Figure 14:
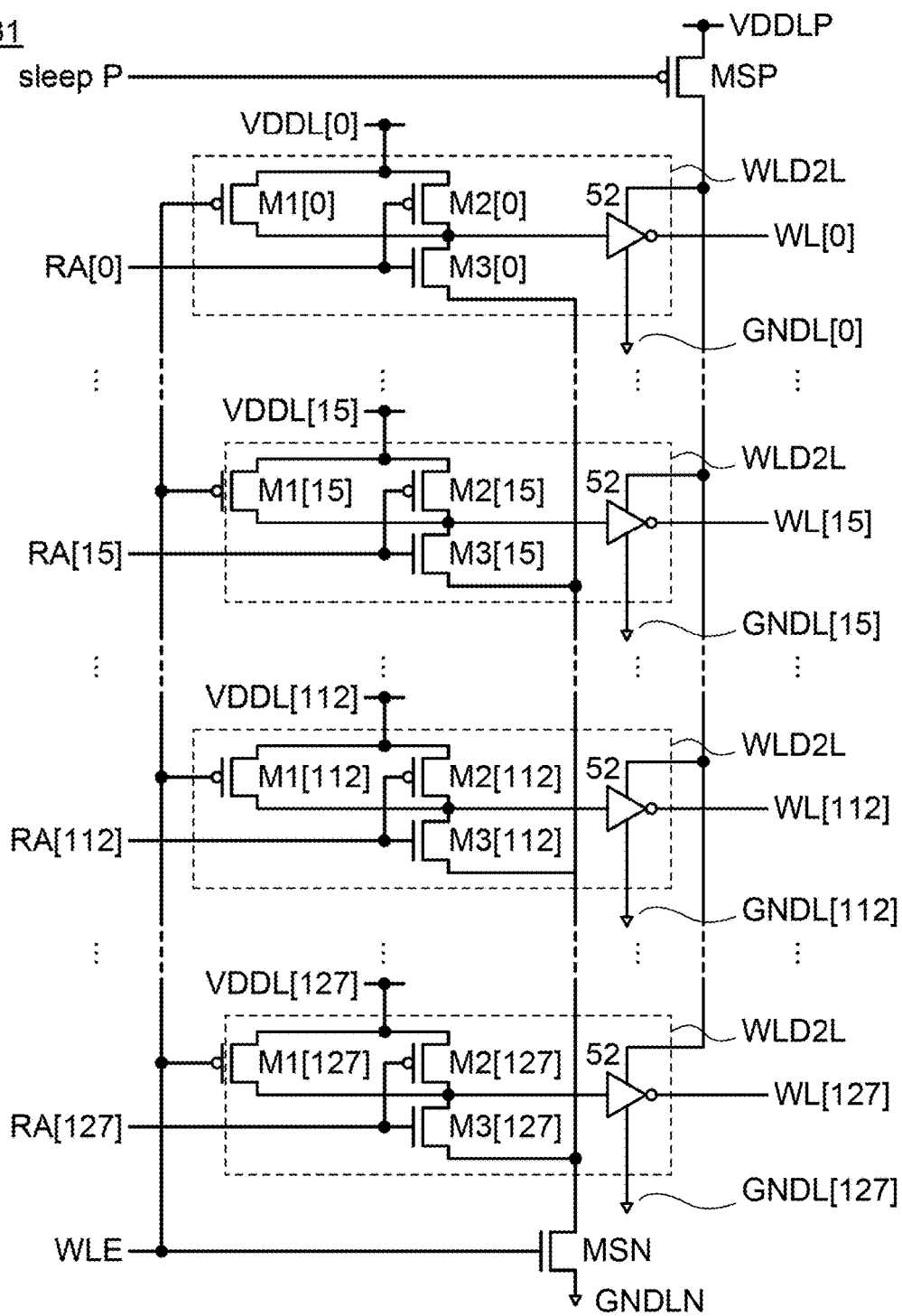
FIG. 14 is a circuit diagram showing an example of a semiconductor device of one embodiment of the present invention.

A word line driver circuit 121 in FIG. 13 is obtained by replacing the transistors M5[i] and M6[i] in the word line driver circuit 120 in FIG. 10 with the inverter circuit 52. A word line driver circuit 131 in FIG. 14 is obtained by replacing the transistors M5 [i] and M6[i] in the word line driver circuit 130 in FIG. 12 with the inverter circuit 52.

Figure 15:
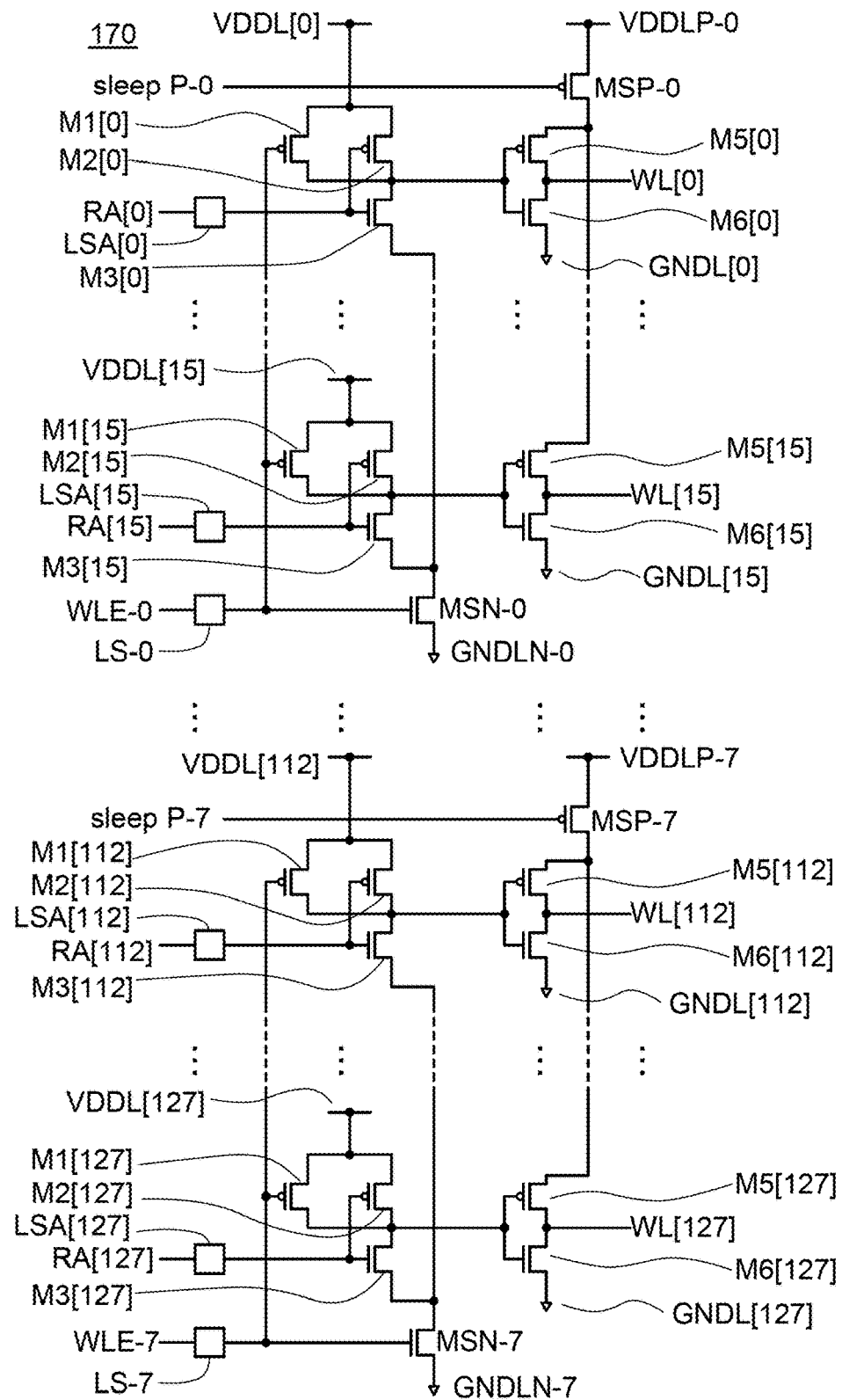
FIG. 15 is a circuit diagram showing an example of a semiconductor device of one embodiment of the present invention.

When a level shifter is used in the word line driver circuit 120, a voltage higher than the voltage VDD (hereinafter referred to as VDDH) can be used. FIG. 15 shows an example of providing a level shifter in the word line driver circuit 120. A word line driver circuit 170 is different from the word line driver circuit 120 in having level shifters LS-0 to LS-7 and level shifters LSA[0] to LSA[127].

Note that some level shifters are omitted in the word line driver circuit 170 in FIG. 15. Specifically, FIG. 15 does not show level shifters except for the level shifters LS-0, LS-7, LSA[0], LSA[15], LSA[112], and LSA[127].

An input terminal of the level shifter LS-j is electrically connected to the wiring WLE-j, and an output terminal of the level shifter LS-j is electrically connected to the gate of the transistor M1[i] and the gate of the transistor MSN-j. An input terminal of the level shifter LSA[i] is electrically connected to the wiring RA[i], and an output terminal of the level shifter LSA[i] is electrically connected to the gate of the transistor M2[i] and the gate of the transistor M3[i].

The level shifter LS-j enables the voltage VDD applied to the wiring WLE-j to increase to VDDH, and the level shifter LSA[i] enables the voltage VDD applied to the wiring RA[i] to increase to VDDH.

Figure 16:
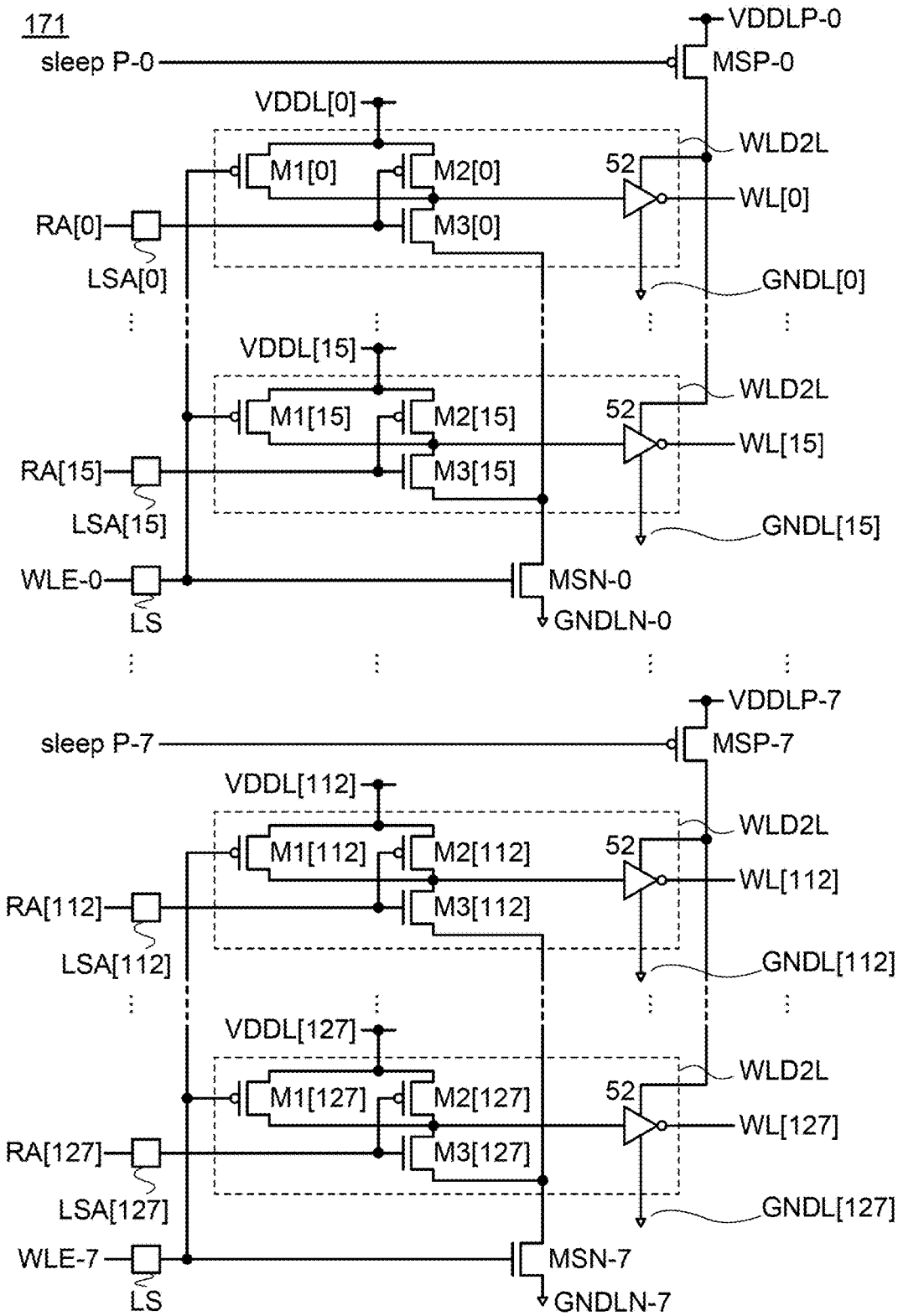
FIG. 16 is a circuit diagram showing an example of a semiconductor device of one embodiment of the present invention.

In the word line driver circuit 170 shown in FIG. 15, the transistors M5[i] and M6[i] may be replaced with the inverter circuit 52. A word line driver circuit 171 with such a structure is shown in FIG. 16. The circuit WLD2L in the word line driver circuit 171 is obtained by replacing the transistors M5[i] and M6[i] with the inverter circuit 52. In the word line driver circuit 170 in FIG. 15, the level shifter LSA[i] is provided outside the circuit WLD2; however, this embodiment is not limited to this structure and the level shifter LSA[i] may be provided in the circuit WLD2L.

Furthermore, a voltage lower than the fixed potential GND (hereinafter referred to as VSSL) may be used. In that case, a level shifter is provided as in the above to reduce the fixed potential GND to VSSL.

Although not shown, the level shifter can also be provided in the word line driver circuit 130 in FIG. 12, whereby the voltage VDD can be increased to VDDH or the fixed potential GND can be reduced to VSSL. Specifically, a level shifter is provided between the wiring WLE and a contact point between the gates of the transistors M1[i] and MSN, and a level shifter is provided between the wiring RA[i] and a contact point between the gates of the transistors M2[i] and M3[i].

A transistor with a low off current (or a low leakage current) is preferably used as the transistors M1[i] to M3[i], and the transistors M5[i] and M6[i] described in this embodiment, and particularly as the transistors MSP-j and MSN-j (or the transistors MSP and MSN) serving as sleep transistors. For example, a transistor including an oxide semiconductor in a channel formation region, which will be described later, is preferably used. Alternatively, a mechanical switch, a MEMS element, or the like may be used as long as its on/off state can be controlled.

This embodiment can be combined with any of the other embodiments in this specification as appropriate.

Embodiment 3

Structure Example 1 of Word Line Driver Circuit

First, a structure example of a word line driver electrically connected to one row of memory cells in a memory cell array of this embodiment will be described.

Figure 17A:
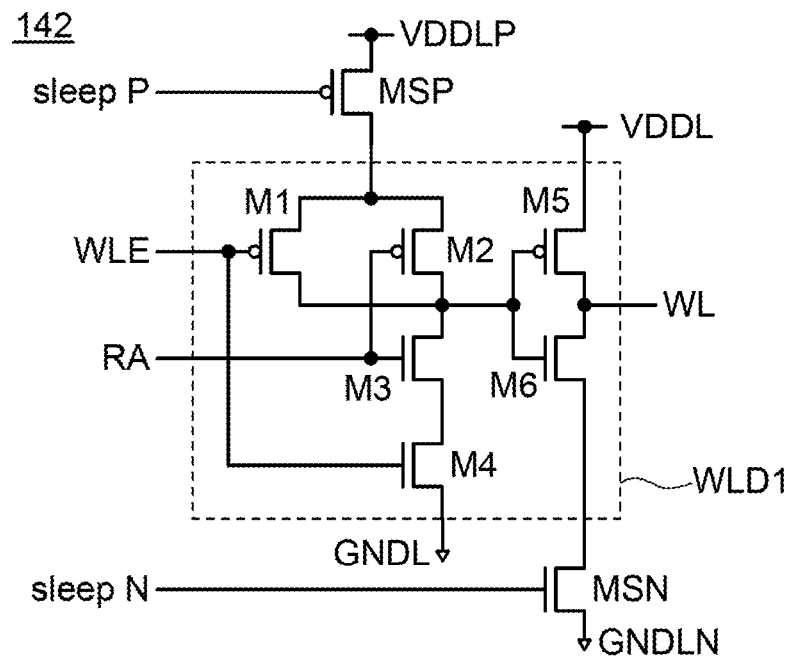
FIGS. 17A and 17B are circuit diagrams each showing an example of a semiconductor device of one embodiment of the present invention.

FIG. 17A shows a structure example of a word line driver circuit. A word line driver circuit 142 includes the transistor MSP, the transistor MSN, and the circuit WLD1 (in this embodiment, also referred to as a unit word line driver). The circuit WLD1 includes transistors M1 to M6. The transistors MSP, M1, M2, and M5 are p-channel transistors, and the transistors MSN, M3, M4, and M6 are n-channel transistors.

The gate of the transistor M1 is electrically connected to the gate of the transistor M4 and the wiring WLE. One of the source and the drain of the transistor M1 is electrically connected to one of the source and the drain of the transistor M2, and the other of the source and the drain of the transistor M1 is electrically connected to the other of the source and the drain of the transistor M2, one of the source and the drain of the transistor M3, the gate of the transistor M5, and the gate of the transistor M6. The gate of the transistor M2 is electrically connected to the gate of the transistor M3 and the wiring RA. The other of the source and the drain of the transistor M3 is electrically connected to one of the source and the drain of the transistor M4. One of the source and the drain of the transistor M5 is electrically connected to one of the source and the drain of the transistor M6 and the wiring WL.

The wiring VDDLP is electrically connected to one of the source and the drain of the transistor MSP. The other of the source and the drain of the transistor MSP is electrically connected to the one of the source and the drain of the transistor M1 and the one of the source and the drain of the transistor M2. The other of the source and the drain of the transistor M4 is electrically connected to the wiring GNDL. The other of the source and the drain of the transistor M5 is electrically connected to the wiring VDDL. The other of the source and the drain of the transistor M6 is electrically connected to one of the source and the drain of the transistor MSN, and the other of the source and the drain of the transistor MSN is electrically connected to the wiring GNDL. The gate of the transistor MSN is electrically connected to the wiring sleepN, and the gate of the transistor MSP is electrically connected to the wiring sleepP.

The circuit WLD1 needs to be connected to a high potential power source and a low potential power source to be driven. The aforementioned wirings VDDL and VDDLP are used to connect any circuit to the high potential power source. The aforementioned wirings GNDL and GNDLN are used to connect any circuit to the low potential power source. Here, the high potential power source is configured to supply a power source voltage VDD and the low potential power source is configured to supply a fixed potential GND.

The wirings WLE and RA are used to input an external signal to the word line driver circuit 142, and the wiring WL is used to output a writing selection signal from the word line driver circuit 142 to a predetermined memory cell.

The circuit WLD1 is obtained by connecting an output terminal of a NAND circuit and an input terminal of an inverter circuit in series. Thus, the circuit WLD1 in the word line driver circuit 142 in FIG. 17A can be replaced with a circuit WLD1L in a word line driver circuit 143 in FIG. 17B. Specifically, the transistors M1 to M4 in the word line driver circuit 142 in FIG. 17A are replaced with the NAND circuit 51 in FIG. 17B, and the transistors M5 and M6 in the word line driver circuit 142 in FIG. 17A are replaced with the inverter circuit 52 in FIG. 17B.

Thus, the entire circuit WLD1 can be regarded as an AND circuit. That is, when a high-level potential is input to the wirings WLE and RA, the high-level potential is output from the wiring WL; and when a low-level potential is input to at least one of the wirings WLE and RA, the low-level potential is output from the wiring WL.

Figure 18A:
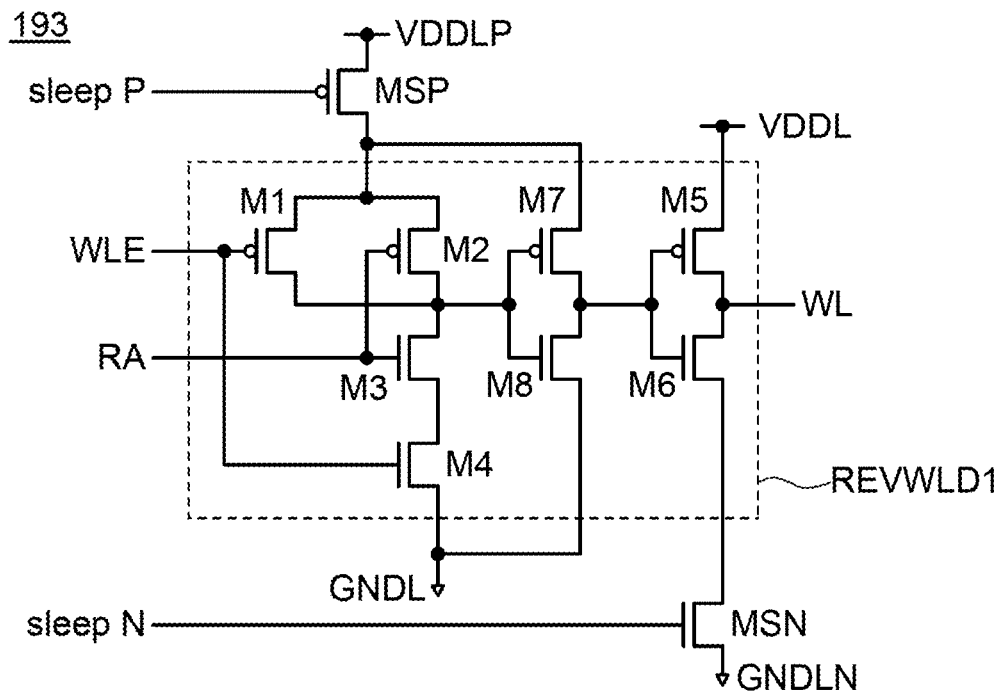
FIGS. 18A and 18B are circuit diagrams each showing an example of a semiconductor device of one embodiment of the present invention.

Some memory cells require an output of the wiring WL to be inverted. In that case, a word line driver circuit 193 shown in FIG. 18A is provided. The word line driver circuit 193 is different from the word line driver circuit 142 shown in FIG. 17A in having transistors M7 and M8.

Described next is the connection of a circuit REVWLD1 in the word line driver circuit 193 of FIG. 18A. One of a source and a drain of the transistor M7 is electrically connected to one of a source and a drain of the transistor M8, the gate of the transistor M5, and the gate of the transistor M6. A gate of the transistor M7 is electrically connected to a gate of the transistor M8, the other of the source and the drain of the transistor M1, the other of the source and the drain of the transistor M2, and the one of the source and the drain of the transistor M3.

The other of the source and the drain of the transistor M7 is electrically connected to the other of the source and the drain of the transistor MSP, the one of the source and the drain of the transistor M1, and the one of the source and the drain of the transistor M2. The other of the source and the drain of the transistor M8 is electrically connected to the other of the source and the drain of the transistor M4 and the wiring GNDL.

Such a circuit structure allows an output result of the word line driver circuit 142 to be inverted. For example, when a high-level potential is input to the wirings WLE and RA, the low-level potential is output from the wiring WL; and when a low-level potential is input to at least one of the wirings WLE and RA, the low-level potential is output from the wiring WL.

The circuit REVWLD1 is obtained by connecting an output terminal of an AND circuit and an input terminal of an inverter circuit in series. Thus, the word line driver circuit 193 in FIG. 18A can be replaced with a circuit REVWLD1L in a word line driver circuit 194 in FIG. 18B. Specifically, the transistors M1 to M4 and the transistors M7 and M8 in the word line driver circuit 193 in FIG. 18A are replaced with an AND circuit 80 in FIG. 18B, and the transistors M5 and M6 in the word line driver circuit 193 in FIG. 18A are replaced with the inverter circuit 52 in FIG. 18B. In other words, the word line driver circuit 194 is obtained by replacing the NAND circuit 51 in the word line driver circuit 143 FIG. 17B with the AND circuit 80.

Structure Example 2 of Word Line Driver Circuit

Described here is a structure example of 128 unit word line drivers which are driven for every 16 unit word line drivers.

Figure 19:
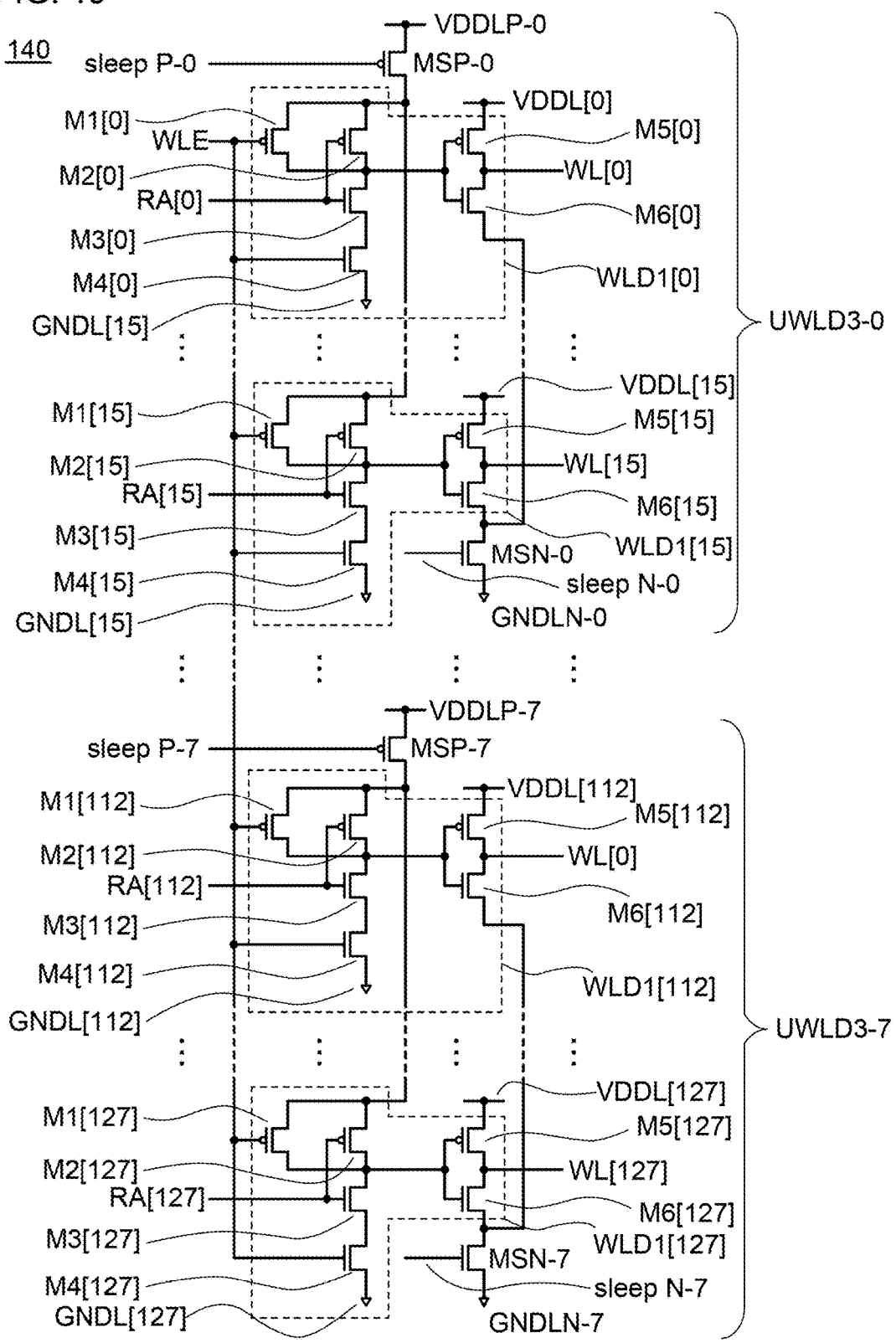
FIG. 19 is a circuit diagram showing an example of a semiconductor device of one embodiment of the present invention.

FIG. 19 shows an example of a word line driver circuit of one embodiment of the present invention. A word line driver circuit 140 in FIG. 19 consists of 8 stages: each stage includes 16 circuits WLD1 and two sleep transistors (denoted by transistors MSP-j and MSN-j in FIG. 19). Note that the word line driver circuit 140 in FIG. 19 is different from the word line driver circuit 100 in FIG. 1 in the position where the two sleep transistors (the transistors MSP-j and MSN-j) are provided.

The word line driver circuit 140 includes the p-channel transistors M1[0] to M1[127], the p-channel transistors M2[0] to M2[127], the n-channel transistors M3[0] to M3[127], the n-channel transistors M4[0] to M4[127], the p-channel transistors M5[0] to M5[127], the n-channel transistors M6[0] to M6[127], the p-channel transistors MSP-0 to MSP-7, and the n-channel transistors MSN-0 to MSN-7.

As shown in FIG. 19, a circuit WLD1[$i$] ($i$ is an integer of 16×j to 16×(j+1)−1, and j is an integer of 0 to 7; for example, $i$ is an integer of 112 to 127 when j=7) includes the transistors M1[$i$] to M6[$i$]. A circuit UWLD3-$j$ includes circuits WLD1[16×j] to WLD1[16×(j+1)−1] and the transistors MSP-j and MSN-j.

The gate of the transistor M1[$i$] is electrically connected to the wiring WLE. One of the source and the drain of the transistor M1[$i$] is electrically connected to one of the source and the drain of the transistor M2[$i$] and one of the source and the drain of the transistor MSP-j, and the other of the source and the drain of the transistor M1[$i$] is electrically connected to the other of the source and the drain of the transistor M2[$i$], one of the source and the drain of the transistor M3[$i$], the gate of the transistor M5[$i$], and the gate of the transistor M6[$i$].

The gate of the transistor M2[$i$] is electrically connected to the gate of the transistor M3[$i$] and the wiring RA[i]. The other of the source and the drain of the transistor M3[$i$] is electrically connected to one of the source and the drain of the transistor M4[$i$]. The gate of the transistor M4[$i$] is electrically connected to the wiring WLE. The other of the source and the drain of the transistor M4[$i$] is electrically connected to the wiring GNDL[i]. One of the source and the drain of the transistor M5[$i$] is electrically connected to the wiring VDDL[i], and the other of the source and the drain of the transistor M5[$i$] is electrically connected to one of the source and the drain of the transistor M6[$i$], and the wiring WL[i]. The other of the source and the drain of the transistor M6[$i$] is electrically connected to one of the source and the drain of the transistor MSN-j.

The gate of the transistor MSP-j is electrically connected to the wiring sleepP-j, and the other of the source and the drain of the transistor MSP-j is electrically connected to the wiring VDDLP-j. The gate of the transistor MSN-j is electrically connected to the wiring WLE-j, and the other of the source and the drain of the transistor MSN-j is electrically connected to the wiring GNDLN-j.

Note that some reference numerals are omitted in FIG. 19. Specifically, FIG. 19 does not show reference numerals except for the following: the wiring sleepP-0, the wiring sleepP-7, the wiring sleepN-0, the wiring sleepN-7, the wiring WLE, the wiring RA[0], the wiring RA[15], the wiring RA[112], the wiring RA[127], the wiring WL[0], the wiring WL[15], the wiring WL[112], the wiring WL[127], the wiring VDDL[0], the wiring VDDL[15], the wiring VDDL[112], the wiring VDDL[127], the wiring GNDL[0], the wiring GNDL[15], the wiring GNDL[112], the wiring GNDL[127], the wiring VDDLP-0, the wiring VDDLP-7, the wiring GNDLN-0, the wiring GNDLN-7, the transistor MSN-0, the transistor MSN-7, the transistor MSP-0, the transistor MSP-7, the transistor M1[0], the transistor M2[0], the transistor M3[0], the transistor M4[0], the transistor M5[0], the transistor M6[0], the transistor M1[15], the transistor M2[15], the transistor M3[15], the transistor M4[15], the transistor M5[15], the transistor M6[15], the transistor M1[112], the transistor M2[112], the transistor M3[112], the transistor M4[112], the transistor M5[112], the transistor M6[112], the transistor M1[127], the transistor M2[127], the transistor M3[127], the transistor M4[127], the transistor M5[127], the transistor M6[127], the circuit WLD1[0], the circuit WLD1[15], the circuit WLD1[112], the circuit WLD1[127], the circuit UWLD3-0, and the circuit UWLD3-7.

Note that as in the word line driver circuit 143, the circuit WLD1[$i$] in the word line driver circuit 140 needs to be connected to a high potential power source and a low potential power source to be driven. Although not shown, the wirings VDDL[0] to VDDL[127] and the wirings VDDLP-0 to VDDLP-7 are connected to a high potential power source and supplied with the power source voltage VDD from the high potential power source. Although not shown, the wirings GNDL[0] to GNDL[127] and the wirings GNDLN-0 to GNDLN-7 are connected to a low potential power source and supplied with the fixed potential GND (also referred to as a reference potential in some cases) from the low potential power source.

The wirings WLE and RA[i] are used to input an external signal to the word line driver circuit 140, and the wiring WL[i] is used to output a writing selection signal from the word line driver circuit 140 to a predetermined memory cell.

<Operation Example of Word Line Driver Circuit>

Figure 20:
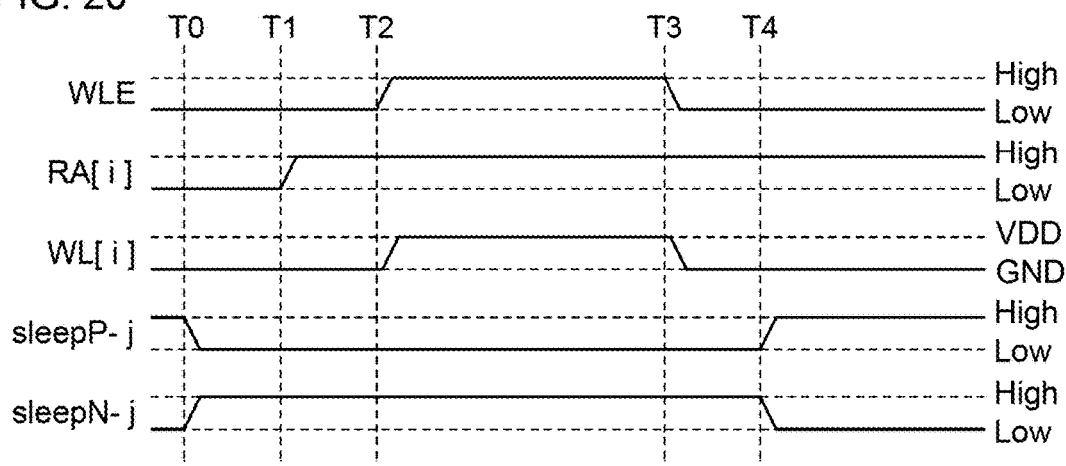
FIG. 20 is a timing chart showing an operation example of the semiconductor device shown in FIG. 19.

Described is an operation example of the word line driver circuit 140 shown in FIG. 19. FIG. 20 is a timing chart for the word line driver circuit 140. Note that for simplicity, the timing chart of FIG. 20 shows an operation example of the circuit WLD1[$i$] in the j-th stage, and specifically shows changes in the potentials of the wiring WLE, the wiring RA[i], the wiring WL[i], the wiring sleepP-j and the wiring sleepN-j. The power source voltage VDD or the fixed potential GND is input to each of the wirings WLE and RA[i]. However, as long as the on/off states of the transistors M1[$i$], to M4[$i$] connected to the wirings WLE and RA[i] can be controlled, a voltage lower than the power source voltage VDD and a voltage higher than the fixed potential GND may be input as the high-level potential (High) and the low-level potential (Low), respectively. Hence, the high-level potential and the low-level potential of the wirings WLE and RA[i] are denoted by "High" and "Low" in FIG. 20, respectively.

At Time T0, the potential of the wiring sleepP-j is Low and the potential of the wiring sleepN-j is High. As a result, the transistor MSP-j connected to the wiring sleepP-j and the transistor MSN-j connected to the wiring sleepN-j are turned on. That is, the power source voltage VDD is applied to the one of the source and the drain of the transistor M1[$i$] and the one of the source and the drain of the transistor M2[$i$] through the transistor MSP-j, and the fixed potential GND is applied to the other of the source and the drain of the transistor M6[$i$] through the transistor MSN-j.

From Time T0 to Time T1, a low-level potential is applied to the wirings WLE and RA[i]. That is, a low-level potential is applied to the gates of the transistors M1[$i$] to M4[$i$];

accordingly, the transistors M1[$i$] and M2[$i$] are turned on whereas the transistors M3[$i$] and M4[$i$] are turned off. Then, the power source voltage VDD is applied to the gates of the transistors M5[$i$] and M6[$i$] through the transistors M1[$i$] and M2[$i$]. As a result, the transistor M5[$i$] is turned off and the transistor M6[$i$] is turned on; thus, the fixed potential GND is output to the wiring WL[i] through the transistor M6[$i$].

At Time T1, a high-level potential is applied to the wiring RA[i]. At this time, a high-level potential is applied to the gates of the transistors M2[$i$] and M3[$i$]; accordingly, the transistor M2[$i$] is turned off and the transistor M3[$i$] is turned on. Since the transistor M1[$i$] is still on at this time, the power source voltage VDD is applied to the gates of the transistors M5[$i$] and M6[$i$] as in the time before Time T1. Since the transistor M4[$i$] is also off, the fixed potential GND is not applied to the other of the source and the drain of the transistor M3[$i$] through the transistor M4[$i$]. In other words, a low-level potential is output to the wiring WL[i] as in the time before Time T1.

At Time T2, a high-level potential is applied to the wiring WLE. At this time, a high-level potential is applied to the gates of the transistors M1[$i$] and M4[$i$]; accordingly, the transistor M1[$i$] is turned off and the transistor M4[$i$] is turned on. Since the transistor M2[$i$] is still off, the power source voltage VDD ceases to be applied to the gates of the transistors M5[$i$] and M6[$i$] through the transistors M1[$i$] and M2[$i$]. Since the transistor M3 [$i$] is on, the fixed potential GND is applied to the gates of the transistors M5 [$i$] and M6[$i$] through the transistors M3[$i$] and M4[$i$]. Thus, the transistor M5[$i$] is turned on whereas the transistor M6[$i$] is turned off, and accordingly, the power source voltage VDD is output to the wiring WL[i] through the transistor M5[$i$].

Note that from Time T2 to Time T3, the power source voltage VDD is applied from the wiring WL[i] to memory cells in the i-th row, i.e., data is written thereto at this time. In other words, when a high-level potential is input to the wiring WLE while a high-level potential is input to at least one of the wirings RA[16×j] to RA[16×(j+1)−1], data can be simultaneously written to the memory cells in a row of any of the wirings RA[16×j] to RA[16×(j+1)−1] that has a high-level potential.

In addition, when all the wirings RA[16×j] to RA[16×(j+1)−1] in the j-th stage have a low-level potential, no data is written to the memory cells in all the rows of the j-th stage. At this time, the transistors MSN-j and MSP-j are preferably off because the circuits WLD2[16×j] to WLD2[16×(j+1)−1] in the j-th stage, namely, the circuit UWLD3-$j$ does not need to operate. This results in interrupted supply of the power source voltage VDD and the fixed potential GND to the circuit UWLD3-$j$ from which no writing selection signal is output, reducing power consumption.

At Time T3, a low-level potential is applied to the wiring WLE. At this time, a low-level potential is applied to the gates of the transistors M1[$i$] and M4[$i$]; accordingly, the transistor M1[$i$] is turned on and the transistor M4[$i$] is turned off. In other words, the on/off states of the transistors M1[$i$] to M4[$i$] are returned to the states from Time T1 to Time T2; thus, the fixed potential GND is output to the wiring WL[i].

At Time T4, the potential of the wiring sleepP-j is High and the potential of the wiring sleepN-j is Low. As a result, the transistor MSP-j and the transistor MSN-j are turned off. This results in interrupted supply of the power source voltage VDD and the fixed potential GND to the word line driver circuit 140, reducing power consumption.

Note that in the timing chart of FIG. 20, the potential of the wiring sleepP-j is Low and the potential of the wiring sleepN-j is High at Time T0; however, the operation of the word line driver circuit 140 is not limited to this. For example, from Time T1 to Time T2, a low-level potential and a high-level potential may be applied to the wiring sleepP-j and the wiring sleepN-j, respectively.

Structure Example 3 of Word Line Driver Circuit

Described here is a structure example of 128 unit word line drivers which can be driven simultaneously.

Figure 21:
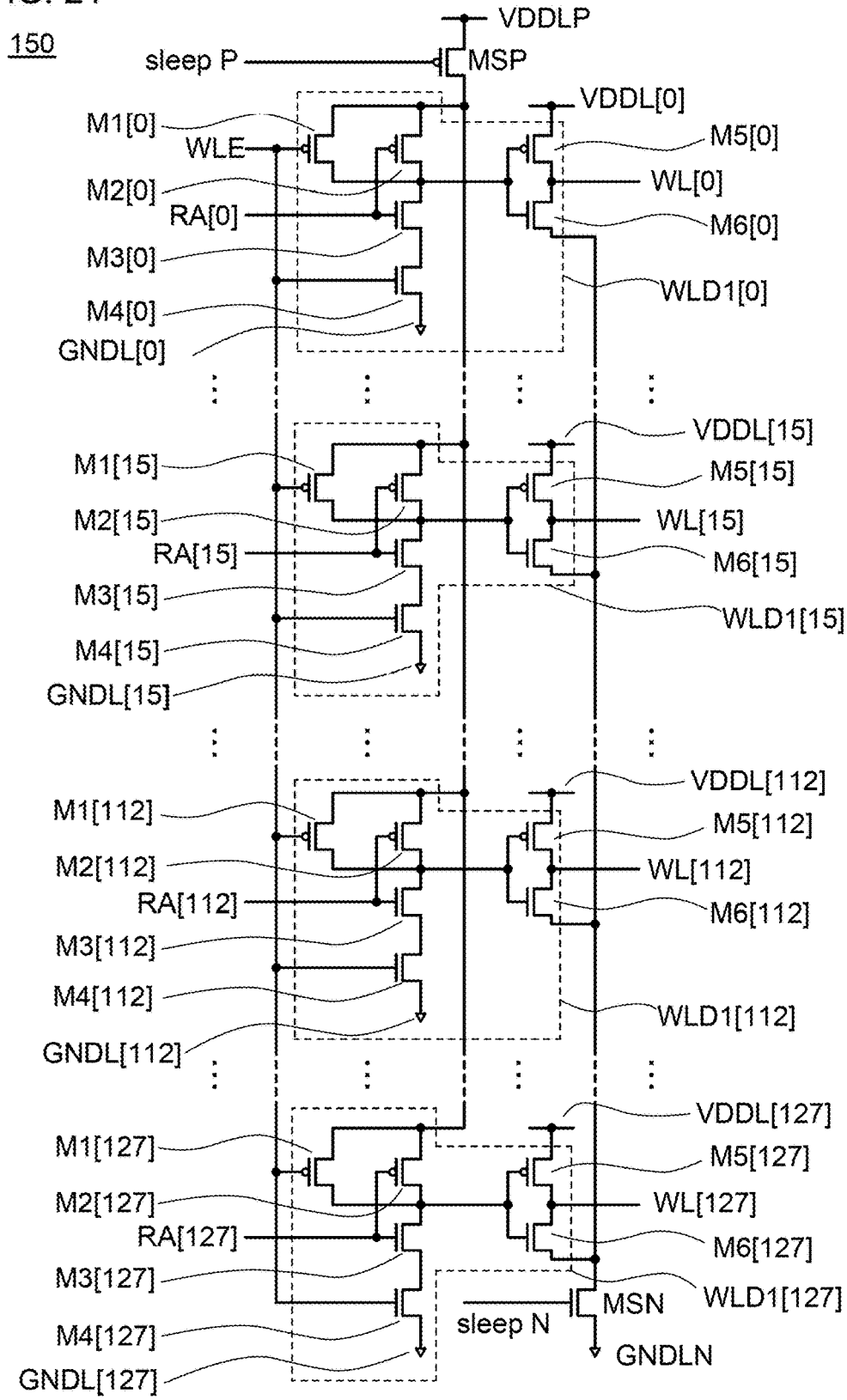
FIG. 21 is a circuit diagram showing an example of a semiconductor device of one embodiment of the present invention.

The word line driver shown in FIG. 19 consists of 8 stages, each of which includes the 16 circuits WLD1 and the transistors MSP-j and MSN-j as sleep transistors. FIG. 21 shows another example of the word line driver circuit different from that in FIG. 19. A word line driver circuit 150 includes the 128 circuits WLD1 and two sleep transistors (denoted by transistors MSP and MSN in FIG. 21).

The word line driver circuit 150 includes the p-channel transistors M1[0] to M1[127], the p-channel transistors M2[0] to M2[127], the n-channel transistors M3[0] to M3[127], the n-channel transistors M4[0] to M4[127], the p-channel transistors M5[0] to M5[127], the n-channel transistors M6[0] to M6[127], the p-channel transistor MSP, and the n-channel transistor MSN.

The gate of the transistor M1[$i$] ($i$ is an integer of 0 to 127) is electrically connected to the wiring WLE. One of the source and the drain of the transistor M1[$i$] is electrically connected to one of the source and the drain of the transistor M2[$i$] and one of the source and the drain of the transistor MSP, and the other of the source and the drain of the transistor M1[$i$] is electrically connected to the other of the source and the drain of the transistor M2[$i$], one of the source and the drain of the transistor M3[$i$], the gate of the transistor M5[$i$], and the gate of the transistor M6[$i$]. The gate of the transistor M2[$i$] is electrically connected to the gate of the transistor M3[$i$] and the wiring RA[i]. The other of the source and the drain of the transistor M3 [$i$] is electrically connected to one of the source and the drain of the transistor M4[$i$]. The gate of the transistor M4[$i$] is electrically connected to the wiring WLE. The other of the source and the drain of the transistor M4[$i$] is electrically connected to the wiring GNDL[i]. One of the source and the drain of the transistor M5[$i$] is electrically connected to the wiring VDDL[i], and the other of the source and the drain of the transistor M5[$i$] is electrically connected to one of the source and the drain of the transistor M6[$i$] and the wiring WL[i]. The other of the source and the drain of the transistor M6[$i$] is electrically connected to one of the source and the drain of the transistor MSN.

The gate of the transistor MSP is electrically connected to the wiring sleepP, and the other of the source and the drain of the transistor MSP is electrically connected to the wiring VDDLP. The gate of the transistor MSN is electrically connected to the wiring sleepN, and the other of the source and the drain of the transistor MSN is electrically connected to the wiring GNDLN.

Note that some reference numerals are omitted in FIG. 21. Specifically, FIG. 21 does not show reference numerals except for the following: the wiring sleepP, the wiring sleepN, the wiring WLE, the wiring RA[0], the wiring RA[15], the wiring RA[112], the wiring RA[127], the wiring WL[0], the wiring WL[15], the wiring WL[112], the wiring WL[127], the wiring VDDL[0], the wiring VDDL[15], the wiring VDDL[112], the wiring VDDL[127], the wiring GNDL[0], the wiring GNDL[15], the wiring GNDL[112], the wiring GNDL[127], the wiring VDDLP, the wiring GNDLN, the transistor MSN, the transistor MSP, the transistor M1[0], the transistor M2[0], the transistor M3[0], the transistor M4[0], the transistor M5[0], the transistor M6[0], the transistor M1[15], the transistor M2[15], the transistor M3[15], the transistor M4[15], the transistor M5[15], the transistor M6[15], the transistor M1[112], the transistor M2[112], the transistor M3[112], the transistor M4[112], the transistor M5[112], the transistor M6[112], the transistor M1[127], the transistor M2[127], the transistor M3[127], the transistor M4[127], the transistor M5[127], the transistor M6[127], the circuit WLD1[0], the circuit WLD1[15], the circuit WLD1[112], and the circuit WLD1[127].

Note that as in the word line driver circuits 140 and 142, the circuit WLD1[$i$] in the word line driver circuit 150 needs to be connected to a high potential power source and a low potential power source to be driven. Although not shown, the wirings VDDL[0] to VDDL[127] and the wiring VDDLP are connected to a high potential power source and supplied with the power source voltage VDD from the high potential power source. Although not shown, the wirings GNDL[0] to GNDL[127] and the wiring GNDLN are connected to a low potential power source and supplied with the fixed potential GND (also referred to as a reference potential in some cases) from the low potential power source.

Other Circuit Structure Examples

In FIG. 19, the two sleep transistors (the transistors MSP-j and MSN-j) are provided for the 16 circuits WLD1, and in FIG. 21, the two sleep transistors (the transistors MSP and MSN) are provided for the 128 circuits WLD1. However, this embodiment is not limited to these structures. For example, two sleep transistors may be provided for one circuit WLD1. Alternatively, each stage may include a different number of circuits WLD1; for example, two sleep transistors are provided for 16 circuits WLD1 in each of four stages and two sleep transistors are provided for each of the other 64 circuits WLD1. In addition, for example, the number of the circuits WLD1 is not limited to 128 and may be greater than or less than 128.

Figure 24:
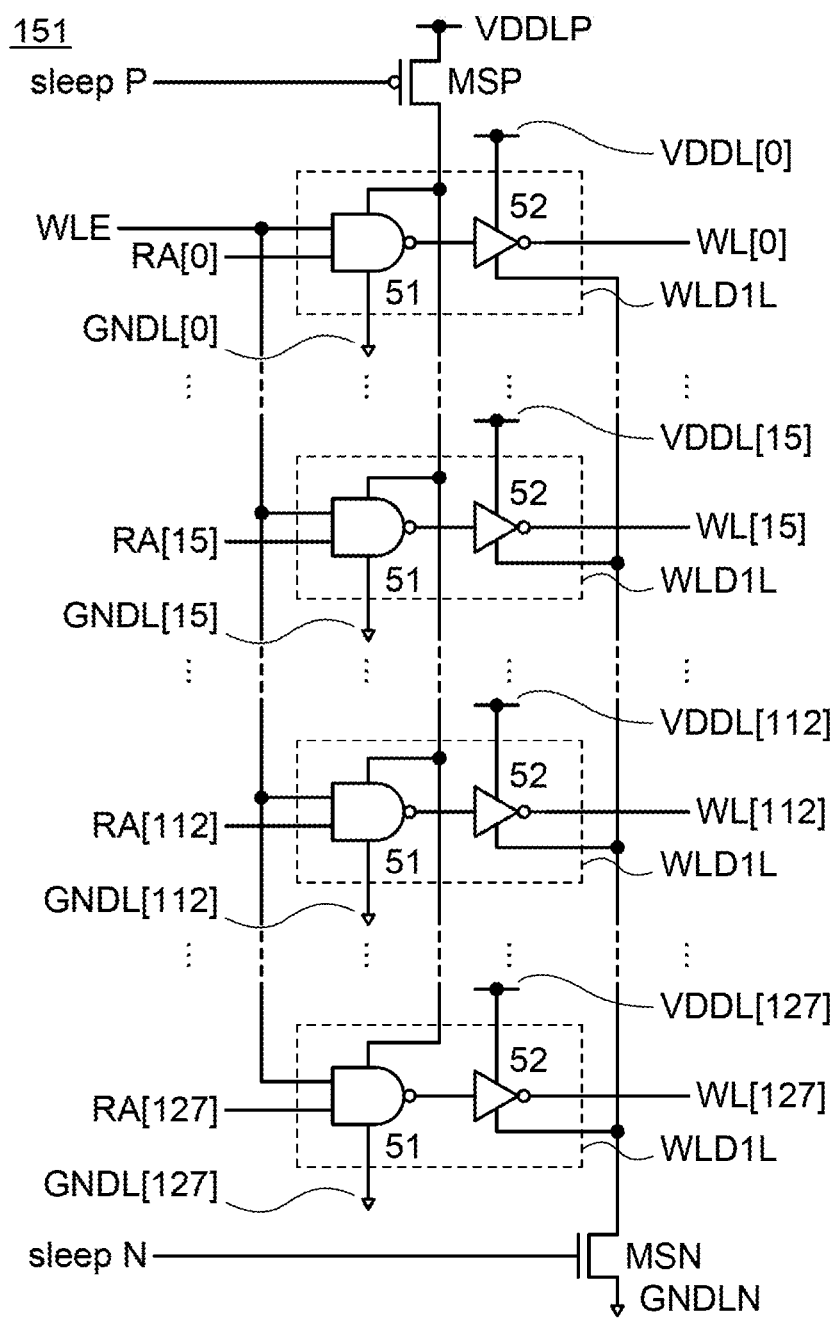
FIG. 24 is a circuit diagram showing an example of a semiconductor device of one embodiment of the present invention.

In the word line driver circuit 140 shown in FIG. 19 and the word line driver circuit 150 shown in FIG. 21, the transistors M1[$i$] to M6[$i$] may be replaced with the NAND circuit 51 and the inverter circuit 52. Circuits in such a case are shown in FIGS. 22 and 24.

Figure 22:
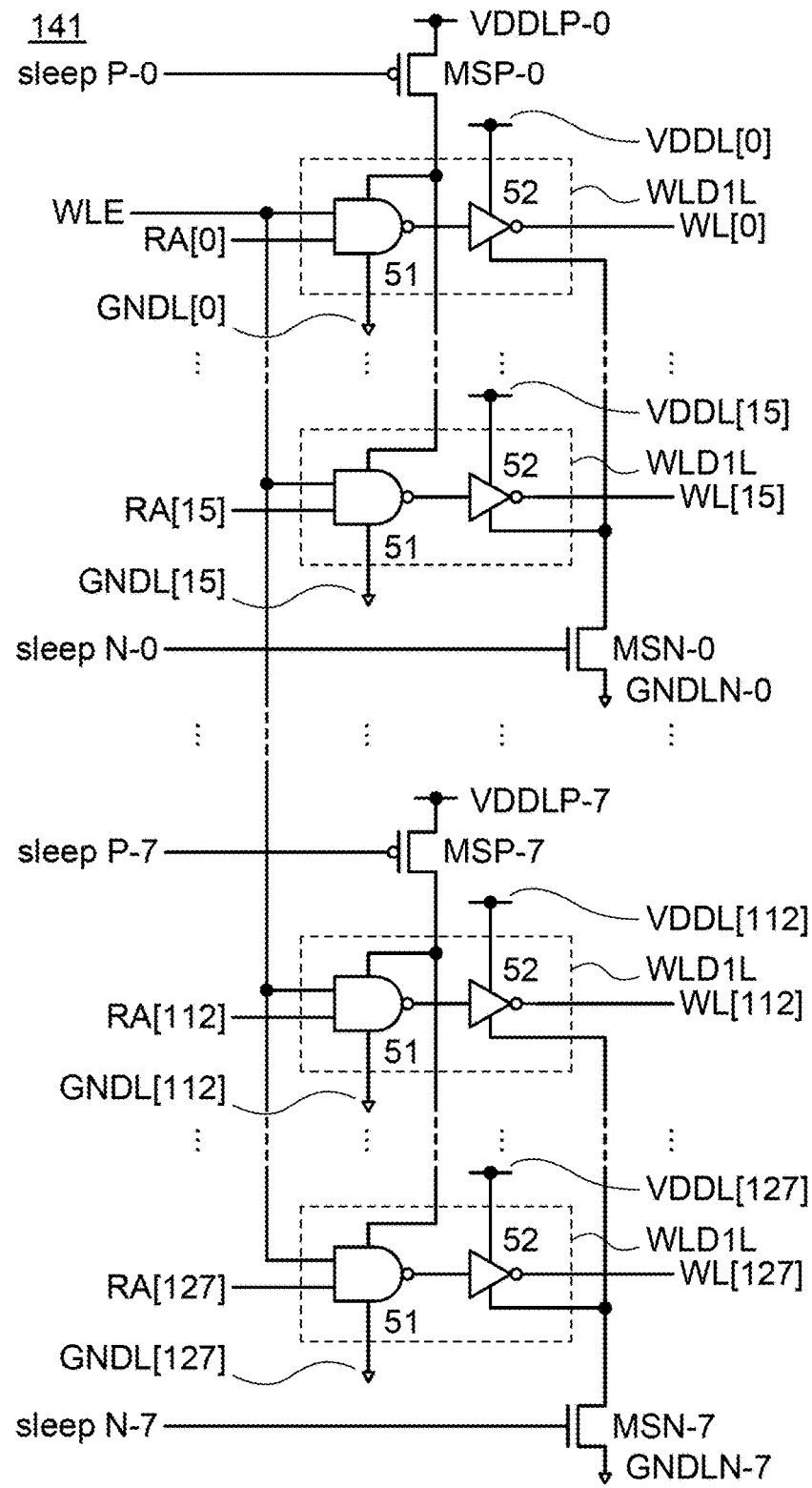
FIG. 22 is a circuit diagram showing an example of a semiconductor device of one embodiment of the present invention.

A word line driver circuit 141 in FIG. 22 is obtained by replacing the transistors M1[$i$] to M6[$i$] in the word line driver circuit 140 in FIG. 19 with the NAND circuit 51 and the inverter circuit 52. A word line driver circuit 151 in FIG. 24 is obtained by replacing the transistors M1[$i$] to M6[$i$] in the word line driver circuit 150 in FIG. 21 with the NAND circuit 51 and the inverter circuit 52.

Figure 23:
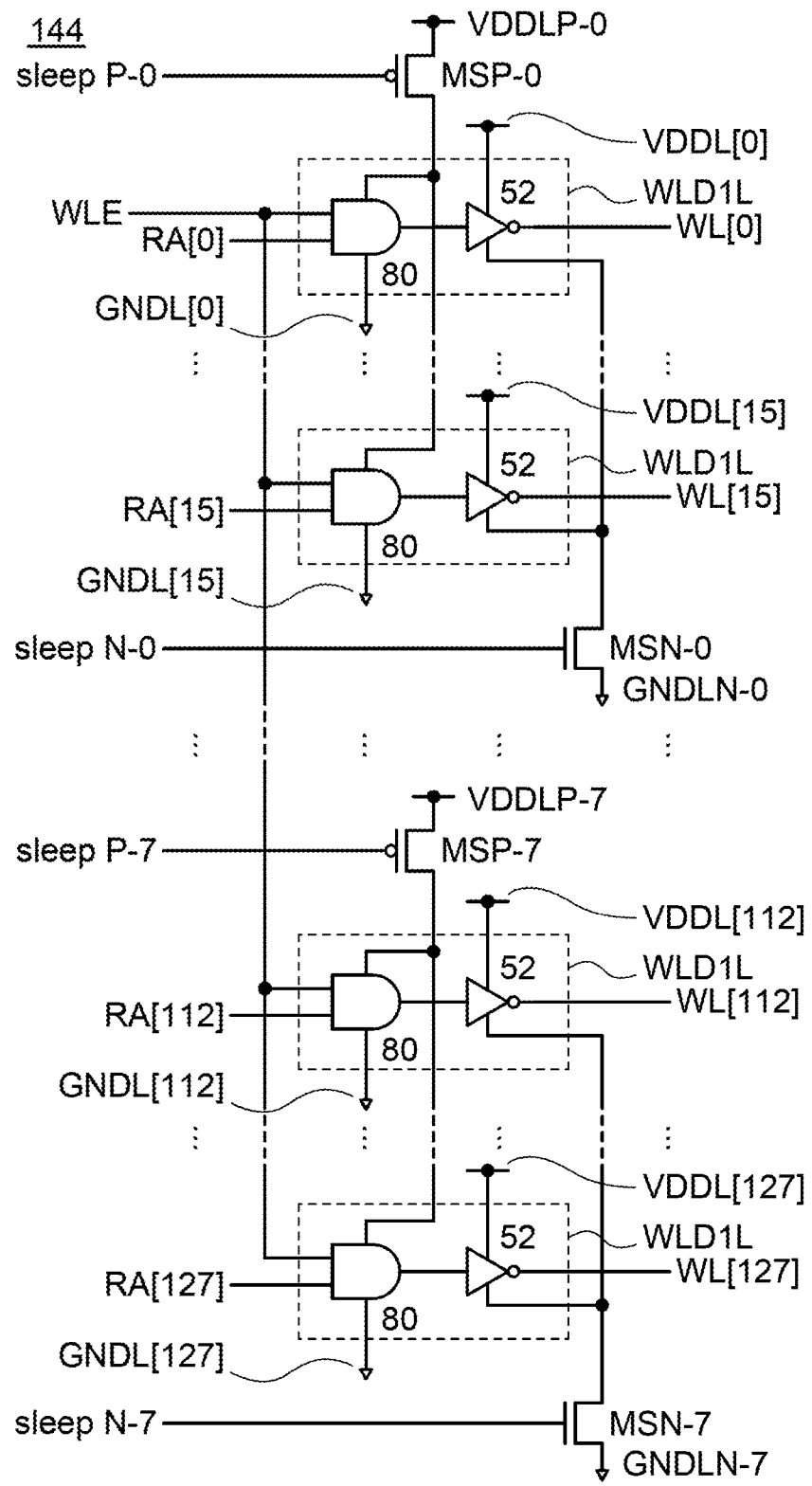
FIG. 23 is a circuit diagram showing an example of a semiconductor device of one embodiment of the present invention.
Figure 25:
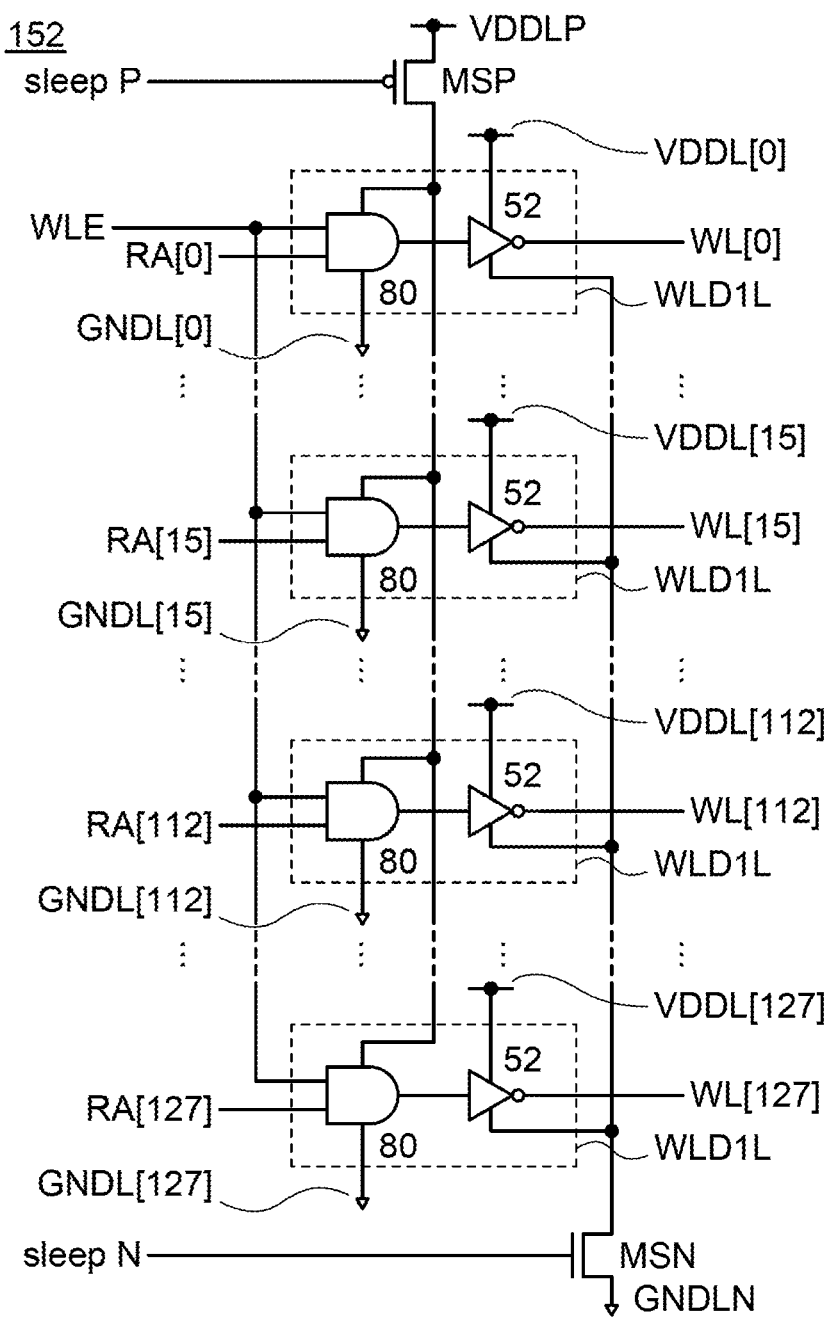
FIG. 25 is a circuit diagram showing an example of a semiconductor device of one embodiment of the present invention.

Some memory cells require an output of the wiring WL to be inverted. In that case, the NAND circuit 51 in the word line driver circuits 141 and 151 in FIGS. 22 and 24 is replaced with the AND circuit 80 as described above in the structure example of the circuit operating one word line driver. A word line driver circuit 144 in FIG. 23 is obtained by replacing the NAND circuit 51 in the word line driver circuit 141 with the AND circuit 80, and a word line driver circuit 152 in FIG. 25 is obtained by replacing the NAND circuit 51 in the word line driver circuit 151 with the AND circuit 80.

Such a circuit structure allows an output result of the word line driver circuits 144 and 152 to be inverted. For example, when a high-level potential is input to the wirings WLE and RA[i] in the word line driver circuit 144, a low-level potential is output from the wiring WL[i]; and when a low-level potential is input to at least one of the wirings WLE and RA[i] in the word line driver circuit 152, a high-level potential is output from the wiring WL[i].

Figure 26:
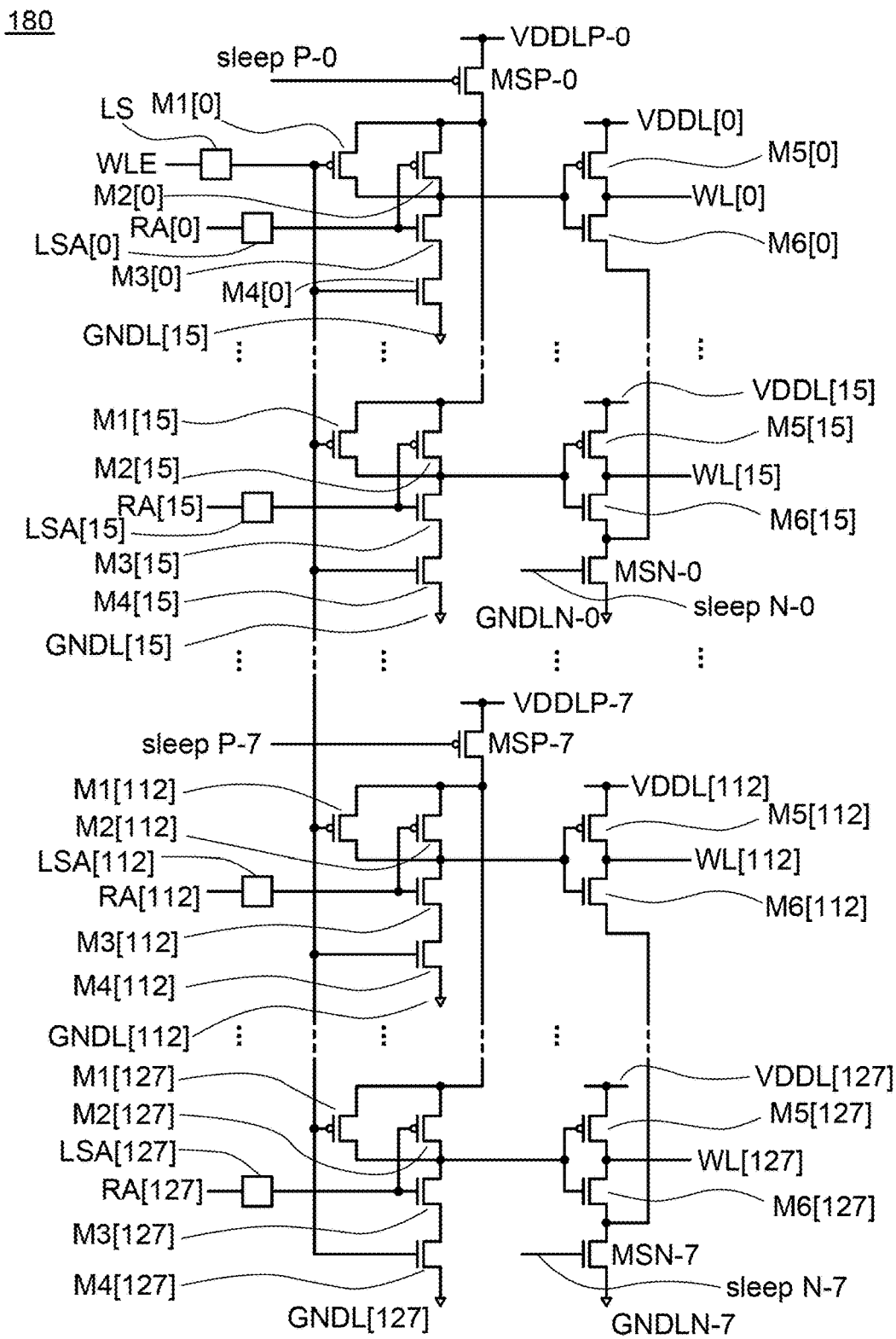
FIG. 26 is a circuit diagram showing an example of a semiconductor device of one embodiment of the present invention.

When a level shifter is used in the word line driver circuit 140, a voltage higher than the voltage VDD (hereinafter referred to as VDDH) can be used. FIG. 26 shows an example of providing a level shifter in the word line driver circuit 140. A word line driver circuit 180 is different from the word line driver circuit 140 in having a level shifter LS and level shifters LSA[0] to LSA[127].

Note that some level shifters are omitted in the word line driver circuit 180 in FIG. 26. Specifically, FIG. 26 does not show level shifters except for the level shifters LS, LSA[0], LSA[15], LSA[112], and LSA[127].

The input terminal of the level shifter LS is electrically connected to the wiring WLE, and the output terminal of the level shifter LS is electrically connected to the gate of the transistor M1[$i$] and the gate of the transistor M4[$i$]. The input terminal of the level shifter LSA[i] is electrically connected to the wiring RA[i], and the output terminal of the level shifter LSA[i] is electrically connected to the gate of the transistor M2[$i$] and the gate of the transistor M3[$i$].

The level shifter LS enables the voltage VDD applied to the wiring WLE to increase to VDDH, and the level shifter LSA[i] enables the voltage VDD applied to the wiring RA[i] to increase to VDDH.

Figure 27:
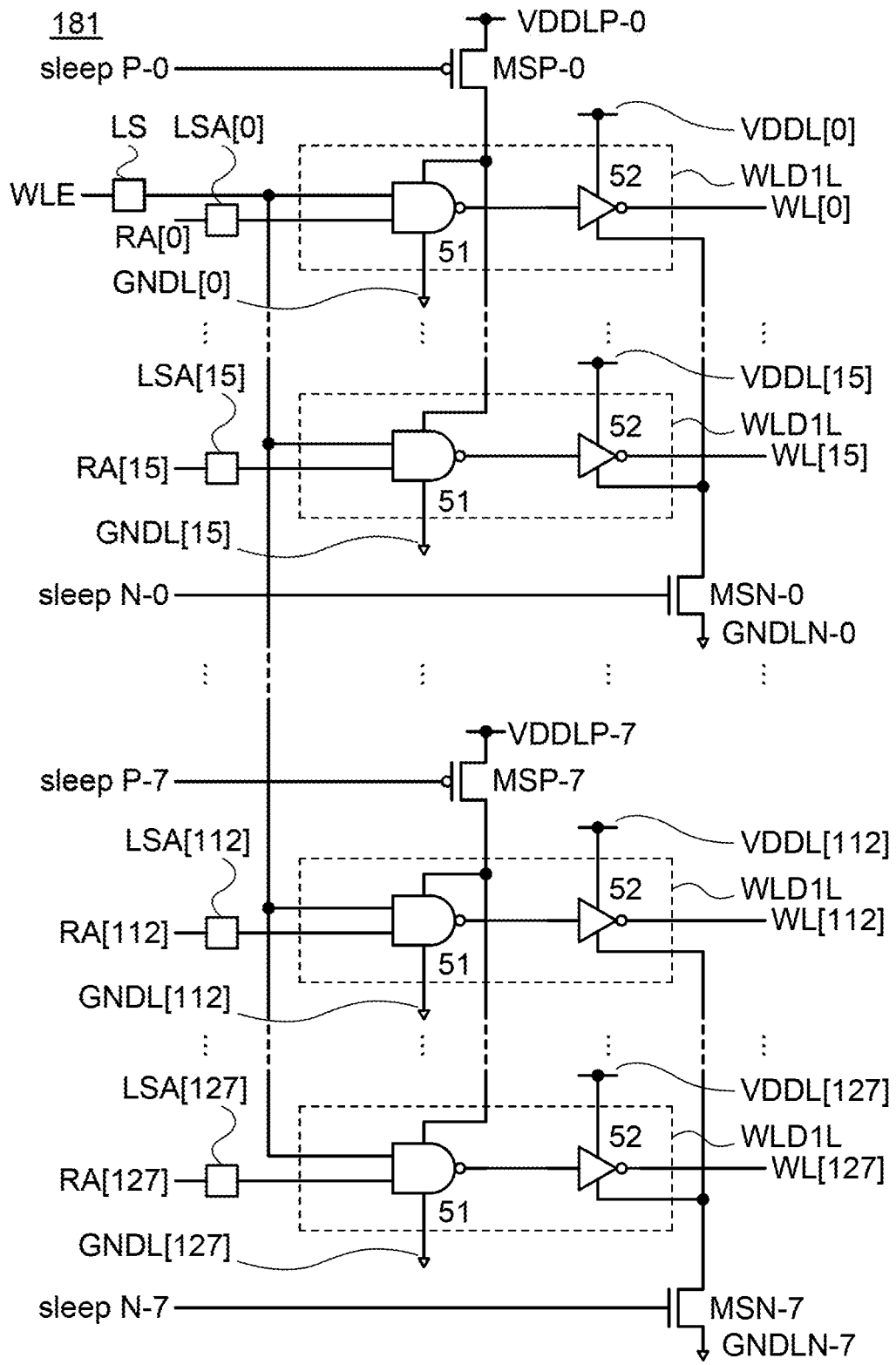
FIG. 27 is a circuit diagram showing an example of a semiconductor device of one embodiment of the present invention.

In the word line driver circuit 180 shown in FIG. 26, the transistors M1[$i$] to M6[$i$] may be replaced with the NAND circuit 51 and the inverter circuit 52. A word line driver circuit 181 with such a structure is shown in FIG. 27. The circuit WLD1L in the word line driver circuit 181 is obtained by replacing the transistors M1[$i$] to M6[$i$] with the NAND circuit 51 and the inverter circuit 52. In the word line driver circuit 180 in FIG. 26, the level shifter LSA[i] is provided outside the circuit WLD1; however, this embodiment is not limited to this structure and the level shifter LSA[i] may be provided in the circuit WLD1.

Furthermore, a voltage lower than the fixed potential GND (hereinafter referred to as VSSL) may be used. In that case, a level shifter is provided as in the above to reduce the fixed potential GND to VSSL.

Although not shown, the level shifter can also be provided in the word line driver circuit 150 in FIG. 21, whereby the voltage VDD can be increased to VDDH or the fixed potential GND can be reduced to VSSL. Specifically, a level shifter is provided between the wiring WLE and a contact point between the gates of the transistors M1[$i$] and M4[$i$], and a level shifter is provided between the wiring RA[i] and a contact point between the gates of the transistors M2[$i$] and M3[$i$].

Figure 17B:
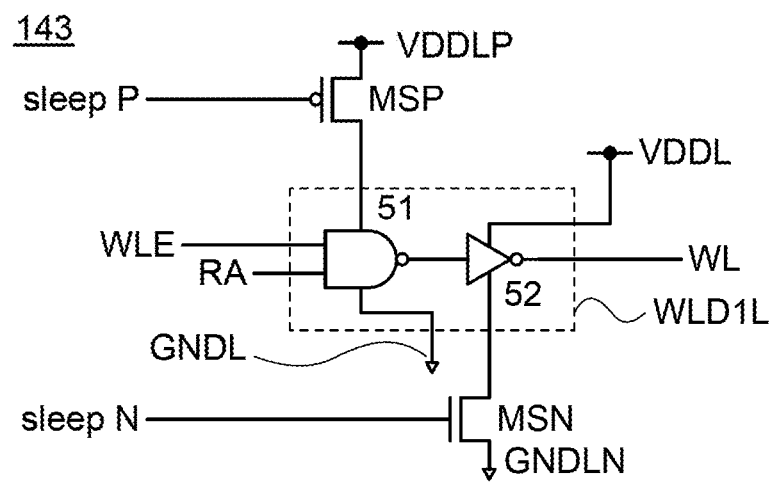
Figure 18B:
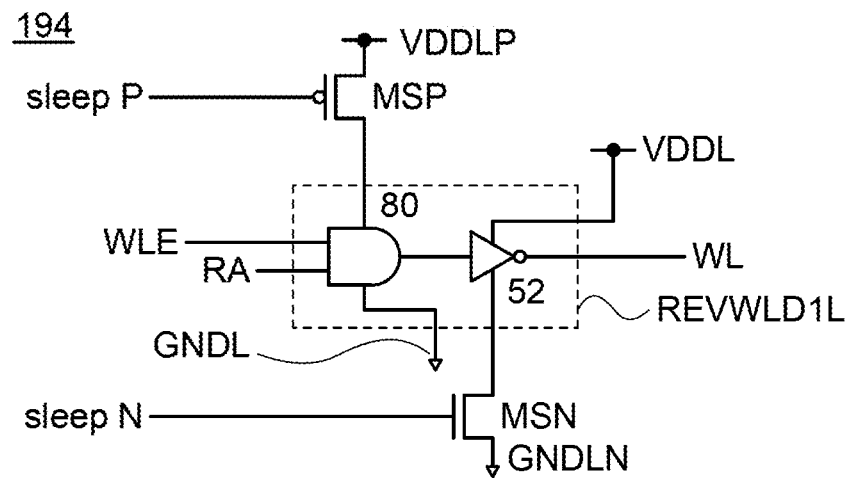
Figure 28A:
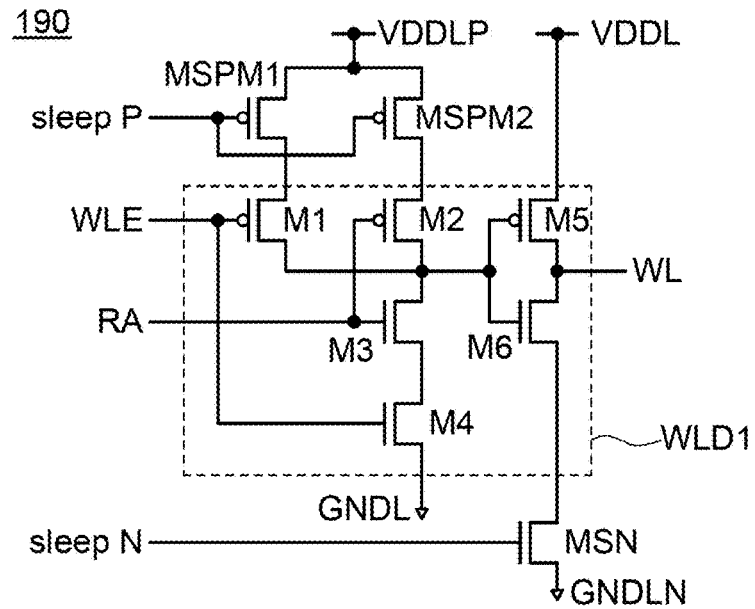
FIGS. 28A to 28C are circuit diagrams each showing an example of a semiconductor device of one embodiment of the present invention.

The number of sleep transistors may be increased in the word line driver circuit 142 in FIG. 17A and the word line driver circuit 143 in FIG. 17B. For example, as in a word line driver circuit 190 shown in FIG. 28A, a transistor MSPM1 and a transistor MSPM2 may be connected in series to the transistor M1 and the transistor M2, respectively. Gates of the transistors MSPM1 and MSPM2 are connected to the wiring sleepP. This allows the word line driver circuit 190 to be driven while the transistors MSPM1 and MSPM2 are turned on or off in synchronization with each other.

Figure 28B:
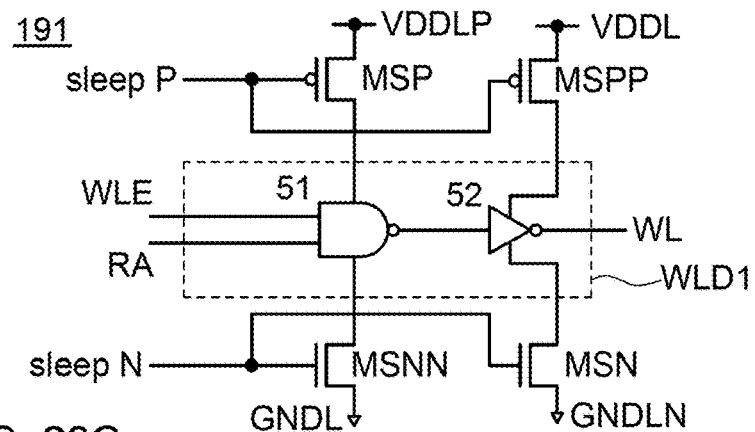

Alternatively, as in a word line driver circuit 191 shown in FIG. 28B, a transistor MSPP may be provided between the inverter circuit 52 and the wiring VDDL, and a transistor MSNN may be provided between the NAND circuit 51 and the wiring GNDL. Gates of the transistors MSP and MSPP are connected to the wiring sleepP and gates of the transistors MSN and MSNN are connected to the wiring sleepN. This allows the word line driver circuit 191 to be driven while the transistors MSP and MSPP are turned on or off in synchronization with each other and the transistors MSN and MSNN are turned on or off in synchronization with each other.

Figure 28C:
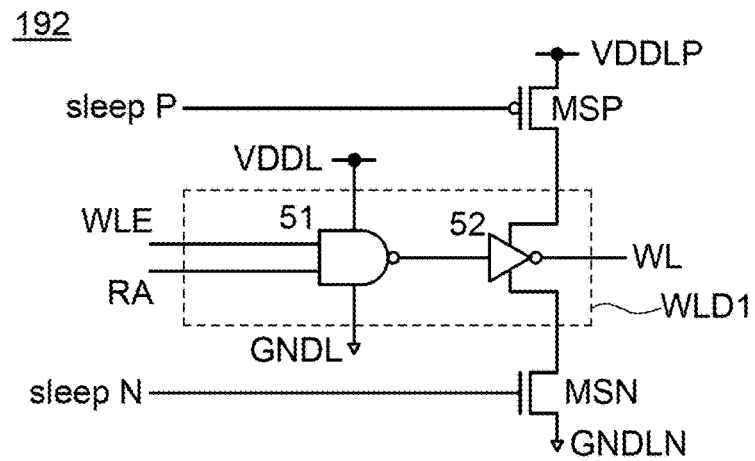

Further alternatively, as in a word line driver circuit 192 shown in FIG. 28C, the NAND circuit may be electrically connected to the wirings VDDL and GNDL without transistors therebetween, the transistor MSP may be provided between the inverter circuit 52 and the wiring VDDLP, and the transistor MSN may be provided between the inverter circuit 52 and the wiring GNDLN. The gate of the transistor MSP is connected to the wiring sleepP and the gate of the transistor MSN is connected to the wiring sleepN. That is, the word line driver circuit 192 can be driven by the control of power supply to the inverter circuit 52.

A transistor with a low off current (or a low leakage current) is preferably used as the transistors M1[i] to M6[i] described in this embodiment, and particularly as the transistors MSP-j and MSN-j (or the transistors MSP and MSN) serving as sleep transistors. For example, a transistor including an oxide semiconductor in a channel formation region, which will be described later, is preferably used. Alternatively, a mechanical switch, a MEMS element, or the like may be used as long as its on/off state can be controlled.

This embodiment can be combined with any of the other embodiments in this specification as appropriate.

Embodiment 4

Figure 29:
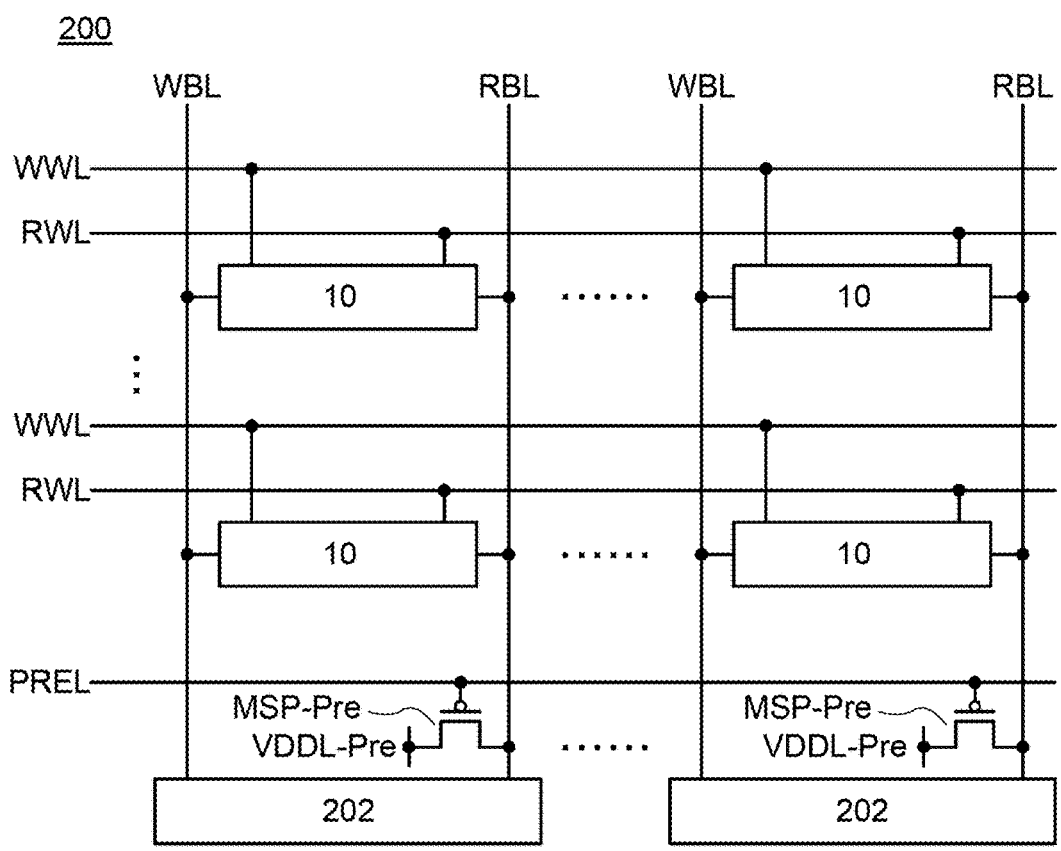
FIG. 29 is a circuit diagram showing an example of a semiconductor device of one embodiment of the present invention.

Described next are structures and operations of a circuit of one embodiment of the present invention.
<Structure of Semiconductor Device>
FIG. 29 shows an example of a bit line precharge circuit of one embodiment of the present invention. Note that FIG. 29 also shows a structure of a memory cell array.

A bit line precharge circuit 200 in FIG. 29 includes a plurality of memory cells 10, a plurality of read and write circuits 202, a plurality of write bit lines WBL, a plurality of read bit lines RBL, a plurality of write word lines WWL, a plurality of read word lines RWL, a precharge wiring PREL, a plurality of wirings VDDL-Pre, and a plurality of transistors MSP-Pre.

Figure 33A:
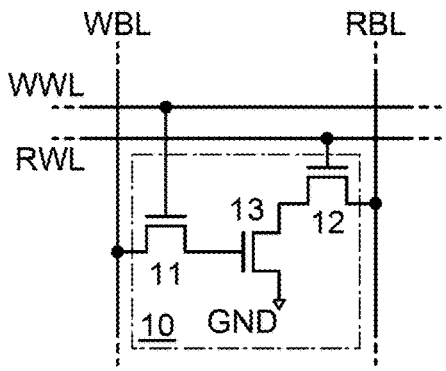
FIGS. 33A to 33F are circuit diagrams each showing an example of a memory cell of one embodiment of the present invention.

A circuit structure of the memory cell 10 is shown in FIG. 33A (described in detail in Embodiment 5). The memory cells 10 are each electrically connected to the write bit line WBL, the read bit line RBL, the write word line WWL, and the read word line RWL. The read and write circuits 202 are each electrically connected to the write bit line WBL and the read bit line RBL. A gate of each of the transistors MSP-Pre is electrically connected to the precharge wiring PREL. One of a source and a drain of the transistor MSP-Pre is electrically connected to the read bit line RBL, and the other of the source and the drain of the transistor MSP-Pre is electrically connected to the wiring VDDL-Pre.

Note that the wirings VDDL-Pre are each connected to a high potential power source (not shown) and supplied with a power source voltage VDD.

The memory cells 10 are provided in a matrix of m rows and n columns (m and n are an integer of 1 or more and may be equal to or different from each other). Hence, the number of the write word lines WWL and the number of the read word lines RWL are each equal to the number of rows of the memory cells 10, i.e., m, and the number of the write bit lines WBL and the number of the read bit lines RBL are each equal to the number of columns of the memory cells 10, i.e., n. The number of the read and write circuits 202 is equal to the number of columns of the memory cells 10, i.e., n, and the number of the transistors MSP-Pre is equal to the number of columns of the memory cells 10, i.e., n.

When a read operation is performed, the read bit lines RBL need to be precharged to the power source voltage VDD (hereinafter, such a state is also referred to as a stand-by mode). In the stand-by mode, data can be read from the memory cells 10. However, when the stand-by mode is maintained, leakage current flows from the read bit lines RBL with the power source voltage VDD to ground potential points in the memory cells 10, causing a large stand-by power.

Thus, when there is no memory access, a high-level potential is applied to the precharge wiring PREL, so that the gate of the transistor MSP-Pre has a high-level potential. As a result, the transistor MSP-Pre is turned off and the precharge of the read bit line RBL is stopped. When the read bit line RBL is brought into a floating state in this manner, the generation of the stand-by power is reduced, leading to lower power consumption.

Figure 30:
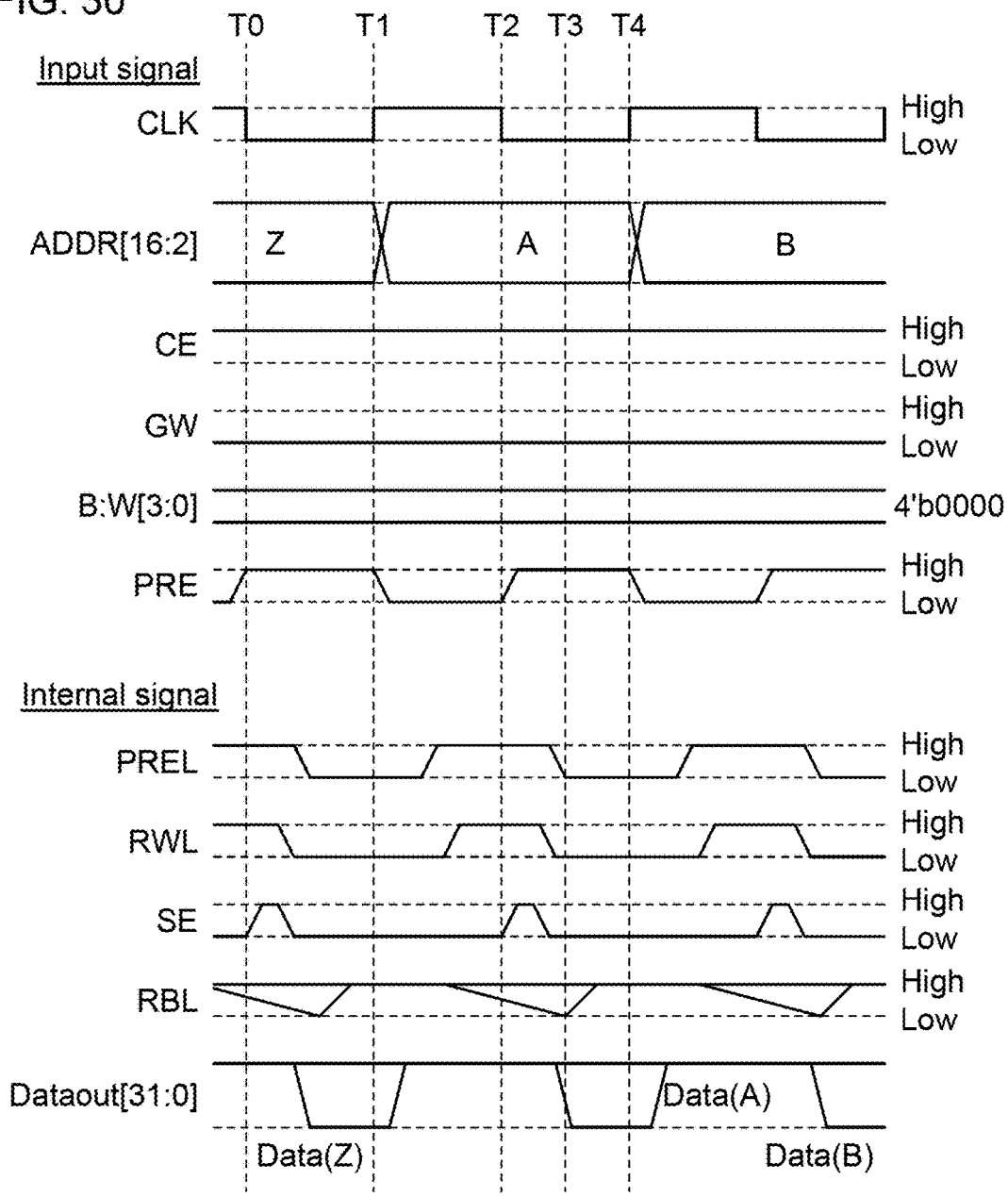
FIG. 30 is a timing chart showing an operation example of the semiconductor device shown in FIG. 29.
Figure 31:
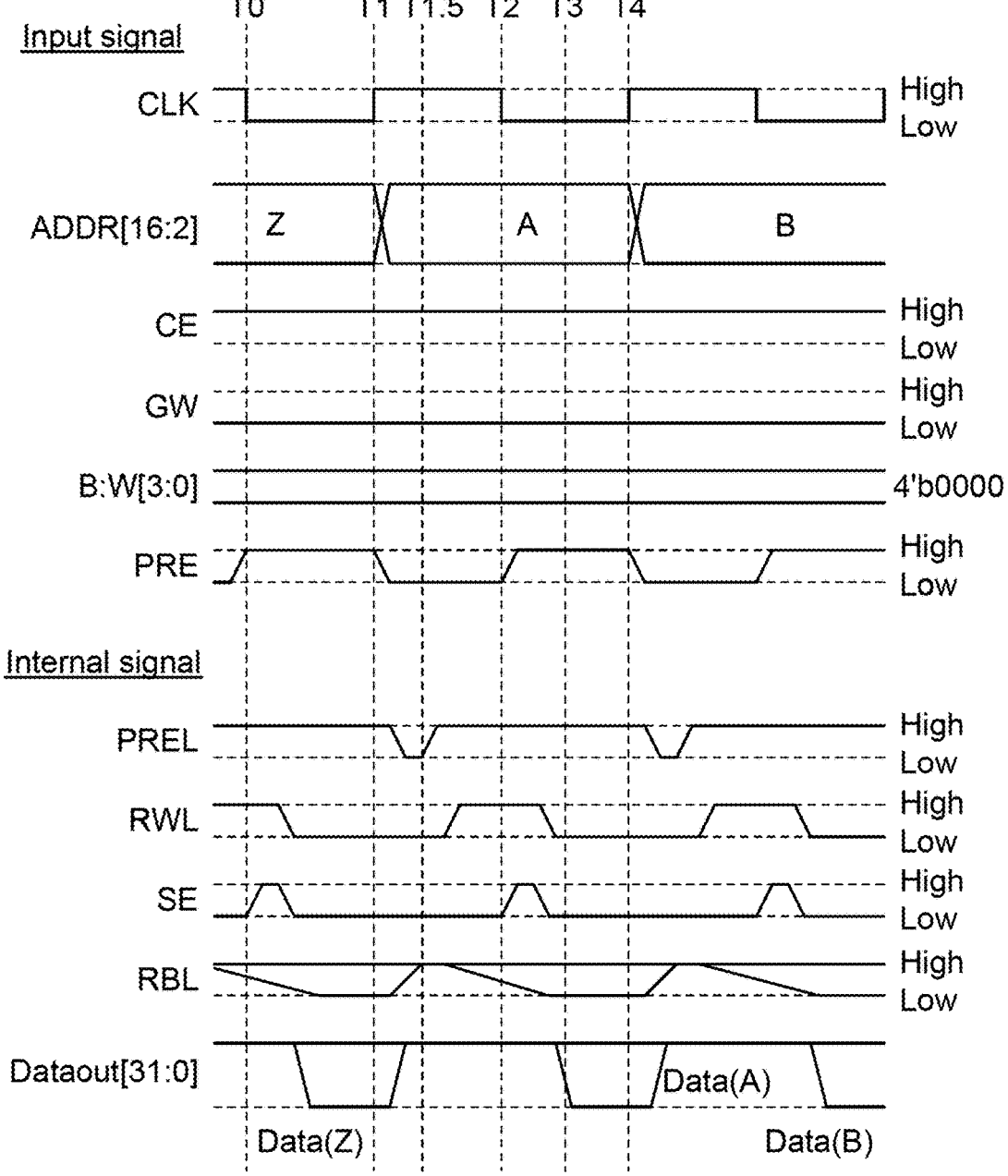
FIG. 31 is a timing chart showing an operation example of the semiconductor device shown in FIG. 29.

FIGS. 30 and 31 are timing charts showing operations of the bit line precharge circuit 200 in FIG. 29.

The timing chart of FIG. 30 shows a read operation in which the memory cell described later in FIG. 33A is used and the read bit line is precharged in a normal mode. The timing chart of FIG. 31 shows a read operation in which the memory cell described later in FIG. 33A is used and the read bit line is in a floating state in a normal mode and then precharged immediately before data reading.

Description is made of input signals of FIGS. 30 and 31. CLK is a clock signal; ADDR[16:2], an address data signal (128 kilobytes); CE, a chip enable signal; GW, a global write enable signal; BW[3:0], a byte write signal; and PRE, a signal for controlling a precharge circuit.

The CLK is supplied to a variety of registers and the like (not shown). For example, when an address register, a global write enable register, a byte write enable register, and a chip enable register receive the CLK, they output the ADDR[16:2], the GW, the BW[3:0], and the CE, respectively.

The ADDR[16:2] is an address data signal storing the location of a memory cell from which data is to be read. For example, from Time T0 to Time T1 in FIG. 30, the ADDR[16:2] stores address data indicating the location of a memory cell Z in the memory cell array. From Time T1 to Time T4, for example, the ADDR[16:2] stores address data indicating the location of a memory cell A in the memory cell array. After Time T4, for example, the ADDR[16:2] stores address data indicating the location of a memory cell B in the memory cell array.

Since the timing charts of FIGS. 30 and 31 show the read operation, the CE always has a high-level potential (denoted by High in FIGS. 30 and 31), and the GW always has a low-level potential (denoted by Low in FIGS. 30 and 31).

The BW[3:0] is a four-bit signal for selecting whether data is written to or read from a memory cell. Since data is read from a memory cell here, the BW[3:0] is always 0000 (4'b0000 denotes a four-bit binary value 0000).

The signal CE output from the chip enable register and a signal output from a clock delay circuit receiving the CLK are input to a NAND circuit, and the PRE is output from the NAND circuit.

Next, internal signals in FIGS. 30 and 31 are described. The timing charts with the internal signals show changes in potentials of the precharge wiring PREL, the read word line RWL, and the read bit line RBL. SE is a signal input to a sense amplifier, and Dataout[31:0] is a 32-bit signal indicating data read from a memory cell.

The precharge wiring PREL is used to apply a potential to the transistor MSP-Pre to control its on/off state. The read word line RWL is used to apply a potential to a transistor in a memory cell from which data is to be read. The read bit line RBL is used to transmit the data read from the memory cell.

The SE is a signal input to a sense amplifier. The sense amplifier is configured to amplify data read from the read bit line RBL when the SE has a high-level potential (denoted by High in FIGS. 30 and 31).

Description is made of the operation of the timing chart in FIG. 30; here, data is read from a memory cell A in the memory cell array. Note that in FIG. 30, the read bit line RBL is precharged in a normal mode.

At Time T0, the PRE with a high-level potential is input to the precharge circuit. Then, from Time T0 to Time T1, a low-level potential is applied to the precharge wiring PREL from the precharge circuit. As a result, the transistor MSP-Pre is turned on, so that the read bit line RBL starts to be precharged and is increased in potential.

Note that before the precharge of the read bit line RBL starts, a transistor 12 (see FIG. 33A) in the memory cell connected to the read bit line RBL needs to be turned off. Therefore, a low-level potential needs to be applied to the read word line RWL before a low-level potential is applied to the precharge wiring PREL, whereby the transistor 12 in the memory cell 10 is turned off.

At Time T1, the ADDR[16:2] storing address data of the memory cell A is input to a row decoder and a column decoder. This selects a read word line and a read bit line in the corresponding row and column at the intersection of which the memory cell A is arranged.

Also at Time T1, the PRE with a low-level potential is input to the precharge circuit. Then, from Time T1 to Time T2, a high-level potential is applied to the precharge wiring PREL from the precharge circuit. As a result, the transistor MSP-Pre is turned off, so that the precharge of the read bit line RBL is completed.

After the precharge, that is, after the high-level potential is applied to the precharge wiring PREL, a high-level potential is applied to the read word line RWL in the row connected to the memory cell A. As a result, the transistor 12 in the memory cell A can be turned on, whereby the potential of the read bit line RBL is lowered. The lowered potential of the read bit line RBL is read by the read and write circuit 202; accordingly, the data stored in the memory cell A can be read.

When the potential of the read bit line RBL is decreasing, i.e., from Time T2 to Time T3, the signal SE is set to High. Accordingly, the signal read from the memory cell A is amplified by the sense amplifier in the read and write circuit 202.

From Time T3 to Time T4, Data(A) stored in the memory cell A is output as the signal DataOut[31:0].

In the case where data is to be read from the memory cell B, as in the case where data is read from the memory cell A, the signal PRE is input at Time T2 to precharge the read bit line RBL, and after Time T4, the ADDR[16:2] storing address data of the memory cell B is input to the row decoder and the column decoder.

The timing chart in FIG. 31 is described; here, data is read from the memory cell A in the memory cell array. Note that in FIG. 31, the read bit line RBL is in a floating state in a normal mode.

At Time T0, the PRE with a high-level potential is input to the precharge circuit. Then, at Time T1, a low-level potential is applied to the precharge wiring PREL from the precharge circuit. As a result, the transistor MSP-Pre is turned on, so that the read bit line RBL starts to be precharged and is increased in potential.

Note that before the precharge of the read bit line RBL starts, the transistor 12 in the memory cell connected to the read bit line RBL needs to be turned off. Therefore, a low-level potential needs to be applied to the read word line RWL before a low-level potential is applied to the precharge wiring PREL, whereby the transistor 12 in the memory cell 10 is turned off. Note that in FIG. 31, the precharge is performed after Time T1.5; thus, the transistor 12 is turned off before Time T1.

At Time T1, the PRE with a low-level potential is input to the precharge circuit. Then, at Time T1.5, a low-level potential is applied to the precharge wiring PREL from the precharge circuit. As a result, the transistor MSP-Pre is turned off, so that the precharge of the read bit line RBL is completed.

At Time T1, the ADDR[16:2] storing address data of the memory cell A is input to a row decoder and a column decoder. This selects a read word line and a read bit line in the corresponding row and column at the intersection of which the memory cell A is arranged.

After the precharge, that is, after the high-level potential is applied to the precharge wiring PREL, a high-level potential is applied to the read word line RWL in the row connected to the memory cell A. As a result, the transistor 12 in the memory cell A can be turned on, whereby the potential of the read bit line RBL is lowered. The lowered potential of the read bit line RBL is read by the read and write circuit 202; accordingly, the data stored in the memory cell A can be read.

While the potential of the read bit line RBL is lowered, i.e., from Time T2 to Time T3, the signal SE is set to High. Accordingly, the signal read from the memory cell A is amplified by the sense amplifier in the read and write circuit 202.

From Time T3 to Time T4, Data(A) stored in the memory cell A is output as the signal DataOut[31:0].

In the case where data is to be read from the memory cell B, as in the case where data is read from the memory cell A, the signal PRE is input at Time T2 to precharge the read bit line RBL, and after Time T4, the ADDR[16:2] storing address data of the memory cell B is input to the row decoder and the column decoder. Accordingly, Data(B) stored in the memory cell B is output as the signal DataOut[31:01]. Also in the case where data is read from the memory cell Z, as in the case where data is read from the memory cell A, Data(Z) stored in the memory cell Z is output as the signal DataOut [31:01].

Figure 32:
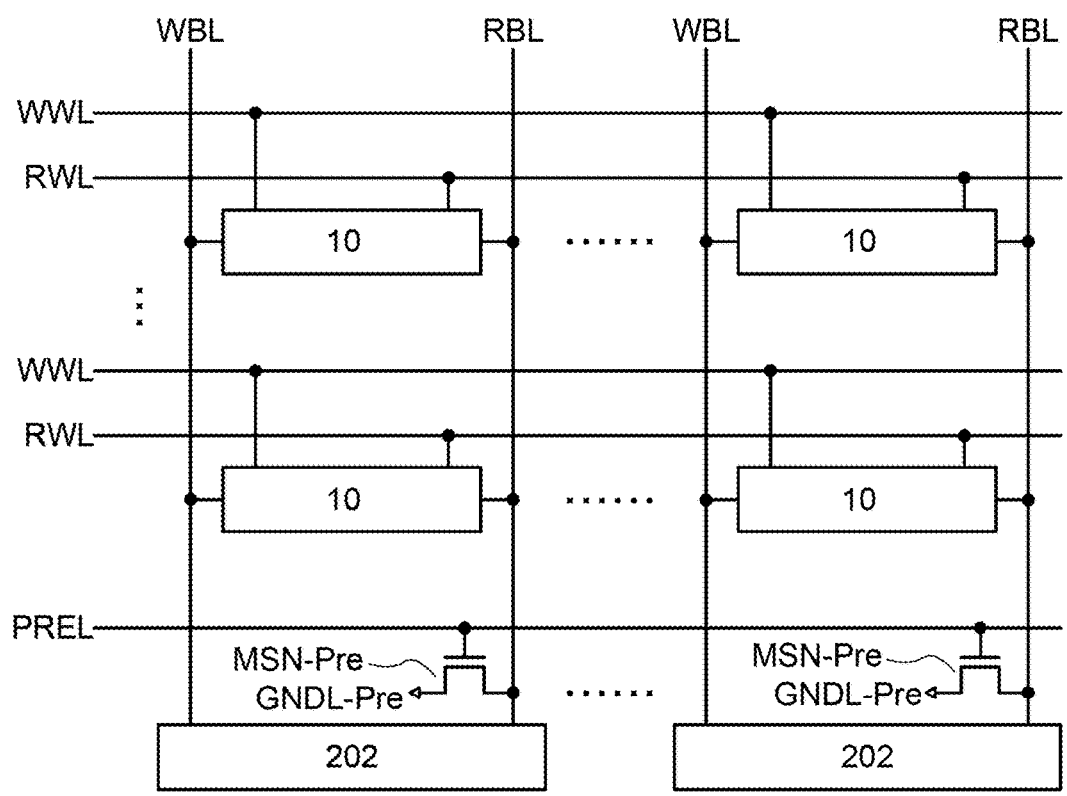
FIG. 32 is a circuit diagram showing an example of a semiconductor device of one embodiment of the present invention.

FIG. 32 shows another example of the bit line precharge circuit, which is different from that in FIG. 29. Note that FIG. 32 also shows a structure of a memory cell array.

A bit line precharge circuit 210 in FIG. 32 includes the plurality of memory cells 10, the plurality of read and write circuits 202, the plurality of write bit lines WBL, the plurality of read bit lines RBL, the plurality of write word lines WWL, the plurality of read word lines RWL, the precharge wiring PREL, the plurality of wirings GNDL-Pre, and the plurality of transistors MSN-Pre.

The memory cells 10 are each electrically connected to the write bit line WBL, the read bit line RBL, the write word line WWL, and the read word line RWL. The read and write circuits 202 are each electrically connected to the write bit line WBL and the read bit line RBL. The gate of each of the transistors MSN-Pre is electrically connected to the precharge wiring PREL. One of the source and the drain of the transistor MSN-Pre is electrically connected to the read bit line RBL, and the other of the source and the drain of the transistor MSN-Pre is electrically connected to the wiring GNDL-Pre.

Note that the wirings GNDL-Pre are each connected to a low-level power source (not shown) and supplied with a fixed potential GND.

The memory cells 10 are provided in a matrix of m rows and n columns (m and n are an integer of 1 or more and may be equal to or different from each other). Hence, the number of the write word lines WWL and the number of the read word lines RWL are each equal to the number of rows of the memory cells 10, i.e., m, and the number of the write bit lines WBL and the number of the read bit lines RBL are each equal to the number of columns of the memory cells 10, i.e., n. The number of the read and write circuits 202 is equal to the number of columns of the memory cells 10, i.e., n, and the number of the transistors MSN-Pre is equal to the number of columns of the memory cells 10, i.e., n.

When a read operation is performed, the read bit lines RBL need to be precharged to the potential GND (hereinafter, such a state is also referred to as a stand-by mode). In the stand-by mode, data can be read from the memory cells 10. However, when the stand-by mode is maintained, leakage current flows from the read bit lines RBL with the potential GND to ground potential points in the memory cells 10, causing a large power in the stand-by mode (stand-by power).

Thus, when there is no memory access, a low-level potential is applied to the precharge wiring PREL, so that the gate of the transistor MSN-Pre has a low-level potential. As a result, the transistor MSN-Pre is turned off and the precharge of the read bit line RBL is stopped. When the read bit line RBL is in such a floating state, the generation of the stand-by power is reduced, leading to lower power consumption.

A transistor with a low off current is preferably used as the transistors MSP-Pre and MSN-Pre, which are provided to reduce leakage current. A transistor including an oxide semiconductor in a channel formation region, which will be described later, is more preferably used. Alternatively, a mechanical switch, a MEMS element, or the like may be used as long as its on/off state can be controlled.

This embodiment can be combined with any of the other embodiments in this specification as appropriate.

Embodiment 5

Described in this embodiment is a memory cell of one embodiment of the disclosed invention.

Structure Example 1 of Memory Cell

FIG. 33A shows an example of a memory cell. The memory cell 10 includes transistors 11 to 13. The memory cell 10 is electrically connected to the write word line WWL, the read word line RWL, the write bit line WBL, and the read bit line RBL.

One of a source and a drain of the transistor 11 is electrically connected to the write bit line WBL, the other of the source and the drain of the transistor 11 is electrically connected to a gate of the transistor 13, and a gate of the transistor 11 is electrically connected to the write word line WWL. One of a source and a drain of the transistor 12 is electrically connected to the read bit line RBL, the other of the source and the drain of the transistor 12 is electrically connected to one of a source and a drain of the transistor 13, and a gate of the transistor 12 is electrically connected to the read word line RWL. The other of the source and the drain of the transistor 13 is electrically connected to a wiring supplied with the low-level power source voltage GND.

Data can be written to the memory cell 10 in FIG. 33A when a potential is applied between the other of the source and the drain of the transistor 11 and the gate of the transistor 13. Therefore, a transistor with a low off current (a low leakage current) is preferably used as the transistor 11. For example, an OS transistor described later is more preferably used.

Structure Example 2 of Memory Cell

Figure 33B:
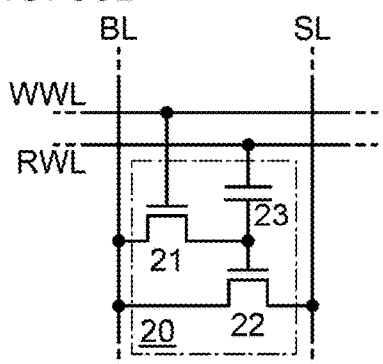

FIG. 33B shows an example of a memory cell. A memory cell 20 includes a transistor 21, a transistor 22, and a capacitor 23. The memory cell 20 is electrically connected to the write word line WWL, the read word line RWL, a bit line BL, and a source line SL.

One of a source and a drain of the transistor 21 is electrically connected to the bit line BL, the other of the source and the drain of the transistor 21 is electrically connected to a gate of the transistor 22 and one electrode of the capacitor 23. A gate of the transistor 21 is electrically connected to the write word line WWL. One of a source and a drain of the transistor 22 is electrically connected to the bit line BL, and the other of the source and the drain of the transistor 22 is electrically connected to the source line SL. The other electrode of the capacitor 23 is electrically connected to the read word line RWL.

Data can be written to the memory cell 20 in FIG. 33B when a potential is applied between the other of the source and the drain of the transistor 21 and the gate of the transistor 22 (between the other of the source and the drain of the transistor 21 and the one electrode of the capacitor 23). Therefore, a transistor with a low off current (a low leakage current) is preferably used as the transistor 21. For example, an OS transistor described later is more preferably used.

Figure 34A:
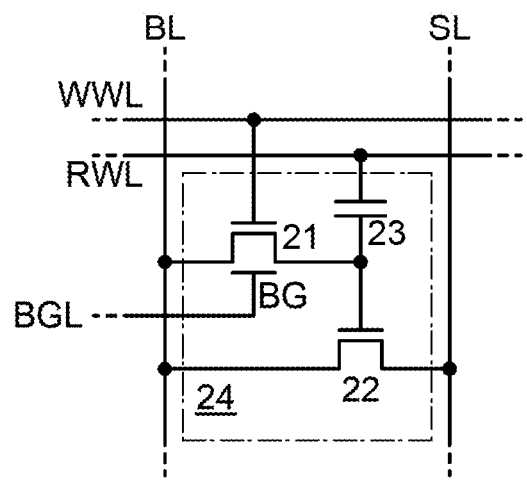
FIGS. 34A and 34B are circuit diagrams each showing an example of a memory cell of one embodiment of the present invention.
Figure 34B:
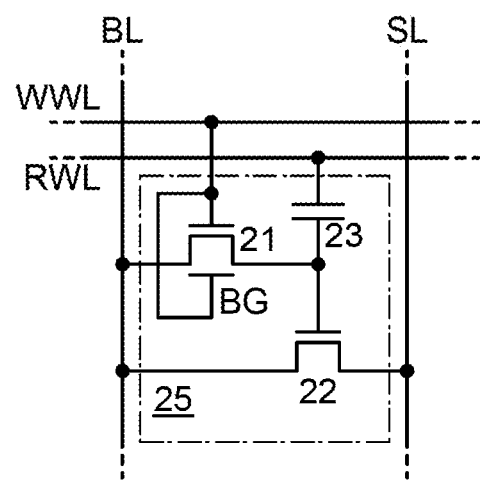

FIGS. 34A and 34B respectively show a memory cell 24 and a memory cell 25 in each of which a back gate is added to the transistor 21 in the memory cell 20. In the memory cell 24, a back gate BG and a wiring BGL are provided for the transistor 21, and a constant potential is applied to the back gate BG from the wiring BGL. The threshold voltage of the transistor 21 can be controlled with the constant potential from the wiring BGL. In the memory cell 25, the back gate BG is provided for the transistor 21 and electrically connected to the front gate of the transistor 21 (or the write word line). This structure allows the same potential to be applied to the front gate and the back gate BG, increasing the amount of current flowing through the transistor 21 that is on.

Note that the back gate can be provided not only in the memory cells 24 and 25 but also in other memory cells. For example, the back gate can be provided in the memory cell described in the structure example 1 of memory cell in this embodiment, and also in other memory cells described later in the structure examples 3 to of memory cell.

Structure Example 3 of Memory Cell

Figure 33C:
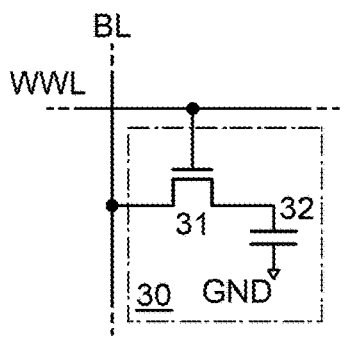

FIG. 33C shows an example of a memory cell. A memory cell 30 is a dynamic random access memory (DRAM) and includes a transistor 31 and a capacitor 32. The memory cell 30 is electrically connected to the write word line WWL and the bit line BL.

One of a source and a drain of the transistor 31 is electrically connected to the bit line BL, the other of the source and the drain of the transistor 31 is electrically connected to one electrode of the capacitor 32, and a gate of the transistor 31 is electrically connected to the write word line WWL. The other electrode of the capacitor 32 is electrically connected to a wiring supplied with the low-level power source voltage GND.

Data can be written to the memory cell 30 in FIG. 33C when a potential is applied between the other of the source and the drain of the transistor 31 and the one electrode of the capacitor 32. Here, by using a transistor with a low off current (a low leakage current) such as an OS transistor as the transistor 31, data can be retained in the memory cell 30 in some cases even when no power is supplied.

Structure Example 4 of Memory Cell

Figure 33D:
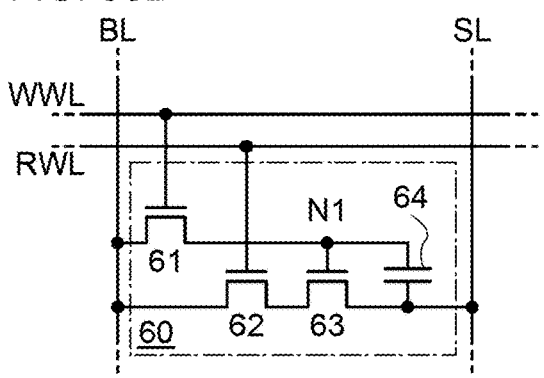

FIG. 33D shows an example of a memory cell. A memory cell 60 includes transistors 61 to 63 and a capacitor 64. The memory cell 60 is electrically connected to the write word line WWL, the read word line RWL, the bit line BL, and the source line SL.

One of a source and a drain of the transistor 61 is electrically connected to the bit line BL, the other of the source and the drain of the transistor 61 is electrically connected to a gate of the transistor 63 and one electrode of the capacitor 64, and a gate of the transistor 61 is electrically connected to the write word line WWL. One of a source and a drain of the transistor 62 is electrically connected to the bit line BL, the other of the source and the drain of the transistor 62 is electrically connected to one of a source and a drain of the transistor 63, and a gate of the transistor 62 is electrically connected to the read word line RWL. The other of the source and the drain of the transistor 63 is electrically connected to the other electrode of the capacitor 64 and the source line SL.

Data can be written to the memory cell 60 in FIG. 33D when a potential is applied to a node N1. Here, an OS transistor is preferably used as the transistor 61. Since the OS transistor has a low off current (a low leakage current), a potential can be kept at the node N1 for a long time. In other words, the use of the OS transistor allows the memory cell 60 to retain stored data for a long time in some cases.

Structure Example 5 of Memory Cell

Figure 33E:
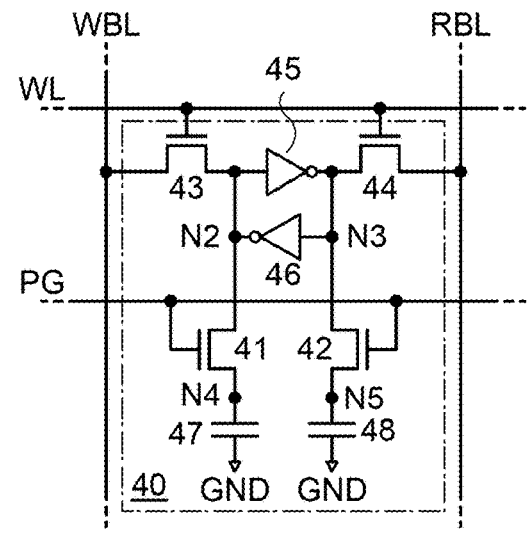

FIG. 33E shows an example of a memory cell. A memory cell 40 is a static random access memory (SRAM) and includes transistors 41 to 44, an inverter 45, an inverter 46, a capacitor 47, and a capacitor 48. The memory cell 40 is electrically connected to a wiring WL (hereinafter referred to as a word line WL), the write bit line WBL, the read bit line RBL, and a power gate line PG.

One of a source and a drain of the transistor 43 is electrically connected to the write bit line WBL, the other of the source and the drain of the transistor 43 is electrically connected to one of a source and a drain of the transistor 41, an input terminal of the inverter 45, and an output terminal of the inverter 46, and a gate of the transistor 43 is electrically connected to the word line WL. One of a source and a drain of the transistor 44 is electrically connected to the read bit line RBL, the other of the source and the drain of the transistor 44 is electrically connected to one of a source and a drain of the transistor 42, an output terminal of the inverter 45, and an input terminal of the inverter 46, and a gate of the transistor 44 is electrically connected to the word line WL. The other of the source and the drain of the transistor 41 is electrically connected to, through the capacitor 47, a wiring supplied with the low-level power source voltage GND, and a gate of the transistor 41 is electrically connected to the power gate line PG. The other of the source and the drain of the transistor 42 is electrically connected to, through the capacitor 48, a wiring supplied with the low-level power source voltage GND, and a gate of the transistor 42 is electrically connected to the power gate line PG.

Data can be written to the memory cell 40 in FIG. 33E when a potential is applied to the node N2 and the node N3. Data can also be written to the memory cell 40 when a potential is applied to the node N4 and the node N5. Here, an OS transistor is preferably used as the transistors 41 and 42. Since the OS transistor has a low off current (a low leakage current), a potential can be kept at the nodes N4 and N5 for a long time. In other words, the use of the OS transistor allows the memory cell 40 to retain stored data for a long time in some cases.

Figure 33F:
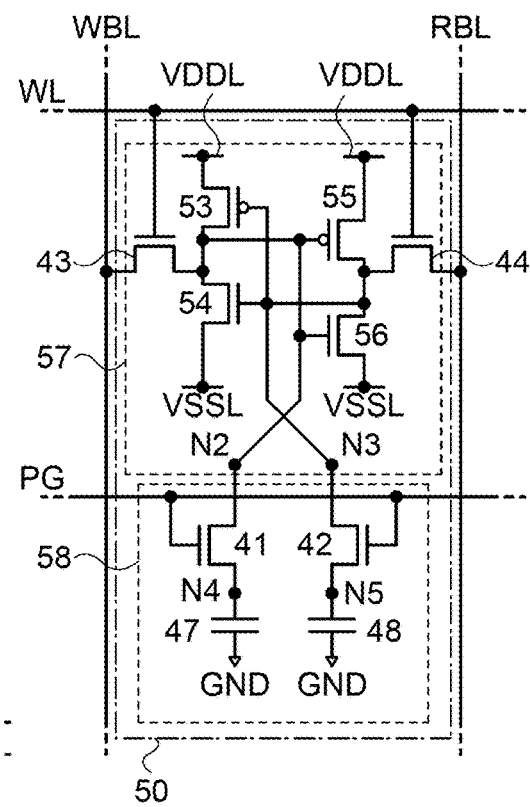

When the inverters in the memory cell 40 in FIG. 33E are replaced with transistors, a memory cell 50 shown in FIG. 33F can be obtained. Specifically, the inverter 45 is replaced with a p-channel transistor 53 and an n-channel transistor 54, and the inverter 46 is replaced with a p-channel transistor 55 and an n-channel transistor 56.

One of a source and a drain of the transistor 53 is electrically connected to one of a source and a drain of the transistor 54, the other of the source and the drain of the transistor 53 is electrically connected to the wiring VDDL supplying a high-level potential, and the other of the source and the drain of the transistor 54 is electrically connected to a wiring VSSL supplying a low-level potential. One of a source and a drain of the transistor 55 is electrically connected to one of a source and a drain of the transistor 56, the other of the source and the drain of the transistor 55 is electrically connected to the wiring VDDL supplying a high-level potential, and the other of the source and the drain of the transistor 56 is electrically connected to the wiring VSSL supplying a low-level potential.

A circuit 57 in FIG. 33F is equivalent to an SRAM cell. Nodes N4 and N5 in a circuit 58 back up the nodes N2 and N3 in the SRAM cell.

Note that soft error tests on the memory cells 40 and 60 shown in this embodiment will be described later in Example.

This embodiment can be combined with any of the other embodiments in this specification as appropriate.

Embodiment 6

<Structure Example of Memory Device>

Figure 35:
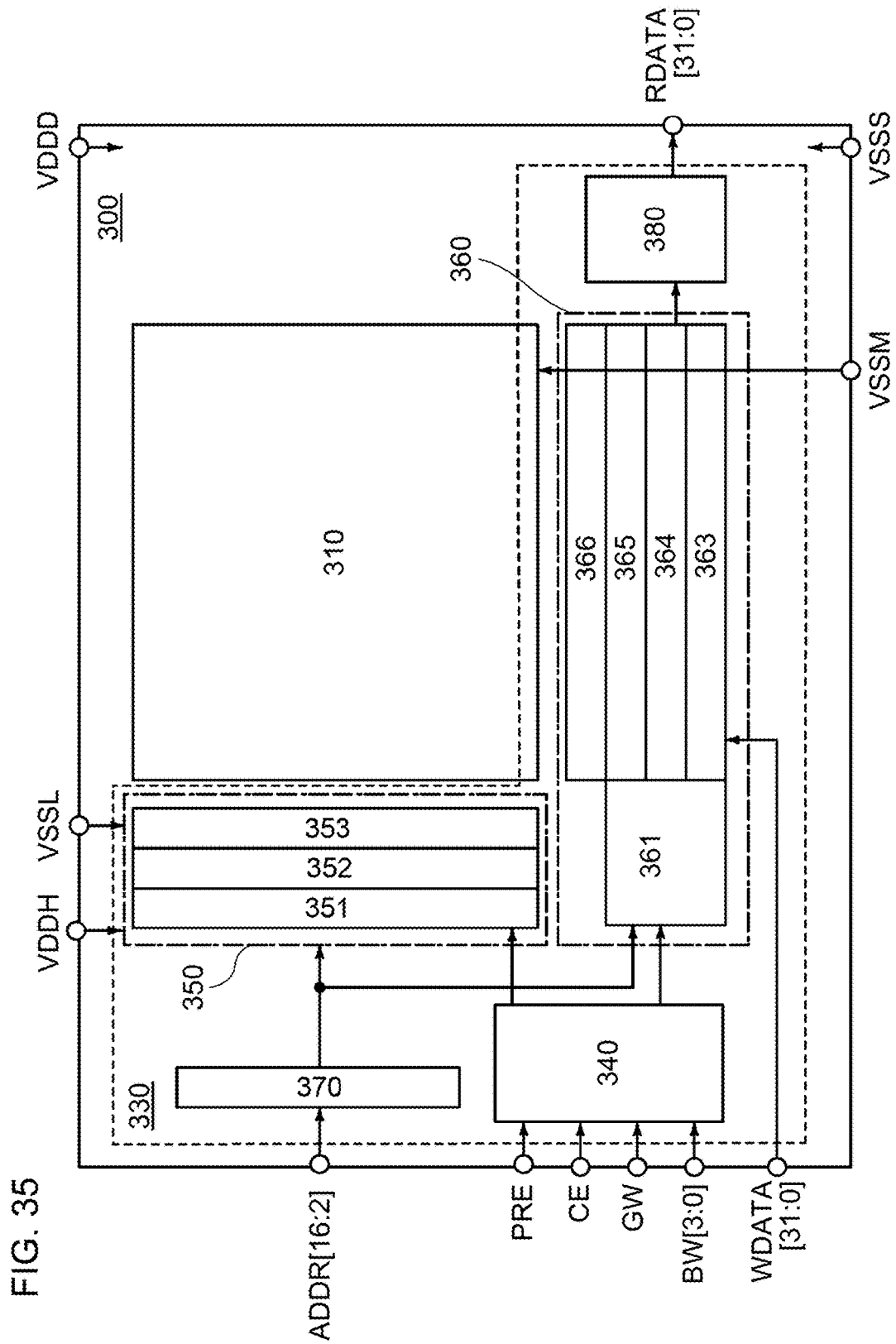
FIG. 35 is a block diagram showing an example of a memory device of one embodiment of the present invention.

Described in this embodiment is a memory device of one embodiment of the disclosed invention. FIG. 35 is a block diagram showing a structure example of a memory device. A memory device 300 shown in FIG. 35 can be used as a random access memory and includes a memory cell array 310 and a peripheral circuit 330. The memory cell array 310 and the peripheral circuit 330 can be integrated on one chip.

FIG. 35 shows an example of processing 32-bit data (WDATA and RDATA). The WDATA is data to be written and the RDATA is data to be read. ADDR is 16-bit address data whose two low-order bits of the address space are used for an offset address.

VDDD, VSSS, VDDH, VSSL, and VSSM are fixed voltages input from the outside. The VDDD is a high-level power source voltage, and the VSSS is a low-level power source voltage. The VDDH is a power source voltage higher than the VDDD, and the VSSL is a power source voltage lower than the VSSS.

<<Memory Cell Array>>

Figure 36:
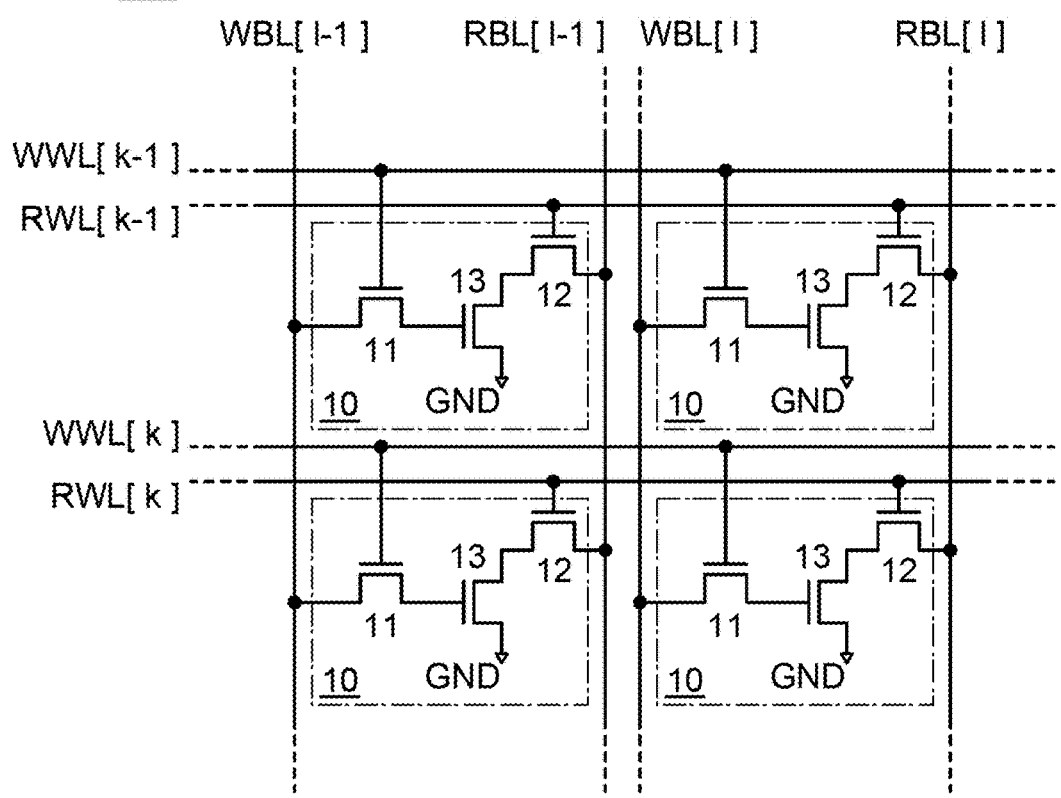
FIG. 36 is a circuit diagram showing a memory cell array of one embodiment of the present invention.

FIG. 36 is a circuit diagram showing a structure example of the memory cell array 310. The memory cell array 310 includes a plurality of memory cells 10, a plurality of write word lines WWL, a plurality of read word lines RWL, a plurality of write bit lines WBL, and a plurality of read bit lines RBL shown in FIG. 33A. The plurality of memory cells 10 are arranged in a two-dimensional array. The plurality of lines WWL, RWL, WBL, and RBL are provided in accordance with the arrangement of the plurality of memory cells 10. The plurality of lines WWL and RWL are provided in rows and the plurality of lines WBL and RBL are provided in columns. Each of the memory cells is electrically connected to the lines WWL and RWL in the corresponding row and the lines WBL and RBL in the corresponding column. FIG. 36 illustrates four memory cells 10 arranged in two rows and two columns. Note that k and l in FIG. 36 each represent an integer of 2 or more.

The fixed voltage VSSM is input from the outside to each memory cell 10 in the memory cell array 310 as the fixed potential GND.

<<Peripheral Circuit>>

The peripheral circuit 330 includes a control logic 340, a row driver 350, a column driver 360, a predecoder 370, and an output driver 380. The peripheral circuit 330 is configured to drive the memory cell array 310.

The control logic 340 processes signals input from the outside (e.g., PRE, CE, GW, and BW[3:0]) and generates a control signal for the row driver 350 and the column driver 360. For example, the control logic 340 generates a write enable signal WE, a read enable signal RE, a signal ERR, and the like.

The CE is a chip enable signal, the GW is a global write enable signal, and the PRE is a precharge control signal for reducing stand-by power. The signals processed by the control logic 340 are not limited to these signals; another signal may be input or any of the aforementioned signals is not necessarily input.

The row driver 350 is configured to, for example, drive the write word lines WWL and the read word lines RWL, and select a row (memory cells 10) to be accessed. The row driver 350 includes a row decoder 351, a read word line driver 352, and a write word line driver 353.

The column driver 360 is configured to, for example drive the write bit lines WBL and the read bit lines RBL. The column driver 360 includes a column decoder 361, a write driver 363, an output multiplexer (MUX) 364, a sense amplifier 365, and a precharge circuit 366.

The WDATA[31:0] is input to the write driver 363. The write driver 363 is configured to input a writing voltage corresponding to one-bit data of the WDATA[31:0] to one of the lines WBL. The precharge circuit 366 is configured to precharge the read bit lines RBL. The sense amplifier 365 is configured to amplify the voltages of the read bit lines RBL. The output MUX 364 is configured to select a plurality of output data of the sense amplifier 365 and transferring the selected data to the output driver 380. The output driver 380 processes data input from the output MUX 364 and outputs the RDATA[31:0].

The predecoder 370 is configured to read from the input ADDR[16:2] a subarray, a stage, a row, and a column of a memory cell storing data, and output the data to the row decoder 351 and the column decoder 361.

This embodiment can be combined with any of the other embodiments in this specification as appropriate.

Embodiment 7

Described in this embodiment are transistors of one embodiment of the disclosed invention.

Transistors according to one embodiment of the present invention each preferably include an nc-OS or a CAAC-OS, which are described later.

<Transistor Structure 1>

Figure 38A:
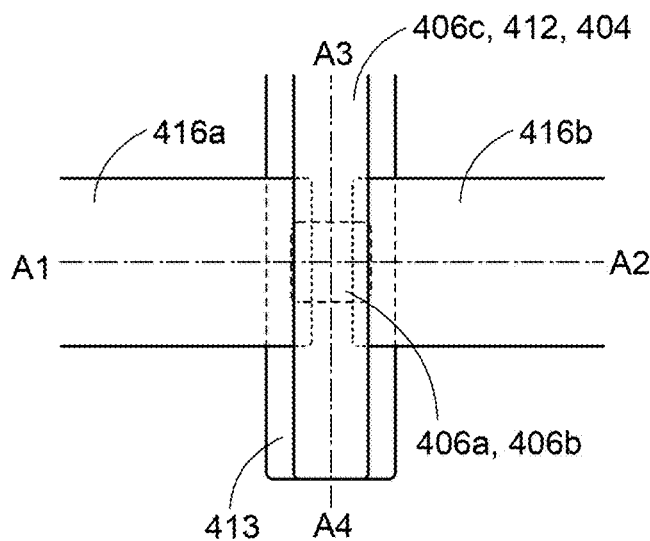
FIGS. 38A and 38B are a top view and a cross-sectional view each showing a structure example of a transistor.
Figure 38B:
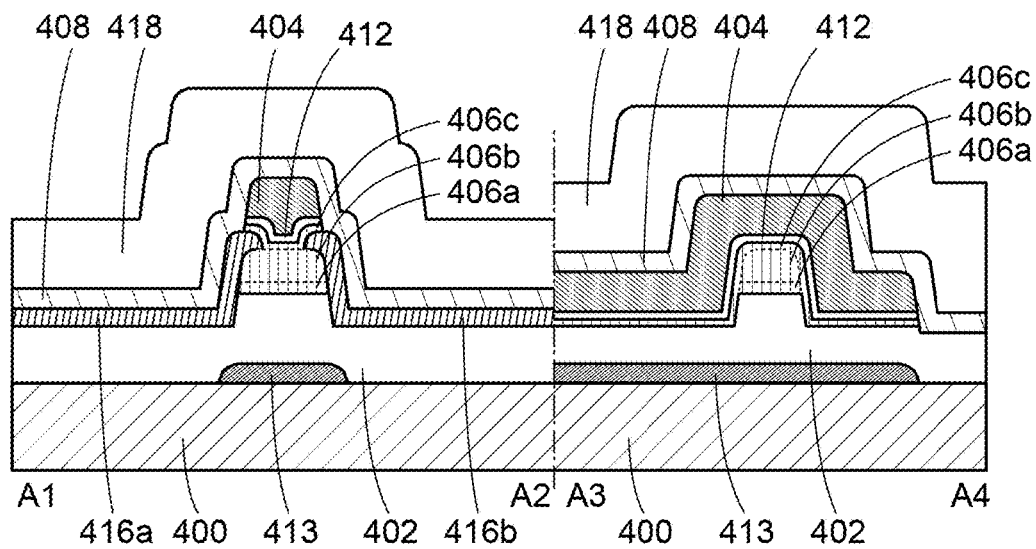

FIGS. 38A and 38B are a top view and a cross-sectional view which illustrate a transistor of one embodiment of the present invention. FIG. 38A is a top view and FIG. 38B is a cross-sectional view taken along dashed-dotted line A1-A2 and dashed-dotted line A3-A4 in FIG. 38A. Note that for simplification of the drawing, some components are not illustrated in the top view in FIG. 38A.

The transistor in FIGS. 38A and 38B includes a conductor 413 over a substrate 400, an insulator 402 having a projection over the substrate 400 and the conductor 413, a semiconductor 406a over the projection of the insulator 402, a semiconductor 406b over the semiconductor 406a, a conductor 416a and a conductor 416b which are in contact with a top surface and a side surface of the semiconductor 406b and which are arranged to be separated from each other, a semiconductor 406c over the semiconductor 406b, the conductor 416a, and the conductor 416b, an insulator 412 over the semiconductor 406c, a conductor 404 over the insulator 412, an insulator 408 over the conductor 416a, the conductor 416b, and the conductor 404, and an insulator 418 over the insulator 408. The conductor 413 is, but not limited to, part of the transistor. Alternatively, for example, the conductor 413 may be a component independent of the transistor.

Note that the semiconductor 406c is in contact with at least a top surface and a side surface of the semiconductor 406b in the cross section taken along line A3-A4. Furthermore, the conductor 404 faces the top surface and the side surface of the semiconductor 406b with the semiconductor 406c and the insulator 412 provided therebetween in the cross section taken along line A3-A4. The conductor 413 faces a bottom surface of the semiconductor 406b with the insulator 402 provided therebetween. The insulator 402 does not necessarily include a projection. The semiconductor 406c, the insulator 408, and/or the insulator 418 is not necessarily provided.

The semiconductor 406b serves as a channel formation region of the transistor. The conductor 404 serves as a first gate electrode (also referred to as a front gate electrode) of the transistor. The conductor 413 serves as a second gate electrode (also referred to as a back gate electrode) of the transistor. The conductor 416a and the conductor 416b serve as a source electrode and a drain electrode of the transistor. The insulator 408 serves as a barrier layer. The insulator 408 has, for example, a function of blocking oxygen and/or hydrogen. Alternatively, the insulator 408 has, for example, a higher capability of blocking oxygen and/or hydrogen than the semiconductor 406a and/or the semiconductor 406c.

The insulator 402 preferably contains excess oxygen.

The insulator containing excess oxygen means, for example, an insulator from which oxygen is released by heat treatment. For example, the silicon oxide layer containing excess oxygen means a silicon oxide layer which can release oxygen by heat treatment or the like. Therefore, the insulator 402 is an insulator in which oxygen can be moved. In other words, the insulator 402 may be an insulator having an oxygen-transmitting property. For example, the insulator 402 may be an insulator having a higher oxygen-transmitting property than the semiconductor 406*a*.

The insulator containing excess oxygen has a function of reducing oxygen vacancies in the semiconductor 406*b* in some cases. Such oxygen vacancies form DOS in the semiconductor 406*b* and serve as hole traps or the like. In addition, hydrogen comes into the site of such an oxygen vacancy and forms an electron serving as a carrier. Therefore, by reducing the oxygen vacancies in the semiconductor 406*b*, the transistor can have stable electrical characteristics.

Here, an insulator from which oxygen is released by heat treatment may release oxygen, the amount of which is higher than or equal to $1 \times 10^{18}$ atoms/cm$^3$, higher than or equal to $1 \times 10^{19}$ atoms/cm$^3$, or higher than or equal to $1 \times 10^{20}$ atoms/cm$^3$ (converted into the number of oxygen atoms) in thermal desorption spectroscopy (TDS) analysis in the range of a surface temperature of 100° C. to 700° C. or 100° C. to 500° C.

Here, the method of measuring the amount of released oxygen using TDS analysis is described below.

The total amount of released gas from a measurement sample in TDS analysis is proportional to the integral value of the ion intensity of the released gas. Then, comparison with a standard sample is made, whereby the total amount of released gas can be calculated.

For example, the number of released oxygen molecules ($N_{O2}$) from a measurement sample can be calculated according to the following formula using the TDS results of a silicon substrate containing hydrogen at a predetermined density, which is a standard sample, and the TDS results of the measurement sample. Here, all gases having a mass-to-charge ratio of 32 which are obtained in the TDS analysis are assumed to originate from an oxygen molecule. Note that CH$_3$OH, which is a gas having a mass-to-charge ratio of 32, is not taken into consideration because it is unlikely to be present. Furthermore, an oxygen molecule including an oxygen atom having a mass number of 17 or 18 which is an isotope of an oxygen atom is also not taken into consideration because the proportion of such a molecule in the natural world is minimal.

$$N_{O2} = N_{H2}/S_{H2} \times S_{O2} \times \alpha$$

The value $N_{H2}$ is obtained by conversion of the amount of hydrogen molecules desorbed from the standard sample into densities. The value $S_{H2}$ is the integral value of ion intensity in the case where the standard sample is subjected to the TDS analysis. Here, the reference value of the standard sample is set to $N_{H2}/S_{H2}$. The value $S_{O2}$ is the integral value of ion intensity when the measurement sample is analyzed by TDS. The value $\alpha$ is a coefficient affecting the ion intensity in the TDS analysis. Refer to Japanese Published Patent Application No. H6-275697 for details of the above formula. The amount of released oxygen is measured with a thermal desorption spectroscopy apparatus produced by ESCO Ltd., EMD-WA1000S/W using a silicon substrate containing hydrogen atoms at $1 \times 10^{16}$ atoms/cm$^2$ as the standard sample.

Furthermore, in the TDS analysis, oxygen is partly detected as an oxygen atom. The ratio between oxygen molecules and oxygen atoms can be calculated from the ionization rate of the oxygen molecules. Note that, since the above $\alpha$ includes the ionization rate of the oxygen molecules, the amount of the released oxygen atoms can also be estimated through the evaluation of the amount of the released oxygen molecules.

Note that $N_{O2}$ is the amount of the released oxygen molecules. The amount of released oxygen that is converted into oxygen atoms is twice the amount of the released oxygen molecules.

Furthermore, the insulator from which oxygen is released by heat treatment may contain a peroxide radical. Specifically, the spin density attributed to the peroxide radical is greater than or equal to $5 \times 10^{17}$ spins/cm$^3$. Note that the insulator containing a peroxide radical may have an asymmetric signal with a g factor of approximately 2.01 in electron spin resonance (ESR).

The insulator containing excess oxygen may be formed using oxygen-excess silicon oxide (SiO$_X$ (X>2)). In the oxygen-excess silicon oxide (SiO$_X$ (X>2)), the number of oxygen atoms per unit volume is more than twice the number of silicon atoms per unit volume. The number of silicon atoms and the number of oxygen atoms per unit volume are measured by Rutherford backscattering spectrometry (RBS).

As illustrated in FIG. 38B, the side surfaces of the semiconductor 406*b* are in contact with the conductor 416*a* and the conductor 416*b*. The semiconductor 406*b* can be electrically surrounded by an electric field of the conductor 404 (a structure in which a semiconductor is electrically surrounded by an electric field of a conductor is referred to as a surrounded channel (s-channel) structure). Therefore, a channel is formed in the entire semiconductor 406*b* (bulk) in some cases. In the s-channel structure, a large amount of current can flow between a source electrode and a drain electrode of a transistor, so that a high on-state current can be obtained.

The s-channel structure is suitable for a miniaturized transistor because a high on-state current can be obtained. A semiconductor device including the miniaturized transistor can have a high integration degree and high density. For example, the channel length of the transistor is preferably less than or equal to 40 nm, further preferably less than or equal to 30 nm, still further preferably less than or equal to 20 nm and the channel width of the transistor is preferably less than or equal to 40 nm, further preferably less than or equal to 30 nm, still further preferably less than or equal to 20 nm.

Furthermore, by applying a lower voltage or a higher voltage than a source electrode to the conductor 413, the threshold voltage of the transistor may be shifted in the positive direction or the negative direction. For example, by shifting the threshold voltage of the transistor in the positive direction, a normally-off transistor that is in a non-conduction state (off state) even when the gate voltage is 0 V can be achieved in some cases. The voltage applied to the conductor 413 may be a variable or a fixed voltage. When the voltage applied to the conductor 413 is a variable, a circuit for controlling the voltage may be electrically connected to the conductor 413.

Next, a semiconductor that can be used as the semiconductors 406*a* to 406*c*, or the like is described below.

The semiconductor 406*b* is an oxide semiconductor containing indium, for example. The semiconductor 406*b* can have high carrier mobility (electron mobility) when containing indium, for example. The semiconductor 406*b* preferably contains an element M. The element M is preferably aluminum, gallium, yttrium, tin, or the like. Other elements that can be used as the element M are boron, silicon, titanium, iron, nickel, germanium, zirconium, molybdenum, lanthanum, cerium, neodymium, hafnium, tantalum, tungsten, and the like. Note that two or more of the above elements may be used in combination as the element M. The element M is, for example, an element having a high bonding energy with oxygen. The element M is, for example, an element whose bonding energy with oxygen is higher than that of indium. The element M is, for example, an element that can increase the energy gap of the oxide semiconductor. Furthermore, the semiconductor 406b preferably contains zinc. When the oxide semiconductor contains zinc, the oxide semiconductor is easily to be crystallized in some cases.

Note that the semiconductor 406b is not limited to the oxide semiconductor containing indium. The semiconductor 406b may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor 406b, an oxide with a wide energy gap may be used. For example, the energy gap of the semiconductor 406b is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

For example, the semiconductors 406a and 406c include one or more elements other than oxygen included in the semiconductor 406b. Since the semiconductors 406a and 406c each include one or more elements other than oxygen included in the semiconductor 406b, an interface state is less likely to be formed at the interface between the semiconductor 406a and the semiconductor 406b and the interface between the semiconductor 406b and the semiconductor 406c.

The semiconductors 406a to 406c preferably include at least indium. In the case of using an In-M-Zn oxide as the semiconductor 406a, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In-M-Zn oxide as the semiconductor 406b, when the summation of In and M is assumed to be 100 atomic %, the proportions of In and M5 are preferably set to be greater than 25 atomic % and less than 75 atomic %, respectively, further preferably greater than 34 atomic % and less than 66 atomic %, respectively. In the case of using an In-M-Zn oxide as the semiconductor 406c, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. Note that the semiconductor 406c may be an oxide that is of the same type as the semiconductor 406a. Note that the semiconductor 406a and/or the semiconductor 406c do/does not necessarily contain indium in some cases. For example, the semiconductor 406a and/or the semiconductor 406c may be gallium oxide.

As the semiconductor 406b, an oxide having an electron affinity higher than those of the semiconductors 406a and 406c is used. For example, as the semiconductor 406b, an oxide having an electron affinity higher than those of the semiconductors 406a and 406c by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy gap between the vacuum level and the bottom of the conduction band.

An indium gallium oxide has a small electron affinity and a high oxygen-blocking property. Therefore, the semiconductor 406c preferably includes an indium gallium oxide. The gallium atomic ratio [Ga/(In+Ga)] is, for example, higher than or equal to 70%, preferably higher than or equal to 80%, further preferably higher than or equal to 90%.

Figure 37:
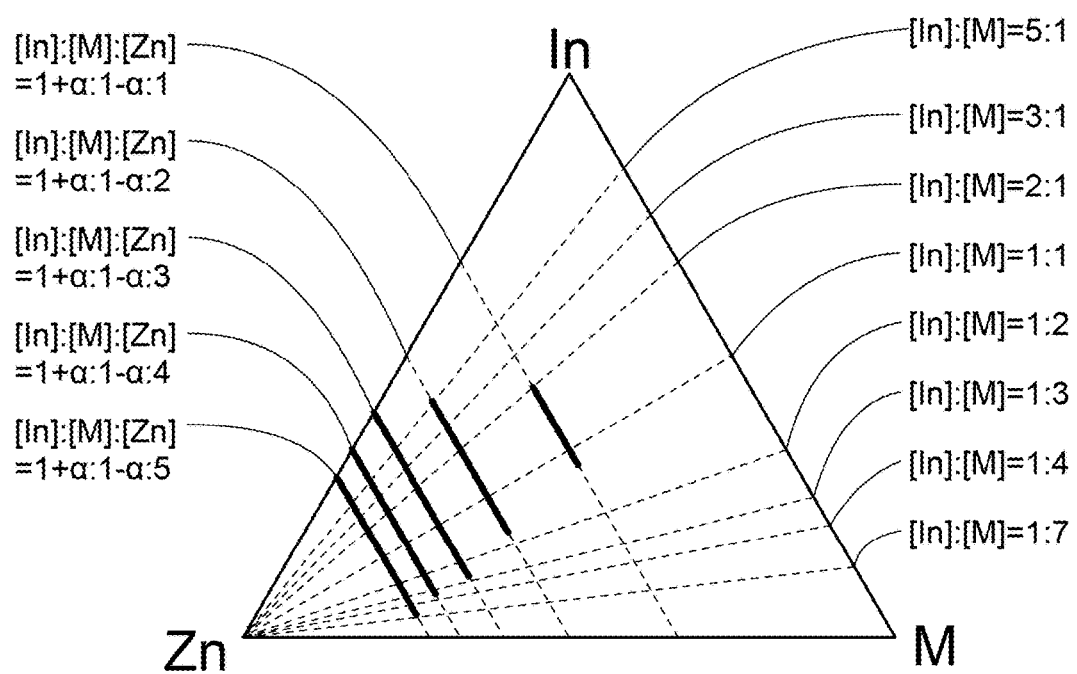
FIG. 37 is a ternary diagram showing the composition of an In-M-Zn oxide.

Note that the composition of the semiconductor 406a is preferably in the neighborhood of the composition represented by the bold line in FIG. 37. The composition of the semiconductor 406b is preferably in the neighborhood of the composition represented by the bold line in FIG. 37. The composition of the semiconductor 406c is preferably in the neighborhood of the composition represented by the bold line in FIG. 37. When these compositions are employed, the channel formation region of the transistor can have a single crystal structure. Alternatively, the channel formation region, the source region, and the drain region of the transistor can have a single crystal structure in some cases. When the channel formation region of the transistor has a single crystal structure, the transistor can have high frequency characteristics in some cases.

At this time, when a gate voltage is applied, a channel is formed in the semiconductor 406b having the highest electron affinity in the semiconductors 406a to 406c.

Here, in some cases, there is a mixed region of the semiconductors 406a and 406b between the semiconductor 406a and the semiconductor 406b. Furthermore, in some cases, there is a mixed region of the semiconductors 406b and 406c between the semiconductor 406b and the semiconductor 406c. The mixed region has a low density of interface states. For that reason, the stack of the semiconductors 406a to 406c has a band structure where energy at each interface and in the vicinity of the interface is changed continuously (continuous junction).

At this time, electrons move mainly in the semiconductor 406b, not in the semiconductors 406a and 406c. As described above, when the interface state density at the interface between the semiconductors 406a and 406b and the interface state density at the interface between the semiconductors 406b and 406c are decreased, electron movement in the semiconductor 406b is less likely to be inhibited and the on-state current of the transistor can be increased.

As factors of inhibiting electron movement are decreased, the on-state current of the transistor can be increased. For example, in the case where there is no factor of inhibiting electron movement, electrons are assumed to move efficiently. Electron movement is inhibited, for example, in the case where physical unevenness in a channel formation region is large.

To increase the on-state current of the transistor, for example, root mean square (RMS) roughness with a measurement area of 1 μm×1 μm of a top surface or a bottom surface of the semiconductor 406b (a formation surface; here, a top surface of the semiconductor 406a) is less than 1 nm, preferably less than 0.6 nm, further preferably less than 0.5 nm, still further preferably less than 0.4 nm. The average surface roughness (also referred to as Ra) with the measurement area of 1 μm×1 μm is less than 1 nm, preferably less than 0.6 nm, further preferably less than 0.5 nm, still further preferably less than 0.4 nm. The maximum difference (P–V) with the measurement area of 1 μm×1 μm is less than 10 nm, preferably less than 9 nm, further preferably less than 8 nm, still further preferably less than 7 nm. RMS roughness, Ra, and P–V can be measured using a scanning probe microscope SPA-500 manufactured by SII Nano Technology Inc.

The electron movement is also inhibited, for example, in the case where the density of defect states is high in a region where a channel is formed.

For example, in the case where the semiconductor 406b contains oxygen vacancies ($V_O$), hydrogen might enter sites of the oxygen vacancies to form a donor level (hereinafter, hydrogen entering the sites of oxygen vacancies is also referred to as $V_OH$). Because $V_OH$ scatters electrons, it is a factor of decreasing the on-state current of the transistor. Note that the sites of oxygen vacancies become more stable by entry of oxygen than by entry of hydrogen. Thus, by decreasing oxygen vacancies in the semiconductor 406b, the on-state current of the transistor can be increased in some cases.

To decrease oxygen vacancies in the semiconductor 406b, for example, there is a method in which excess oxygen in the insulator 402 is moved to the semiconductor 406b through the semiconductor 406a. In this case, the semiconductor 406a is preferably a layer having an oxygen-transmitting property (a layer through which oxygen passes or is transmitted).

In the case where the transistor has an s-channel structure, a channel is formed in the whole of the semiconductor 406b. Therefore, as the semiconductor 406b has a larger thickness, a channel region becomes larger. In other words, the thicker the semiconductor 406b is, the larger the on-state current of the transistor is. For example, the semiconductor 406b has a region with a thickness greater than or equal to nm, preferably greater than or equal to 20 nm, more preferably greater than or equal to 40 nm, further preferably greater than or equal to 60 nm, still further preferably greater than or equal to 100 nm. Note that the semiconductor 406b has a region with a thickness, for example, less than or equal to 300 nm, preferably less than or equal to 200 nm, further preferably less than or equal to 150 nm because the productivity of the semiconductor device might be decreased. In some cases, when the channel formation region is reduced in size, the electrical characteristics of the transistor with a smaller thickness are improved. Therefore, the semiconductor 406b may have a thickness less than 10 nm.

Moreover, the thickness of the semiconductor 406c is preferably as small as possible to increase the on-state current of the transistor. The thickness of the semiconductor 406c is less than 10 nm, preferably less than or equal to 5 nm, more preferably less than or equal to 3 nm, for example. Meanwhile, the semiconductor 406c has a function of blocking entry of elements other than oxygen (such as hydrogen and silicon) included in the adjacent insulator into the semiconductor 406b where a channel is formed. For this reason, it is preferable that the semiconductor 406c have a certain thickness. The thickness of the semiconductor 406c is greater than or equal to 0.3 nm, preferably greater than or equal to 1 nm, further preferably greater than or equal to 2 nm, for example. The semiconductor 406c preferably has an oxygen blocking property to suppress outward diffusion of oxygen released from the insulator 402 and the like.

To improve reliability, preferably, the thickness of the semiconductor 406a is large and the thickness of the semiconductor 406c is small. For example, the semiconductor 406a has a region with a thickness, for example, greater than or equal to 10 nm, preferably greater than or equal to 20 nm, further preferably greater than or equal to 40 nm, still further preferably greater than or equal to 60 nm. When the thickness of the semiconductor 406a is made large, the distance from the interface between the adjacent insulator and the semiconductor 406a to the semiconductor 406b in which a channel is formed can be large. Since the productivity of the semiconductor device might be decreased, the semiconductor 406a has a region with a thickness, for example, less than or equal to 200 nm, preferably less than or equal to 120 nm, further preferably less than or equal to 80 nm.

For example, a region with a silicon concentration of lower than $1\times10^{19}$ atoms/cm$^3$, preferably lower than $5\times10^{18}$ atoms/cm$^3$, more preferably lower than $2\times10^{18}$ atoms/cm$^3$ which is measured by secondary ion mass spectrometry (SIMS) is provided between the semiconductor 406b and the semiconductor 406a. A region with a silicon concentration of lower than $1\times10^{19}$ atoms/cm$^3$, preferably lower than $5\times10^{18}$ atoms/cm$^3$, more preferably lower than $2\times10^{18}$ atoms/cm$^3$ which is measured by SIMS is provided between the semiconductor 406b and the semiconductor 406c.

It is preferable to reduce the concentration of hydrogen in the semiconductor 406a and the semiconductor 406c in order to reduce the concentration of hydrogen in the semiconductor 406b. The semiconductor 406a and the semiconductor 406c each have a region in which the concentration of hydrogen measured by SIMS is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. It is preferable to reduce the concentration of nitrogen in the semiconductor 406a and the semiconductor 406c in order to reduce the concentration of nitrogen in the semiconductor 406b. The semiconductor 406a and the semiconductor 406c each have a region in which the concentration of nitrogen measured by SIMS is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The above three-layer structure is an example. For example, a two-layer structure without the semiconductor 406a or the semiconductor 406c may be employed. Alternatively, a four-layer structure in which any one of the semiconductors described as examples of the semiconductors 406a to 406c is provided below or over the semiconductor 406a or below or over the semiconductor 406c may be employed. Further alternatively, an n-layer structure (n is an integer of 5 or more) may be employed in which any one of the semiconductors described as examples of the semiconductors 406a to 406c is provided at two or more of the following positions: over the semiconductor 406a, below the semiconductor 406a, over the semiconductor 406c, and below the semiconductor 406c.

As the substrate 400, an insulator substrate, a semiconductor substrate, or a conductor substrate may be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a single material semiconductor substrate of silicon, germanium, or the like and a compound semiconductor substrate containing silicon carbide, silicon germanium, gallium arsenide, indium phosphide, zinc oxide, or gallium oxide as a material. A semiconductor substrate in which an insulator region is provided in the above semiconductor substrate, e.g., a silicon on insulator (SOI) substrate, may also be used. Examples of the conductor substrate include a graphite substrate, a metal substrate, an alloy substrate, and a conductive resin substrate. A substrate including a metal nitride, a substrate including a metal oxide, or the like may also be used. Furthermore, an insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. Examples of the element provided over the substrate include a capacitor, a resistor, a switching element, a light-emitting element, and a memory element.

Alternatively, a flexible substrate may be used as the substrate 400. A transistor may be provided over a flexible substrate by a method in which the transistor is formed over a non-flexible substrate and then the transistor is separated and transferred to the substrate 400 which is a flexible substrate. In that case, a separation layer is preferably provided between the non-flexible substrate and the transistor. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The thickness of the substrate 400 is, for example, greater than or equal to 5 μm and less than or equal to 700 μm, preferably greater than or equal to 10 μm and less than or equal to 500 μm, or further preferably greater than or equal to 15 μm and less than or equal to 300 μm. When the substrate 400 has a small thickness, the weight of the semiconductor device can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a durable semiconductor device can be provided.

For the substrate 400 which is a flexible substrate, metal, an alloy, resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

The conductor 413 may be formed to have a single-layer structure or a stacked-layer structure using a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten, for example. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 402 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 402 may be formed, for example, using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator 402 may have a function of preventing diffusion of impurities from the substrate 400. In the case where the semiconductor 406b is an oxide semiconductor, the insulator 402 can have a function of supplying oxygen to the semiconductor 406b.

Each of the conductors 416a and 416b may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Due to the conductors 416a and 416b, a defect is formed in the semiconductor 406a, the semiconductor 406b, or the semiconductor 406c in some cases. The defect makes the semiconductor 406a, 406b, or 406c an n-type semiconductor in some cases. As a result, ohmic contact is made between any of the semiconductors 406a to 406c and the conductors 416a and 416b. For example, in the case where the defect formed in the semiconductor 406a, 406b, or 406c is reduced by dehydrogenation or supplying excess oxygen, a Schottky junction is made between any of the semiconductors 406a to 406c and the conductors 416a and 416b.

The insulator 412 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 412 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The conductor 404 may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 408 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 408 is preferably formed to have, for example, a single-layer structure or a stacked-layer structure including an insulator containing aluminum oxide, silicon nitride oxide, silicon nitride, gallium oxide, yttrium oxide, zirconium oxide, lanthanum oxide, neodymium oxide, hafnium oxide, or tantalum oxide.

The insulator 418 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 418 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

Figure 39A:
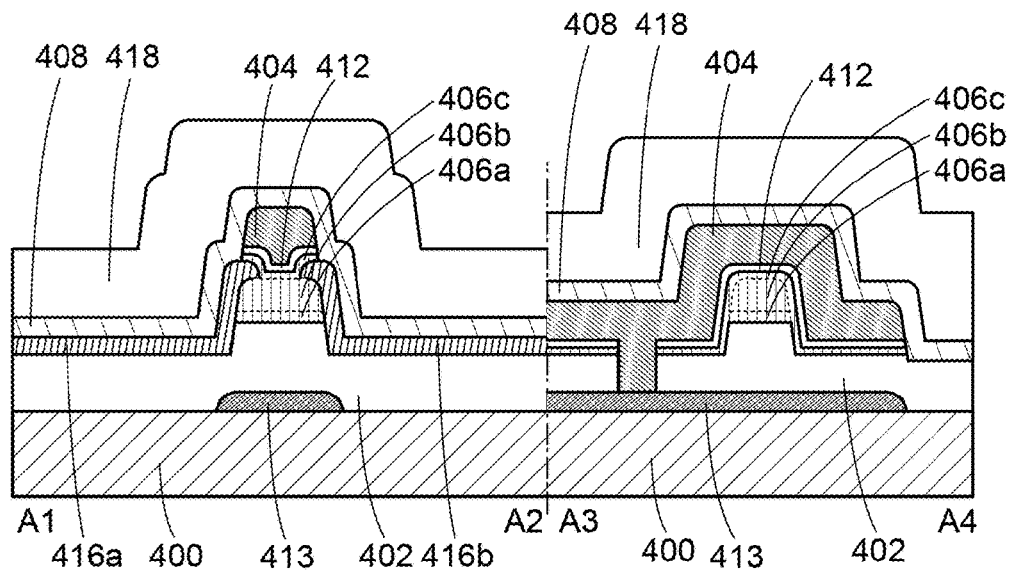
FIGS. 39A and 39B are cross-sectional views each showing a structure example of a transistor.
Figure 39B:
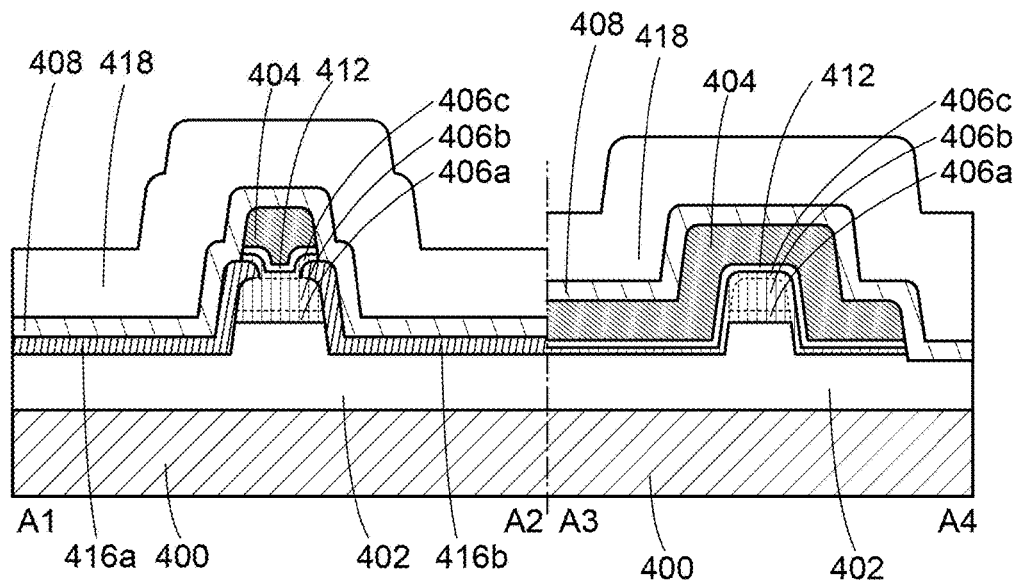

Although FIGS. 38A and 38B show an example where the conductor 404 which is a first gate electrode of a transistor is not electrically connected to the conductor 413 which is a second gate electrode, a transistor structure of one embodiment of the present invention is not limited thereto. For example, as illustrated in FIG. 39A, the conductor 404 may be electrically connected to the conductor 413. With such a structure, the conductor 404 and the conductor 413 are supplied with the same potential; thus, switching characteristics of the transistor can be improved. Alternatively, as illustrated in FIG. 39B, the conductor 413 is not necessarily provided.

Figure 40A:
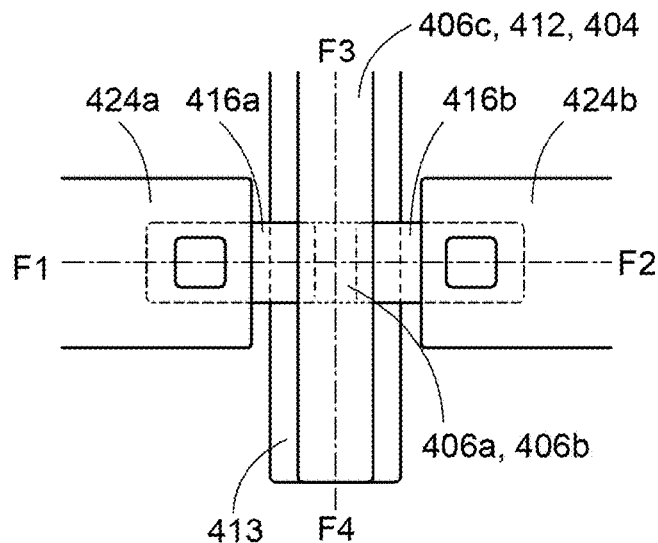
FIGS. 40A and 40B are a top view and a cross-sectional view each showing a structure example of a transistor.
Figure 40B:
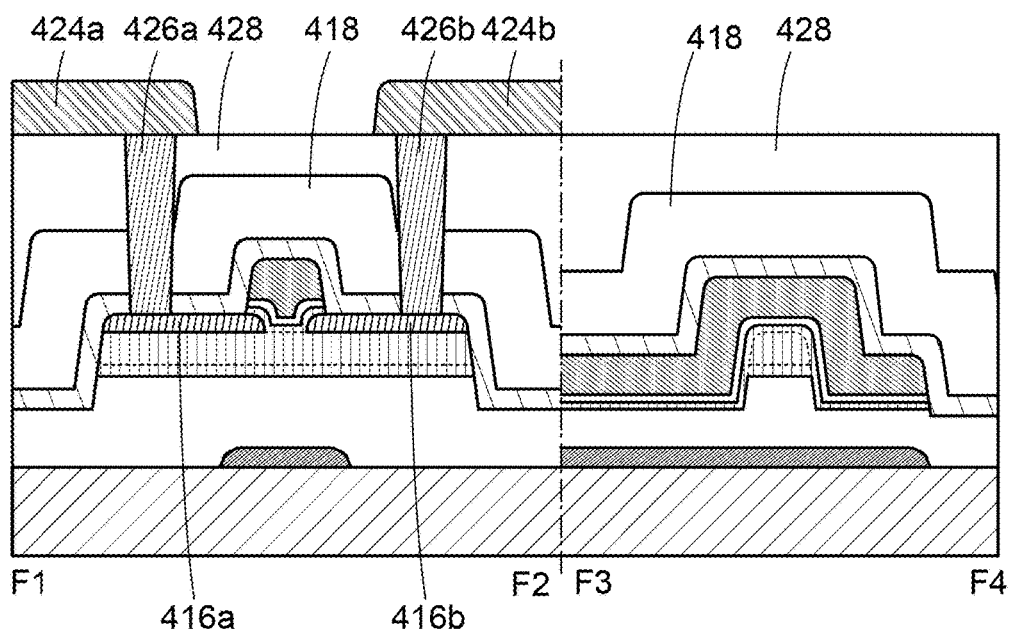

FIG. 40A is an example of a top view of a transistor. FIG. 40B is an example of a cross-sectional view taken along dashed-dotted line F1-F2 and dashed-dotted line F3-F4 in FIG. 40A. Note that some components such as an insulator are omitted in FIG. 40A for easy understanding.

Although FIGS. 38A and 38B and the like show an example where the conductors 416a and 416b which function as a source electrode and a drain electrode are in contact with a top surface and a side surface of the semiconductor 406b, a top surface of the insulator 402, and the like, a transistor structure of one embodiment of the present invention is not limited thereto. For example, as illustrated in FIGS. 40A and 40B, the conductors 416a and 416b may be in contact with only the top surface of the semiconductor 406b.

As illustrated in FIG. 40B, an insulator 428 may be provided over the insulator 418. The insulator 428 preferably has a flat top surface. The insulator 428 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 428 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide. To planarize the top surface of the insulator 428, planarization treatment may be performed by a chemical mechanical polishing (CMP) method or the like.

A resin may be used as the insulator 428. For example, a resin containing polyimide, polyamide, acrylic, silicone, or the like may be used. The use of a resin does not need planarization treatment performed on the top surface of the insulator 428 in some cases. A thick film can be formed in a short time by using a resin, improving the productivity.

As illustrated in FIGS. 40A and 40B, a conductor 424a and a conductor 424b may be provided over the insulator 428. The conductors 424a and 424b function as wirings, for example. The insulator 428 may include an opening and the conductors 416a and 424a may be electrically connected to each other through the opening. The insulator 428 may have another opening and the conductors 416b and 424b may be electrically connected to each other through the opening. In this case, the conductors 426a and 426b may be provided in the respective openings.

Each of the conductors 424a and 424b may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

In the transistor illustrated in FIGS. 40A and 40B, the conductors 416a and 416b are not in contact with the side surfaces of the semiconductor 406b. Thus, an electric field applied from the conductor 404 functioning as a first gate electrode to the side surfaces of the semiconductor 406b is less likely to be blocked by the conductors 416a and 416b. The conductors 416a and 416b are not in contact with the top surface of the insulator 402. Thus, excess oxygen (oxygen) released from the insulator 402 is not consumed to oxidize the conductors 416a and 416b. Accordingly, excess oxygen (oxygen) released from the insulator 402 can be efficiently used to reduce oxygen vacancies in the semiconductor 406b. In other words, the transistor having the structure illustrated in FIGS. 40A and 40B has excellent electrical characteristics such as a high on-state current, a high field-effect mobility, a small subthreshold swing value, and high reliability.

Figure 41A:
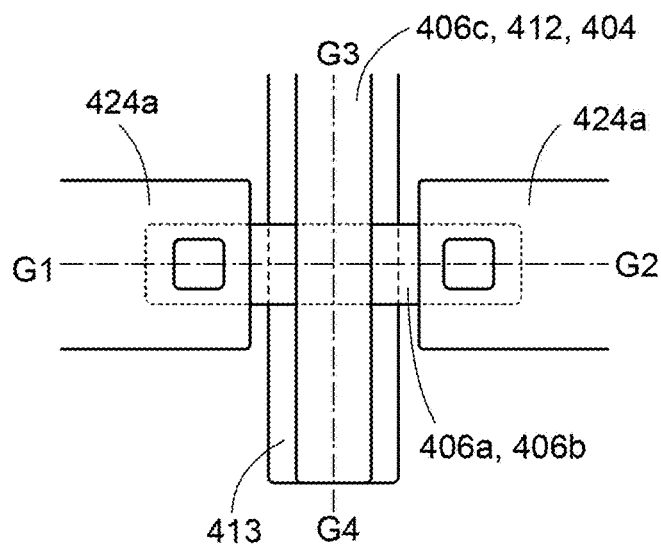
FIGS. 41A and 41B are a top view and a cross-sectional view each showing a structure example of a transistor.
Figure 41B:
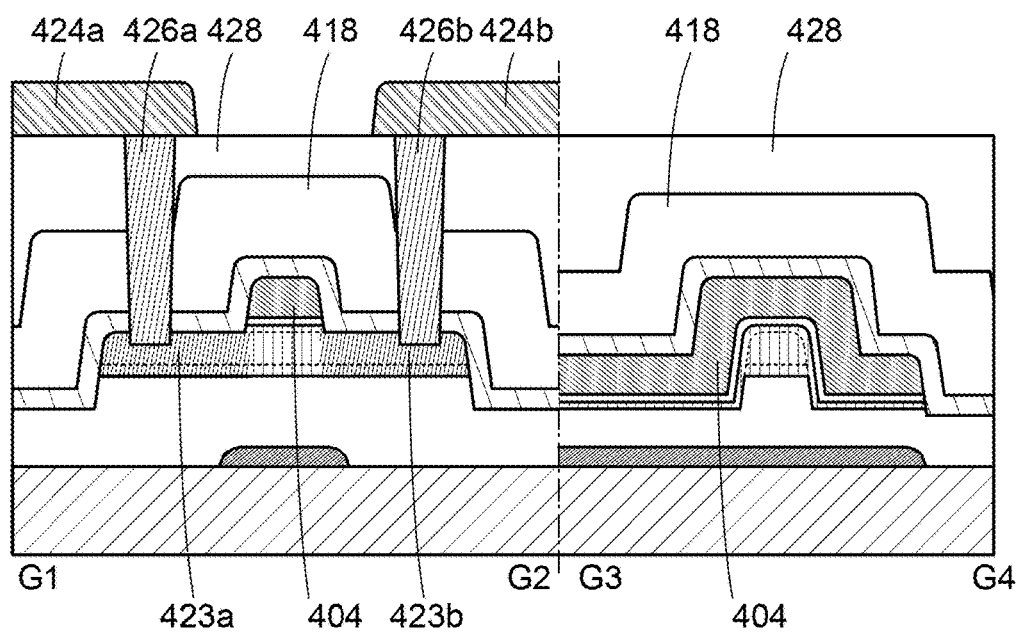

FIGS. 41A and 41B are a top view and a cross-sectional view which illustrate a transistor of one embodiment of the present invention. FIG. 41A is a top view and FIG. 41B is a cross-sectional view taken along dashed-dotted line G1-G2 and dashed-dotted line G3-G4 in FIG. 41A. Note that for simplification of the drawing, some components are not illustrated in the top view in FIG. 41A.

The transistor may have a structure in which, as illustrated in FIGS. 41A and 41B, the conductors 416a and 416b are not provided and the conductors 426a and 426b are in contact with the semiconductor 406b. In this case, a low-resistance region 423a (a low-resistance region 423b) is preferably provided in a region in contact with at least the conductor 426a and the conductor 426b in the semiconductor 406b and/or the semiconductor 406a. The low-resistance region 423a and the low-resistance region 423b may be formed in such a manner that, for example, the conductor 404 and the like are used as masks and impurities are added to the semiconductor 406b and/or the semiconductor 406a. The conductors 426a and 426b may be provided in holes (portions which penetrate) or recessed portions (portions which do not penetrate) of the semiconductor 406b. When the conductor 426a and the conductor 426b are provided in holes or recessed portions of the semiconductor 406b, contact areas between the conductors 426a and 426b and the semiconductor 406b are increased, which decreases the adverse effect of the contact resistance. In other words, the on-state current of the transistor can be increased.

<Transistor Structure 2>

Figure 42A:
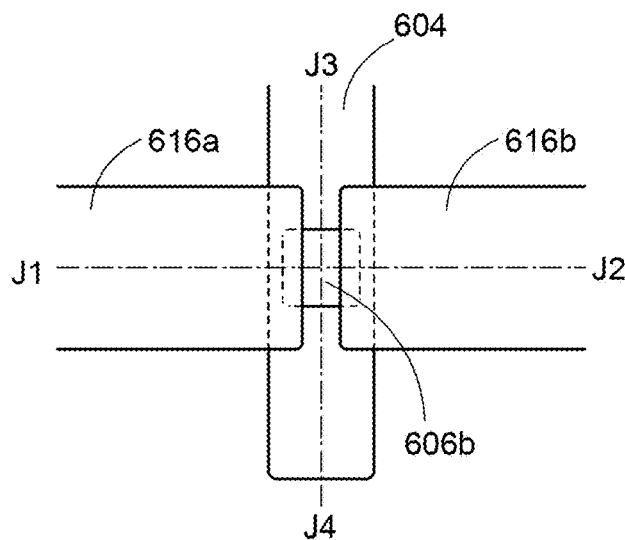
FIGS. 42A and 42B are a top view and a cross-sectional view each showing a structure example of a transistor.
Figure 42B:
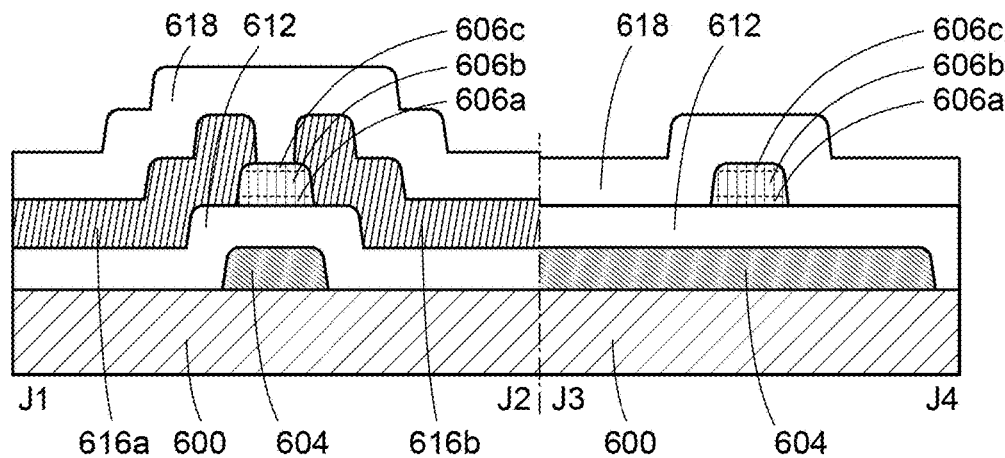

FIGS. 42A and 42B are a top view and a cross-sectional view of a transistor of one embodiment of the present invention. FIG. 42A is a top view and FIG. 42B is a cross-sectional view taken along dashed-dotted line J1-J2 and dashed-dotted line J3-J4 in FIG. 42A. Note that for simplification of the drawing, some components are not illustrated in the top view in FIG. 42A.

The transistor in FIGS. 42A and 42B includes a conductor 604 over a substrate 600, an insulator 612 over the conductor 604, a semiconductor 606a over the insulator 612, a semiconductor 606b over the semiconductor 606a, a semiconductor 606c over the semiconductor 606b, a conductor 616a and a conductor 616b which are in contact with the semiconductors 606a to 606c and which are arranged to be apart from each other, and an insulator 618 over the semiconductor 606c, the conductor 616a, and the conductor 616b. The conductor 604 faces a bottom surface of the semiconductor 606b with the insulator 612 provided therebetween. The insulator 612 may have a projection. An insulator may be provided between the substrate 600 and the conductor 604. For the insulator, the description of the insulator 402 or the insulator 408 is referred to. The semiconductor 606a and/or the insulator 618 is not necessarily provided.

The semiconductor 606b serves as a channel formation region of the transistor. The conductor 604 serves as a first gate electrode (also referred to as a front gate electrode) of the transistor. The conductors 616a and 616b serve as a source electrode and a drain electrode of the transistor.

The insulator 618 preferably contains excess oxygen.

For the substrate 600, the description of the substrate 400 is referred to. For the conductor 604, the description of the conductor 404 is referred to. For the insulator 612, the description of the insulator 412 is referred to. For the semiconductor 606a, the description of the semiconductor 406c is referred to. For the semiconductor 606b, the description of the semiconductor 406b is referred to. For the semiconductor 606c, the description of the semiconductor 406a is referred to. For the conductors 616a and 616b, the description of the conductors 416a and 416b is referred to. For the insulator 618, the description of the insulator 402 is referred to.

Over the insulator 618, a display element may be provided. For example, a pixel electrode, a liquid crystal layer, a common electrode, a light-emitting layer, an organic EL layer, an anode electrode, or a cathode electrode may be provided. The display element is connected to, for example, the conductor 616a.

Figure 43A:
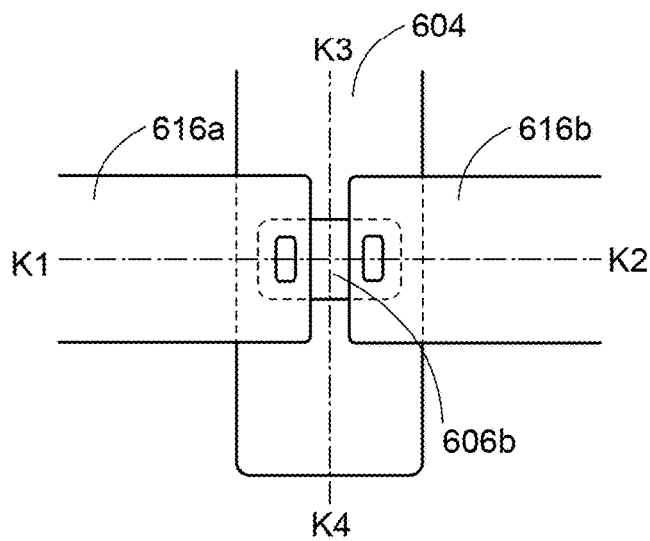
FIGS. 43A and 43B are a top view and a cross-sectional view each showing a structure example of a transistor.
Figure 43B:
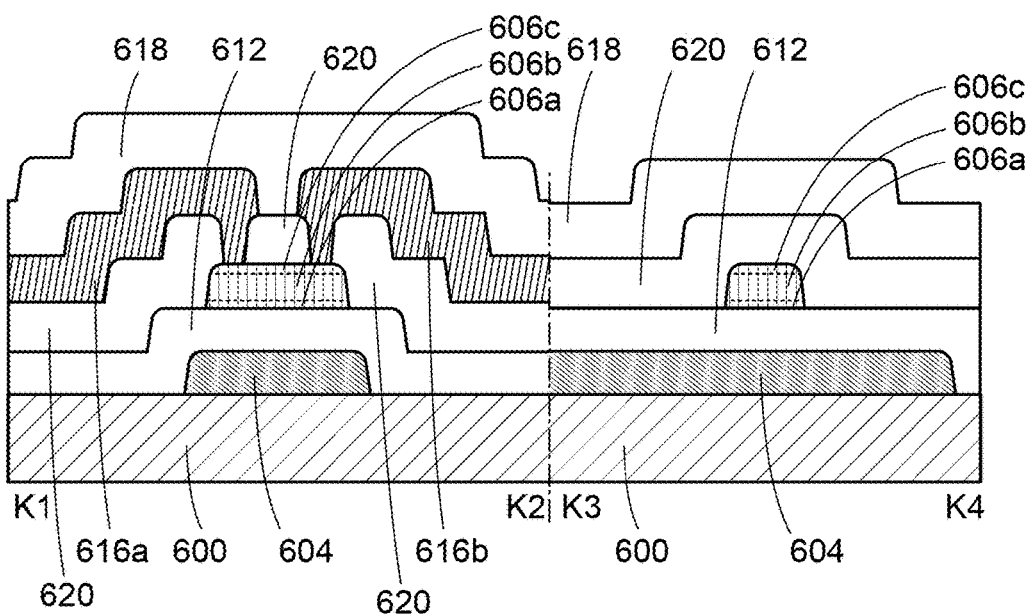

FIG. 43A is an example of a top view of a transistor. FIG. 43B is an example of a cross-sectional view taken along dashed-dotted line K1-K2 and dashed-dotted line K3-K4 in FIG. 43A. Note that some components such as an insulator are omitted in FIG. 43A for easy understanding.

Over the semiconductor, an insulator that can function as a channel protective film may be provided. For example, as illustrated in FIGS. 43A and 43B, an insulator 620 may be provided between the semiconductor 606c and the conductors 616a and 616b. In that case, the conductor 616a (the conductor 616b) and the semiconductor 606c are connected to each other through an opening in the insulator 620. For the insulator 620, the description of the insulator 618 may be referred to.

Figure 44A:
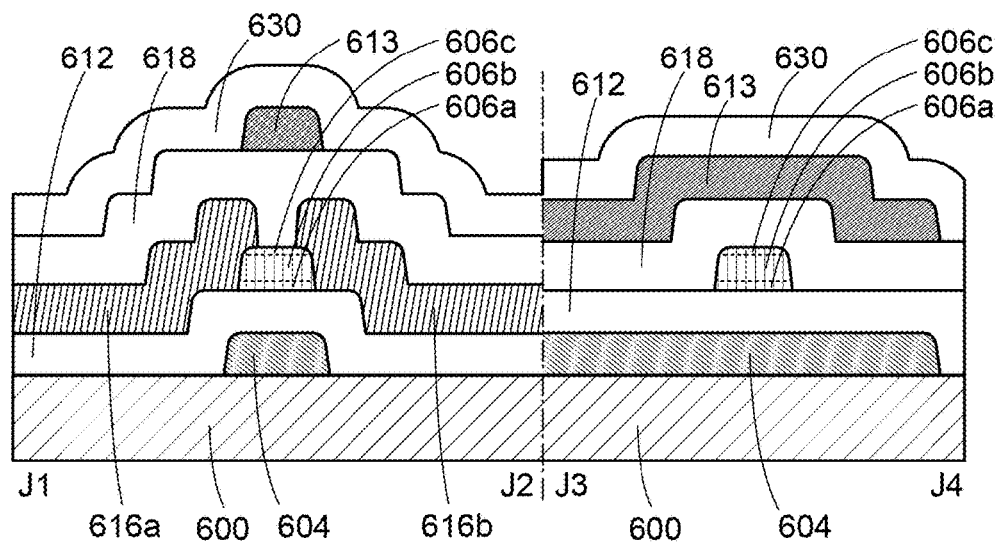
FIGS. 44A and 44B are cross-sectional views each showing a structure example of a transistor.
Figure 44B:
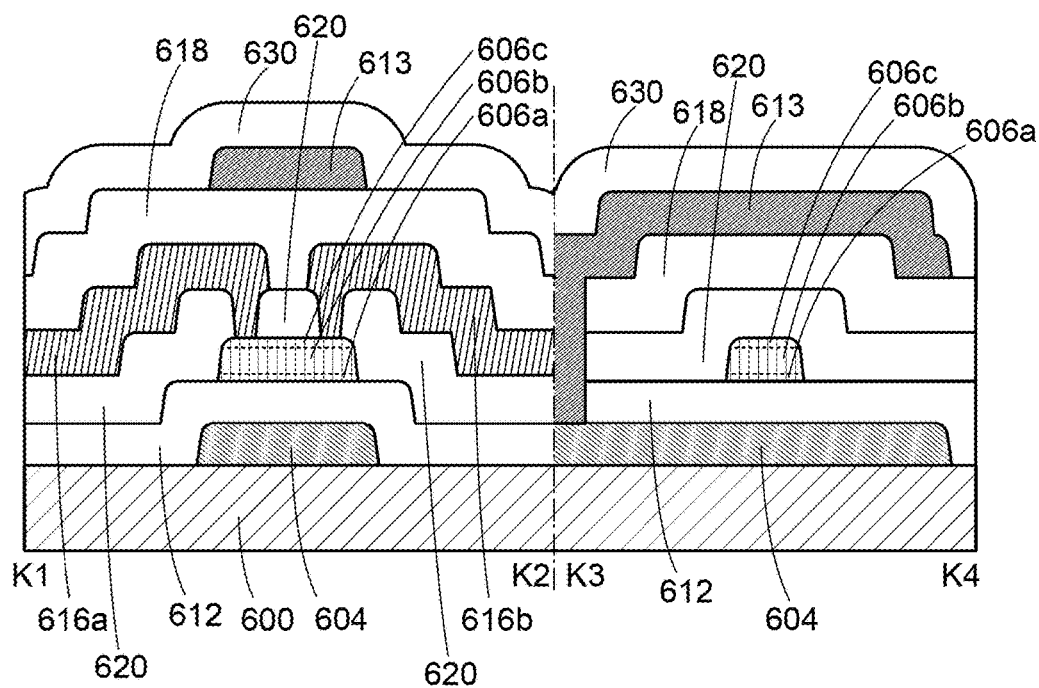

In FIG. 42B and FIG. 43B, a conductor 613 may be provided over the insulator 618 and an insulator 630 may be provided over the conductor 613. Examples in that case are shown in FIGS. 44A and 44B. For the conductor 613, the description of the conductor 413 is referred to. For the insulator 630, the description of the insulator 418 is referred to. A potential or signal supplied to the conductor 613 may be the same as or different from that supplied to the conductor 604. For example, by supplying a constant potential to the conductor 613, the threshold voltage of a transistor may be controlled. In other words, the conductor 613 can function as a second gate electrode. Furthermore, an s-channel structure may be formed using the conductor 613 and the like. The insulator 630 is not necessarily provided.

Embodiment 8

<Structure of Oxide Semiconductor>

The structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 45A:
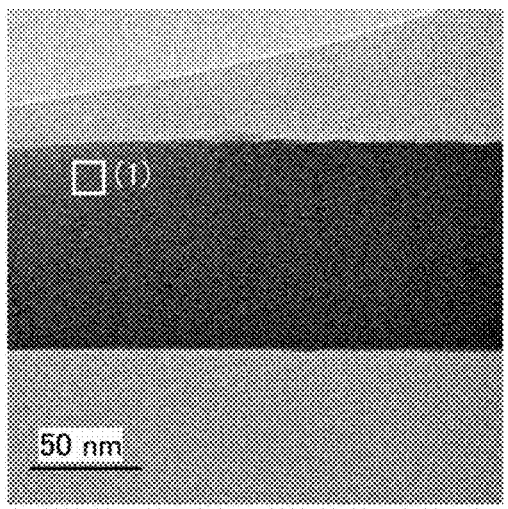
FIGS. 45A to 45D are Cs-corrected high-resolution TEM images of a cross section of a CAAC-OS and a cross-sectional schematic view of the CAAC-OS.

The CAAC-OS observed with a TEM is described below. FIG. 45A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 45B:
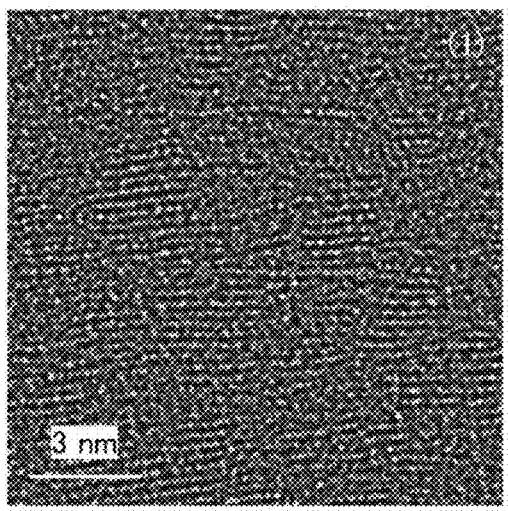

FIG. 45B is an enlarged Cs-corrected high-resolution TEM image of a region (1) in FIG. 45A. FIG. 45B shows that metal atoms are arranged in a layered manner in a pellet.

Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 45C:
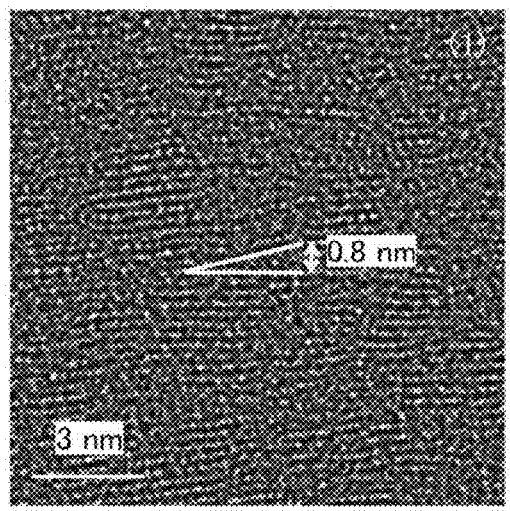

As shown in FIG. 45B, the CAAC-OS has a characteristic atomic arrangement. The characteristic atomic arrangement is denoted by an auxiliary line in FIG. 45C. FIGS. 45B and 45C prove that the size of a pellet is greater than or equal to 1 nm or greater than or equal to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 45D:
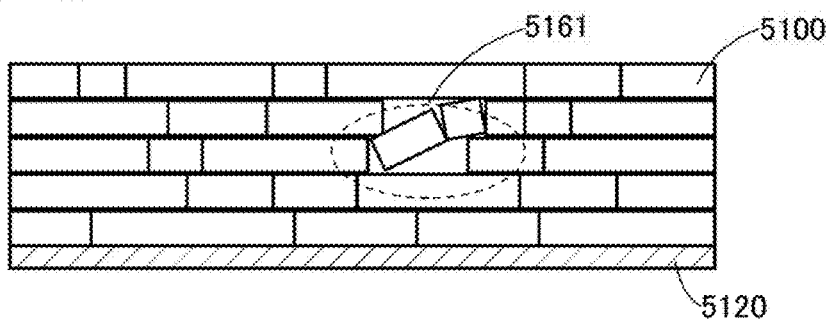

Here, according to the Cs-corrected high-resolution TEM images, the schematic arrangement of pellets 5100 of a CAAC-OS over a substrate 5120 is illustrated by such a structure in which bricks or blocks are stacked (see FIG. 45D). The part in which the pellets are tilted as observed in FIG. 45C corresponds to a region 5161 shown in FIG. 45D.

FIG. 46A shows a Cs-corrected high-resolution TEM image of a plane of the CAAC-OS observed from a direction substantially perpendicular to the sample surface. FIGS. 46B, 46C, and 46D are enlarged Cs-corrected high-resolution TEM images of regions (1), (2), and (3) in FIG. 46A, respectively. FIGS. 46B, 46C, and 46D indicate that metal atoms are arranged in a triangular, quadrangular, or hexagonal configuration in a pellet. However, there is no regularity of arrangement of metal atoms between different pellets.

Figure 47A:
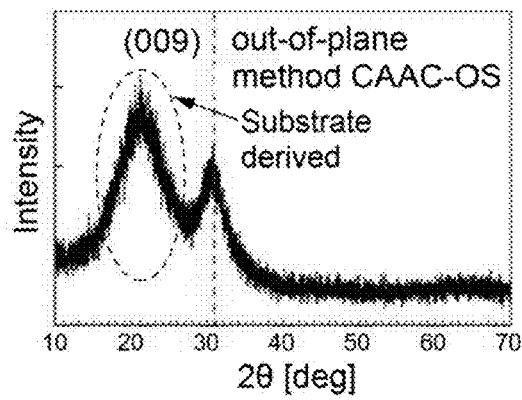
FIGS. 47A to 47C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle (2θ) of around 31° as shown in FIG. 47A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak of 2θ at around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 47B:
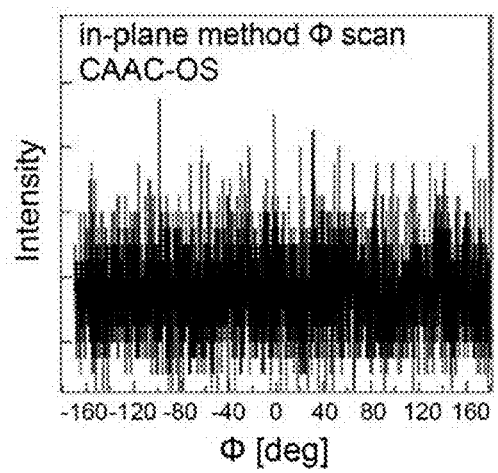
Figure 47C:
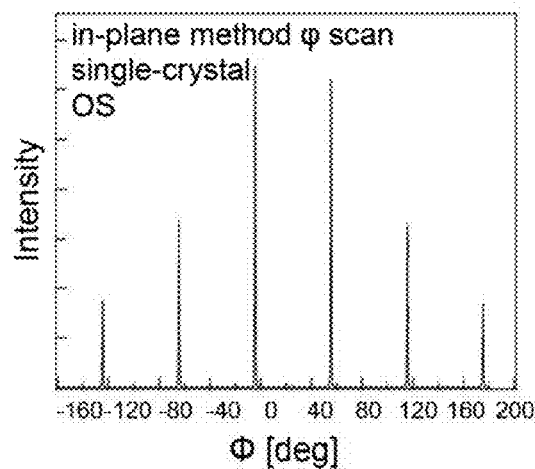

On the other hand, in structural analysis of the CAAC-OS by an in-plane method in which an X-ray is incident on a sample in a direction substantially perpendicular to the c-axis, a peak appears when 2θ is around 56°. This peak is derived from the (110) plane of the $InGaZnO_4$ crystal. In the case of the CAAC-OS, when analysis (φ scan) is performed with 2θ fixed at around 56° and with the sample rotated using a normal vector of the sample surface as an axis (φ axis), as shown in FIG. 47B, a peak is not clearly observed. In contrast, in the case of a single crystal oxide semiconductor of $InGaZnO_4$, when φ scan is performed with 2θ fixed at around 56°, as shown in FIG. 47C, six peaks which are derived from crystal planes equivalent to the (110) plane are observed. Accordingly, the structural analysis using XRD shows that the directions of a-axes and b-axes are irregularly oriented in the CAAC-OS.

Figure 48A:
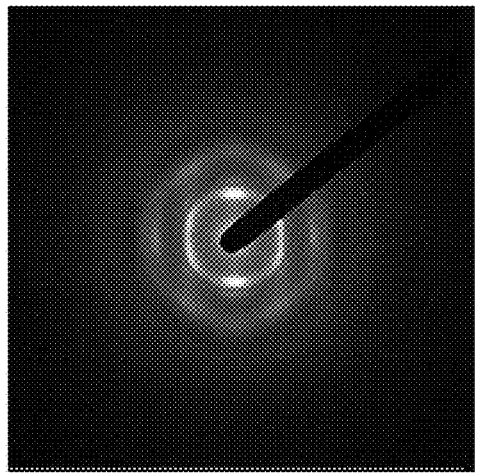
FIGS. 48A and 48B show electron diffraction patterns of a CAAC-OS.
Figure 48B:
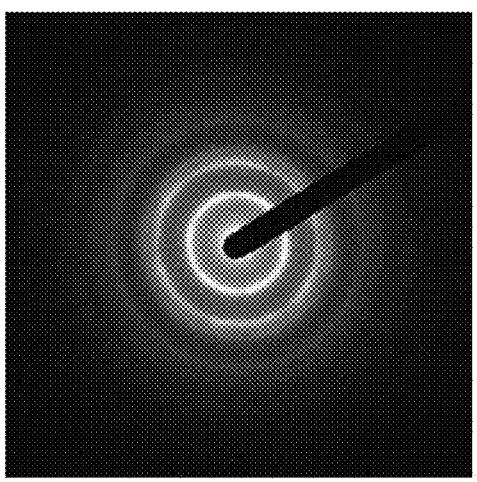

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 48A can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 48B shows a diffraction pattern obtained in such a manner that an electron beam with a probe diameter of 300 nm is incident on the same sample in a direction perpendicular to the sample surface. As shown in FIG. 48B, a ring-like diffraction pattern is observed. Thus, the electron diffraction also indicates that the a-axes and b-axes of the pellets included in the CAAC-OS do not have regular alignment. The first ring in FIG. 48B is considered to be derived from the (010) plane, the (100) plane, and the like of the $InGaZnO_4$ crystal. The second ring in FIG. 48B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8 \times 10^{11}/cm^3$, preferably lower than $1 \times 10^{11}/cm^3$, further preferably lower than $1 \times 10^{10}/cm^3$, and higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

An nc-OS has a region in which a crystal part is observed and a region in which a crystal part is not clearly observed in a high-resolution TEM image. In most cases, the size of a crystal part included in the nc-OS film is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots are shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared to an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure between those of the nc-OS and the amorphous oxide semiconductor.

In a high-resolution TEM image of the a-like OS film, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as a sample A), an nc-OS (referred to as a sample B), and a CAAC-OS (referred to as a sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the InGaZnO$_4$ crystal has a structure in which nine layers including three In—O layers and six Ga—Zn—O layers are layered in the c-axis direction. Accordingly, the distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 49:
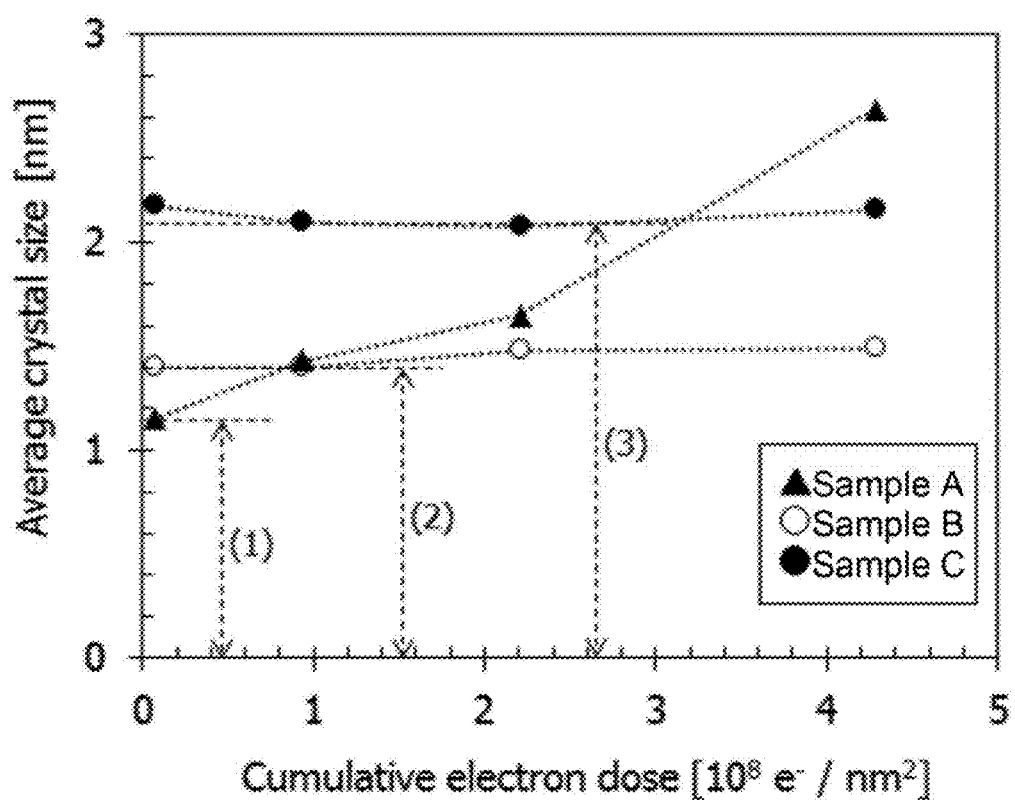
FIG. 49 shows a change in crystal part of an In—Ga—Zn oxide induced by electron irradiation.

FIG. 49 shows change in the average size of crystal parts (at 22 points to 45 points) in each sample. Note that the crystal part size corresponds to the length of a lattice fringe. FIG. 49 indicates that the crystal part size in the a-like OS increases with an increase in the cumulative electron dose. Specifically, as shown by (1) in FIG. 49, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 49, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that single crystals with the same composition do not exist in some cases. In that case, single crystal oxide semiconductors with different compositions are combined at an adequate ratio, which makes it possible to calculate the density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

Embodiment 9

Described in this embodiment are other application examples of the sleep transistor shown in Embodiments 1 to 4.

Structure Example 1 of Word Line Driver Circuit

Figure 50A:
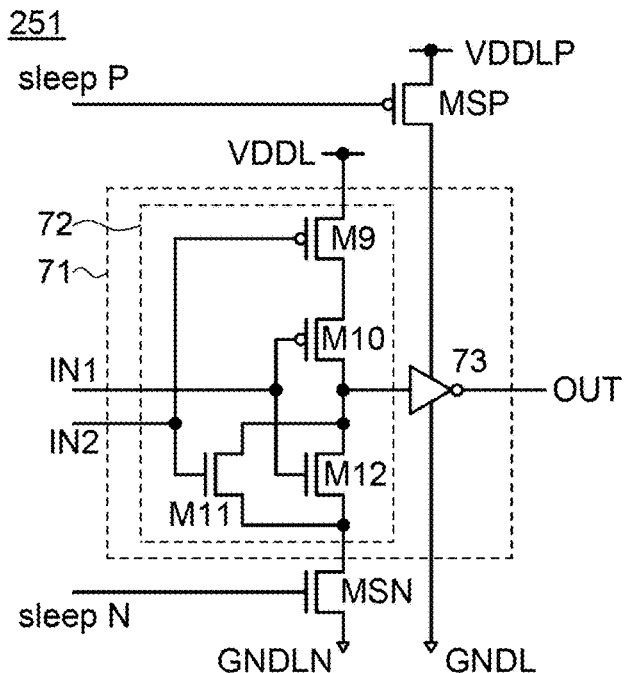
FIGS. 50A and 50B each show a semiconductor device of one embodiment of the present invention.

A word line driver circuit 251 shown in FIG. 50A has a structure in which an OR circuit 71 is connected to the transistors MSP and MSN as sleep transistors. The OR circuit 71 includes a NOR circuit 72 and an inverter circuit 73. The NOR circuit 72 includes transistors M9 to M12.

One of a source and a drain of the transistor M9 is electrically connected to one of a source and a drain of the transistor M10, the other of the source and the drain of the transistor M9 is electrically connected to the wiring VDDL, and a gate of the transistor M9 is electrically connected to a wiring IN2. The other of the source and the drain of the transistor M10 is electrically connected to one of a source and a drain of the transistor M11, one of a source and a drain of the transistor M12, and an input terminal of the inverter circuit 73. A gate of the transistor M10 is electrically connected to a gate of the transistor M12 and a wiring IN1. The other of the source and the drain of the transistor M11 is electrically connected to the other of the source and the drain of the transistor M12. A gate of the transistor M11 is electrically connected to the gate of the transistor M9 and the wiring IN2. An output terminal of the inverter circuit 73 is electrically connected to a wiring OUT. The wiring GNDL is electrically connected to a terminal from which a low potential is input to the inverter circuit 73.

One of a source and a drain of the transistor MSN is electrically connected to the other of the source and the drain of the transistor M11 and the other of the source and the drain of the transistor M12. A gate of the transistor MSN is electrically connected to the wiring sleepN. The other of the source and the drain of the transistor MSN is electrically connected to the wiring GNDLN. One of a source and a drain of the transistor MSP is electrically connected to a terminal from which a high potential is input to the inverter circuit 73. A gate of the transistor MSP is electrically connected to the wiring sleepP. The other of the source and the drain of the transistor MSP is electrically connected to the wiring VDDLP.

The wirings IN1 and IN2 are used to input signals. The wirings VDDL and VDDLP are used to connect a high potential power source or other circuits. The wirings GNDL and GNDLN are used to connect a low potential power source or other circuits. The wiring OUT is used to output signals.

The wirings VDDLP and GNDLN enable control of the on/off states of the transistors MSP and MSN. Hence, when the OR circuit 71 does not operate, the transistors MSP and MSN can be turned off to stop power supply.

Figure 50B:
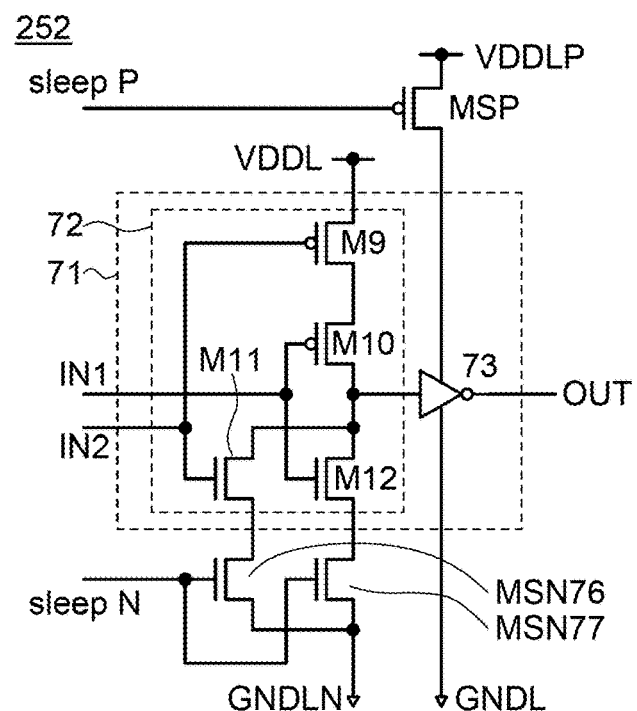

FIG. 50B shows a circuit connection structure different from that of FIG. 50A.

A word line driver circuit 252 in FIG. 50B includes the OR circuit 71 described in FIG. 50A, a transistor MSN76, a transistor MSN77, and the transistor MSP. The OR circuit 71 includes the NOR circuit 72 and the inverter circuit 73.

One of the source and the drain of the transistor M9 is electrically connected to one of the source and the drain of the transistor M10, the other of the source and the drain of the transistor M9 is electrically connected to the wiring VDDL, and the gate of the transistor M9 is electrically connected to the wiring IN2. The other of the source and the drain of the transistor M10 is electrically connected to one of the source and the drain of the transistor M11, one of the source and the drain of the transistor M12, and the input terminal of the inverter circuit 73. The gate of the transistor M10 is electrically connected to the gate of the transistor M12 and the wiring IN1. The gate of the transistor M11 is electrically connected to the gate of the transistor M9 and the wiring IN2. The output terminal of the inverter circuit 73 is electrically connected to the wiring OUT. The wiring GNDL is electrically connected to a terminal from which a low potential is input to the inverter circuit 73.

One of a source and a drain of the transistor MSN76 is electrically connected to the other of the source and the drain of the transistor M11. One of a source and a drain of the transistor MSN77 is electrically connected to the other of the source and the drain of the transistor M12. A gate of the transistor MSN76 and a gate of the transistor MSN77 are electrically connected to the wiring sleepN. The other of the source and the drain of the transistor MSN76 and the other of the source and the drain of the transistor MSN77 are electrically connected to the wiring GNDLN. One of the source and the drain of the transistor MSP is electrically connected to a terminal from which a high potential is input to the inverter circuit 73. The gate of the transistor MSP is electrically connected to the wiring sleepP. The other of the source and the drain of the transistor MSP is electrically connected to the wiring VDDLP.

The wirings IN1 and IN2 are used to input signals. The wirings VDDL and VDDLP are used to connect a high potential power source or other circuits. The wirings GNDL and GNDLN are used to connect a low potential power source or other circuits. The wiring OUT is used to output signals.

The wirings VDDLP and GNDLN enable control of the on/off states of the transistors MSP, MSN76, and MSN77. Hence, when the OR circuit 71 does not operate, the transistors MSP, MSN76, and MSN77 can be turned off to stop power supply.

Structure Example 2 of Word Line Driver Circuit

Figure 51A:
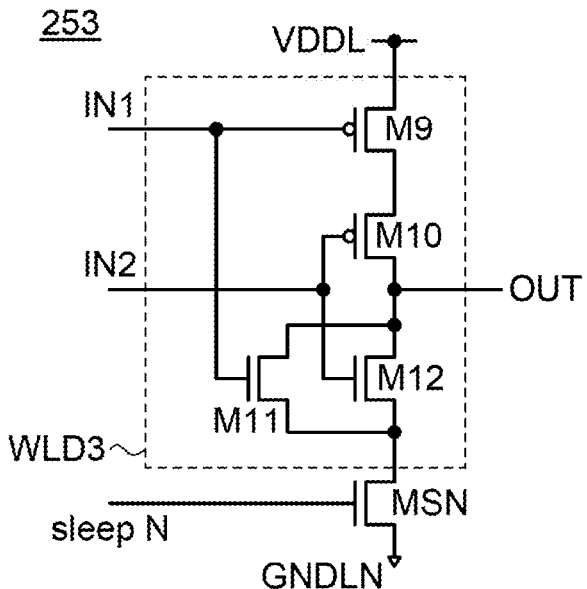
FIGS. 51A and 51B each show a semiconductor device of one embodiment of the present invention.
Figure 51B:
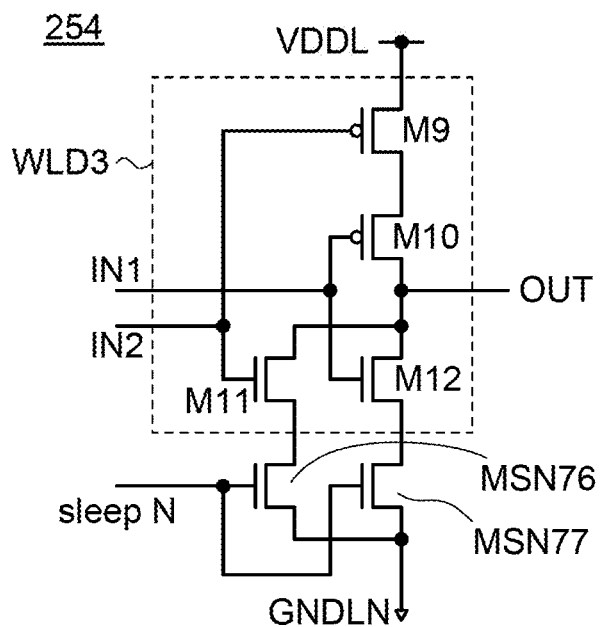

FIGS. 51A and 51B show circuit examples different from those of FIGS. 50A and 50B.

A word line driver circuit 253 shown in FIG. 51A includes a circuit WLD3. The circuit WLD3 has a circuit structure in which the inverter circuit 73 is removed from the OR circuit 71. The word line driver circuit 253 is different from the word line driver circuit 251 in that the wiring OUT is electrically connected to the other of the source and the drain of the transistor M10, the one of the source and the drain of the transistor M11, and the one of the source and the drain of the transistor M12.

In other words, the circuit WLD3 in the word line driver circuit 253 functions as a NOR circuit.

A word line driver circuit 254 shown in FIG. 51B includes a circuit WLD3. The circuit WLD3 has a circuit structure in which the inverter circuit 73 is removed from the OR circuit 71. The word line driver circuit 254 is different from the word line driver circuit 251 in that the wiring OUT is electrically connected to the other of the source and the drain of the transistor M10, the one of the source and the drain of the transistor M11, and the one of the source and the drain of the transistor M12.

In other words, the circuit WLD3 in the word line driver circuit 254 functions as a NOR circuit as in the word line driver circuit 253.

Structure Example 3 of Word Line Driver Circuit

Described here is a structure example of 128 word line driver circuits 253 which are driven for every 16 word line driver circuits.

Figure 52:
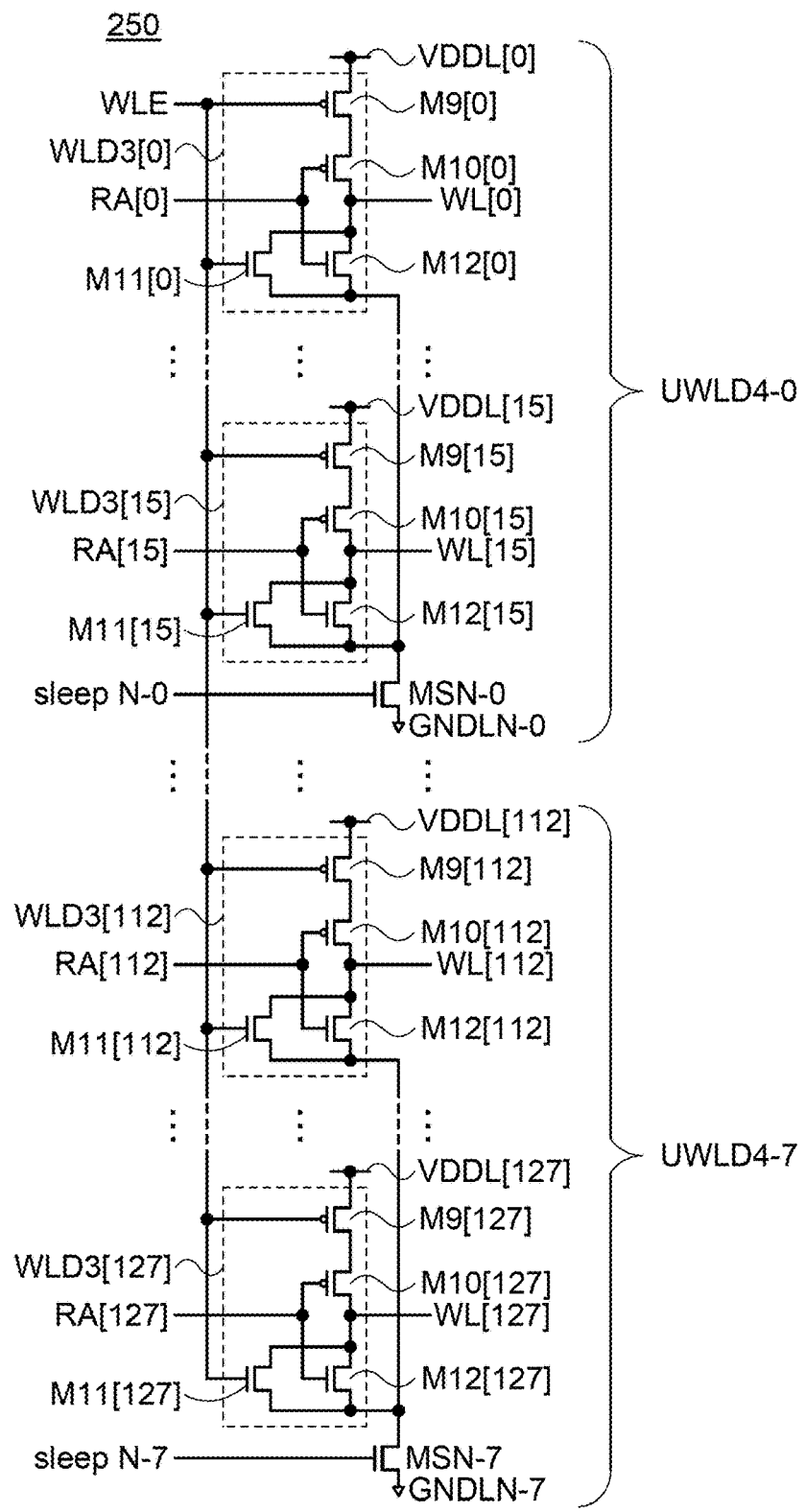
FIG. 52 shows a semiconductor device of one embodiment of the present invention.

FIG. 52 shows an example of a word line driver circuit of one embodiment of the present invention. A word line driver circuit 250 in FIG. 52 consists of 8 stages: each stage includes 16 circuits WLD3 and a sleep transistor (a transistor MSN-0 and a transistor MSN-7 are shown in FIG. 52).

The word line driver circuit 250 includes p-channel transistors M9[0] to M9[127], p-channel transistors M10[0] to M10[127], n-channel transistors M11[0] to M11[127], n-channel transistors M12[0] to M12[127], and n-channel transistors MSN-0 to MSN-7.

As shown in FIG. 52, a circuit WLD3[i] (i is an integer of 16×j to 16×(j+1)−1, and j is an integer of 0 to 7) includes transistors M9[i] to M12[i]. A circuit UWLD4-j includes circuits WLD3[16×j] to WLD3[16×(j+1)−1] and the transistors MSP-j and MSN-j.

One of a source and a drain of the transistor M9[i] is electrically connected to one of a source and a drain of the transistor M10[i], the other of the source and the drain of the transistor M9[i] is electrically connected to the wiring VDDL, and a gate of the transistor M9[i] is electrically connected to the wiring WLE. The other of the source and the drain of the transistor M10[i] is electrically connected to one of a source and a drain of the transistor M11[i], one of a source and a drain of the transistor M12[i], and the wiring WL[0]. A gate of the transistor M10[i] is electrically connected to a gate of the transistor M12[i] and the wiring RA[i]. A gate of the transistor M11[i] is electrically connected to the gate of the transistor M9[i] and the wiring WLE.

One of the source and the drain of the transistor MSN-j is electrically connected to the other of the source and the drain of the transistor M11[i] and the other of the source and the drain of the transistor M12[i]. The gate of the transistor MSN-j is electrically connected to the wiring sleepN-j. The other of the source and the drain of the transistor MSN-j is electrically connected to the wiring GNDLN-j. The other of the source and the drain of the transistor M9[i] is electrically connected to the wiring VDDL[i].

Note that some reference numerals are omitted in FIG. 52. Specifically, FIG. 52 does not show reference numerals except for the following: the wiring sleepN-0, the wiring sleepN-7, the wiring WLE, the wiring RA[0], the wiring RA[15], the wiring RA[112], the wiring RA[127], the wiring WL[0], the wiring WL[15], the wiring WL[112], the wiring WL[127], the wiring VDDL[0], the wiring VDDL[15], the wiring VDDL[112], the wiring VDDL[127], the wiring GNDLN-0, the wiring GNDLN-7, the transistor MSN-0, the transistor MSN-7, the transistor M9[0], the transistor M9[15], the transistor M9[112], the transistor M9[127], the transistor M10[0], the transistor M10[15], the transistor M10[112], the transistor M10[127], the transistor M11[0], the transistor M11[15], the transistor M11[112], the transistor M11[127], the transistor M12[0], the transistor M12[15], the transistor M12[112], the transistor M12[127], the circuit WLD3[0], the circuit WLD3[15], the circuit WLD3[112], the circuit WLD3[127], the circuit UWLD4-0, and the circuit UWLD4-7.

Note that as in the word line driver circuits 251 to 254, the circuit WLD3[i] in the word line driver circuit 250 needs to be connected to a high potential power source and a low potential power source to be driven. Although not shown, the wirings VDDL[0] to VDDL[127] are connected to a high potential power source and supplied with the power source voltage VDD from the high potential power source. Although not shown, the wirings GNDLN-0 to GNDLN-7 are connected to a low potential power source and supplied with the fixed potential GND (also referred to as a reference potential or a ground potential in some cases) from the low potential power source.

The wirings WLE and RA[i] are used to input an external signal to the word line driver circuit 250, and the wiring WL[i] is used to output a writing selection signal from the word line driver circuit 250 to a predetermined memory cell.

<Operation Example of Word Line Driver Circuit>

Figure 53:
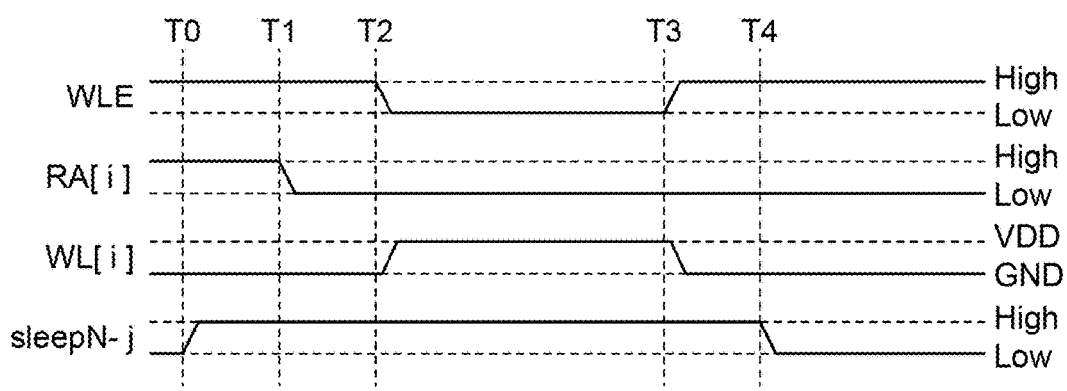
FIG. 53 is a timing chart showing an operation example of the semiconductor device shown in FIG. 52.

Described is an operation example of the word line driver circuit 250 shown in FIG. 52. FIG. 53 is a timing chart for the word line driver circuit 250. Note that for simplicity, the timing chart of FIG. 53 shows an operation example of the circuit WLD3[i] in the j-th stage, and specifically shows changes in the potentials of the wiring WLE, the wiring RA[i], the wiring WL[i], and the wiring sleepN-j. The power source voltage VDD or the fixed potential GND is input to each of the wirings WLE and RA[i]. However, as long as the on/off states of the transistors M9[i], M10[i], M11[i], and M12[i] connected to the wirings WLE and RA[i] can be controlled, a voltage lower than the power source voltage VDD and a voltage higher than the fixed potential GND may be input as a high-level potential (High) and a low-level potential (Low), respectively. Hence, the high-level potential and the low-level potential of the wirings WLE and RA[i] are denoted by "High" and "Low" in FIG. 53, respectively.

At Time T0, the potential of the wiring sleepN-j is High. As a result, the transistor MSN-j connected to the wiring sleepN-j is turned on. That is, the fixed potential GND is applied to the other of the source and the drain of the transistor M11[i] and the other of the source and the drain of the transistor M12[i] through the transistor MSN-j.

From Time T0 to Time T1, a high-level potential is applied to the wirings WLE and RA[i]. That is, a high-level potential is applied to the gates of the transistors M9[i] to M12[i]; accordingly, the transistors M9[i] and M10[i] are turned off whereas the transistor M11[i] and the transistor M12[i] are turned on. Then, the fixed potential GND is output to the wiring WL[i] through the transistors M11[i] and M12[i].

At Time T1, a low-level potential is applied to the wiring RA[i]. At this time, a low-level potential is applied to the gates of the transistors M10[i] and M12[i]; accordingly, the transistor M10[i] is turned on and the transistor M12[i] is turned off. Note that the transistor M11[i] is still on at this time, and thus a low-level potential is output to the wiring WL[i] as in the time before Time T1.

At Time T2, a low-level potential is applied to the wiring WLE. At this time, a low-level potential is applied to the gates of the transistors M9[i] and M11[i]; accordingly, the transistor M9[i] is turned on and the transistor M11[i] is turned off. Since the transistor M11[i] is off, the fixed potential GND ceases to be applied to the wiring WL[i] through the transistor M11[i] or M12[i]. Since the transistors M9[i] and M10[i] are on, the power source voltage VDD is output to the wiring WL[i] through the transistors M9[i] and M10[i].

Note that from Time T2 to Time T3, the power source voltage VDD is applied from the wiring WL[i] to memory cells in the i-th row, i.e., data is written thereto at this time. In other words, when a low-level potential is input to the wiring WLE while a low-level potential is input to at least one of the wirings RA[16×j] to RA[16×(j+1)−1], data can be simultaneously written to the memory cells in a row of any of the wirings RA[16×j] to RA[16×(j+1)−1] that has a low-level potential.

In addition, when all the wirings RA[16×j] to RA[16×(j+1)−1] in the j-th stage have a high-level potential, no data is written to the memory cells in all the rows of the j-th stage. At this time, the transistor MSN-j is preferably off because the circuits WLD3[16×j] to WLD3[16×(j+1)−1] in the j-th stage, namely, the circuit UWLD4-j does not need to operate. This results in interrupted supply of the fixed potential GND to the circuit UWLD4-j from which no writing selection signal is output, reducing power consumption.

At Time T3, a high-level potential is applied to the wiring WLE. At this time, a high-level potential is applied to the gates of the transistors M9[i] and M11[i]; accordingly, the transistor M9[i] is turned off and the transistor M11[i] is turned on. In other words, the on/off states of the transistors M9[i] to M12[i] are returned to the states from Time T1 to Time T2; thus, the fixed potential GND is output to the wiring WL[i].

At Time T4, the potential of the wiring sleepN-j is Low, so that the transistor MSN-j is turned off. This results in interrupted supply of the fixed potential GND to the word line driver circuit 250, reducing power consumption.

Note that in the timing chart of FIG. 53, the potential of the wiring sleepN-j is High at Time T0; however, the operation of the word line driver circuit 250 is not limited to this. For example, a high-level potential may be applied to the wiring sleepN-j from Time T1 to Time T2.

Other Circuit Structure Examples

Figure 54:
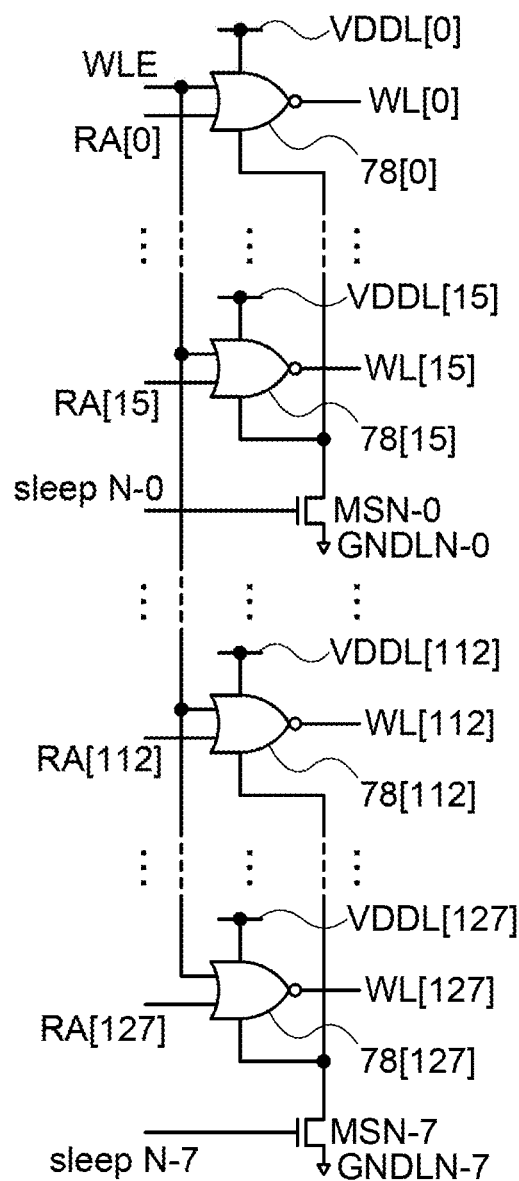
FIG. 54 shows a semiconductor device of one embodiment of the present invention.

Since the circuits WLD3[0] to WLD3[127] are equivalent to a NOR circuit, the word line driver circuit 250 shown in FIG. 52 can be replaced with a word line driver circuit 255 shown in FIG. 54.

Specifically, the word line driver circuit 255 is obtained by replacing the circuits WLD3[0] to WLD3[127] in the word line driver circuit 250 with NOR circuits 78[0] to 78[127]. Note that FIG. 54 only shows the NOR circuits 78[0], 78[15], 78[112], and 78[127], and other NOR circuits are omitted.

A first input terminal of the NOR circuit 78[i] is electrically connected to the wiring WLE, a second input terminal of the NOR circuit 78[i] is electrically connected to the wiring RA[i], and an output terminal of the NOR circuit 78[i] is electrically connected to the wiring WL[i]. A high potential input terminal of the NOR circuit 78[i] is electrically connected to the wiring VDDL[i], and a low potential input terminal of the NOR circuit 78[i] is electrically connected to one of the source and the drain of the transistor MSN-j. The gate of the transistor MSN-j is electrically connected to the wiring sleepN-j, and the other of the source and the drain of the transistor MSN-j is electrically connected to the wiring GNDLN-0.

With such a circuit structure, the word line driver circuit 255 can operate in a manner similar to that of the word line driver circuit 250.

Note that one embodiment of the present invention is not limited to any one of the word line driver circuits 250 to 255 described in this embodiment. The circuit structures of the word line driver circuits 250 to 255 can be changed as appropriate depending on the case or circumstances.

Figure 55A:
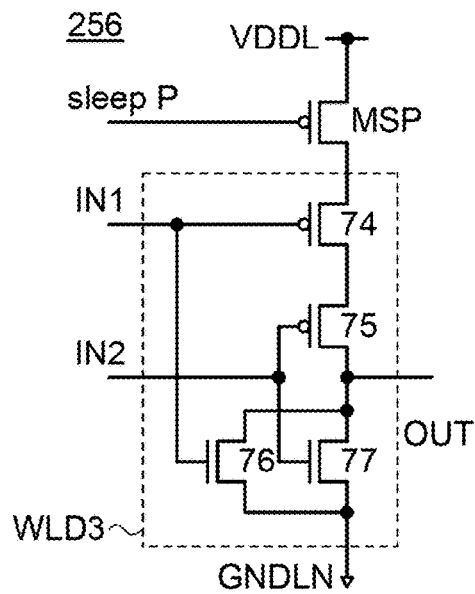
FIGS. 55A to 55C each show a semiconductor device of one embodiment of the present invention.

For example, in the word line driver circuit 253 in FIG. 51A, the n-channel transistor MSN as a sleep transistor is electrically connected to the other of the source and the drain of the transistor M11 and the other of the source and the drain of the transistor M12; alternatively, the p-channel transistor MSP may be provided between the wiring VDDL and the other of the source and the drain of the transistor M9. A word line driver circuit 256 with such a structure is shown in FIG. 55A. Note that in the word line driver circuit 256, the gate of the transistor MSP is electrically connected to the wiring sleepP to be controlled on or off.

Figure 55B:
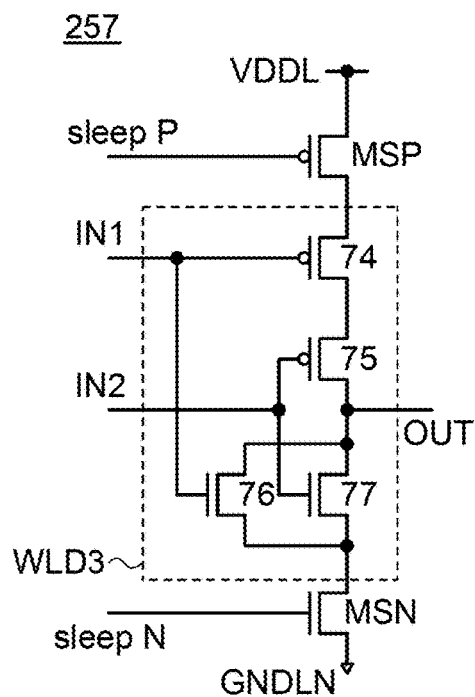

Alternatively, the word line driver circuit may include the transistor MSN and the transistor MSP. A word line driver circuit 257 with such a structure is shown in FIG. 55B.

Figure 55C:
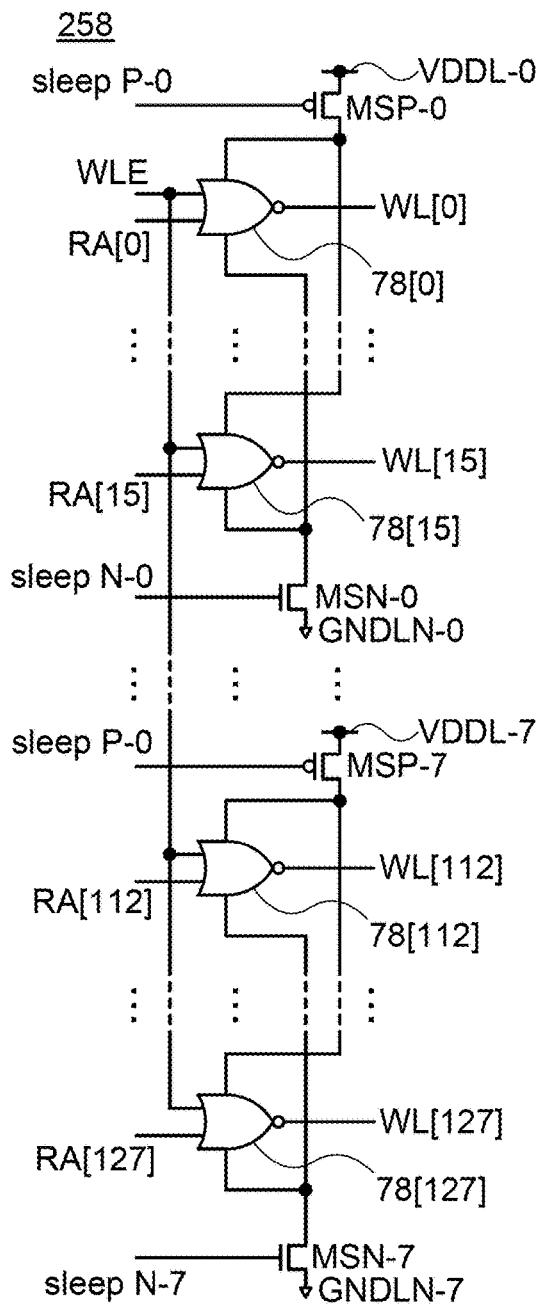

Furthermore, for example, the n-channel transistor MSN-j is electrically connected to the low potential input terminal of the NOR circuit 78[i] in the word line driver circuit 255; additionally, the p-channel transistor MSP-j may be electrically connected to the high potential input terminal of the NOR circuit 78[i]. A word line driver circuit 258 with such a structure is shown FIG. 55C. One of the source and the drain of the transistor MSP-j is electrically connected to the high potential input terminal of the NOR circuit 78[i], the other of the source and the drain of the transistor MSP-j is electrically connected to a wiring VDDL-j, and the gate of the transistor MSP-j is electrically connected to the wiring sleepP-0. The on/off state of the transistor MSP-j can be controlled with such a structure. When the transistor MSP-j is off while the word line driver circuit 258 is out of operation, the supply of the high-level potential can be stopped. This reduces the power consumption of the word line driver circuit 258 which is not operating.

This embodiment can be combined with any of the other embodiments in this specification as appropriate.

Embodiment 10

In this embodiment, application examples of the memory device including the semiconductor device described in any of the above embodiments to an electronic component and to an electronic device including the electronic component will be described with reference to FIGS. 56A and 56B and FIGS. 57A to 57E.

<Electronic Component>

Figure 56A:
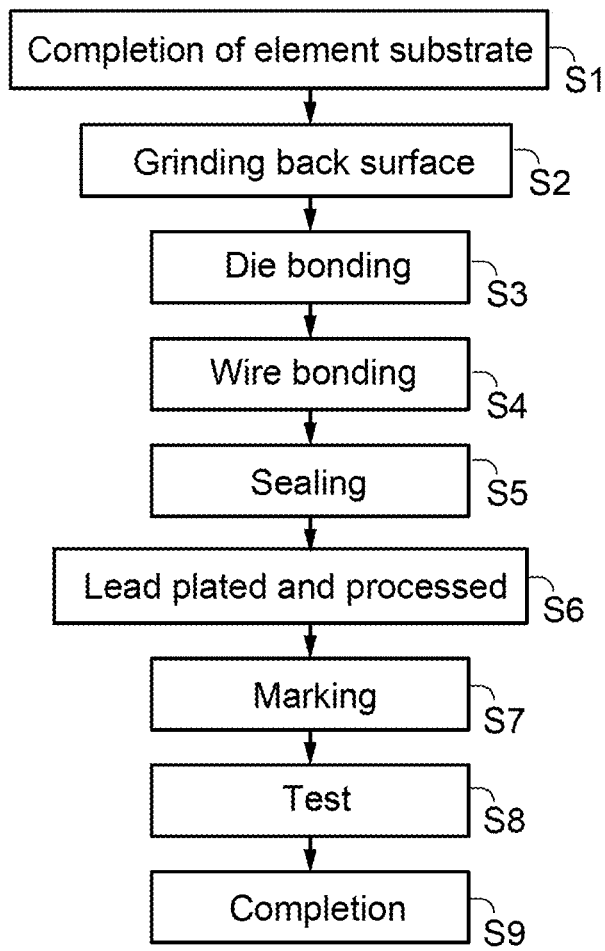
FIGS. 56A and 56B are a flowchart and a perspective view showing one embodiment of the present invention.

FIG. 56A shows an example where the memory device including the semiconductor device described in any of the above embodiments is used as an electronic component. Note that the electronic component is also referred to as a semiconductor package or an IC package. This electronic component has various standards and names depending on the direction and the shape of terminals. Therefore, an example of the electronic component will be described in this embodiment.

A semiconductor device including transistors shown in Embodiment 1 is completed through an assembly process (post-process) of integrating detachable components on a printed board.

The post-process can be completed through the steps in FIG. 56A. Specifically, after an element substrate obtained in the preceding process is completed (Step S1), a back surface of the substrate is ground (Step S2). The substrate is thinned in this step to reduce substrate warpage or the like caused in the preceding process and to reduce the size of the component.

After the back surface of the substrate is ground, a dicing step is performed to divide the substrate into a plurality of chips. Then, the divided chips are separately picked up, placed on a lead frame, and bonded thereto in a die bonding step (Step S3). In the die bonding step, the chip is bonded to the lead frame by an appropriate method depending on products, for example, bonding with a resin or a tape. Note that in the die bonding step, a chip may be placed on and bonded to an interposer.

Note that in this embodiment, when an element is formed on a surface of a substrate, the other surface is referred to as a back surface (a surface on which the element is not formed).

Next, wire bonding for electrically connecting a lead of the lead frame and an electrode on the chip through a metal wire is performed (Step S4). As the metal wire, a silver wire or a gold wire can be used. Ball bonding or wedge bonding can be used as the wire bonding.

The wire-bonded chip is subjected to a molding step of sealing the chip with an epoxy resin or the like (Step S5). Through the molding step, the inside of the electronic component is filled with a resin, whereby damage to a mounted circuit portion and wire caused by external mechanical force as well as deterioration of characteristics due to moisture or dust can be reduced.

Subsequently, the lead of the lead frame is plated. Then, the lead is cut and processed (Step S6). This plating process prevents rust of the lead and facilitates soldering at the time of mounting the chip on a printed board in a later step.

Next, printing (marking) is performed on a surface of the package (Step S7). After a final testing step (Step S8), the electronic component is completed (Step S9).

The above-described electronic component includes the semiconductor device described in the above embodiment. Thus, a highly reliable electronic component can be obtained.

Figure 56B:
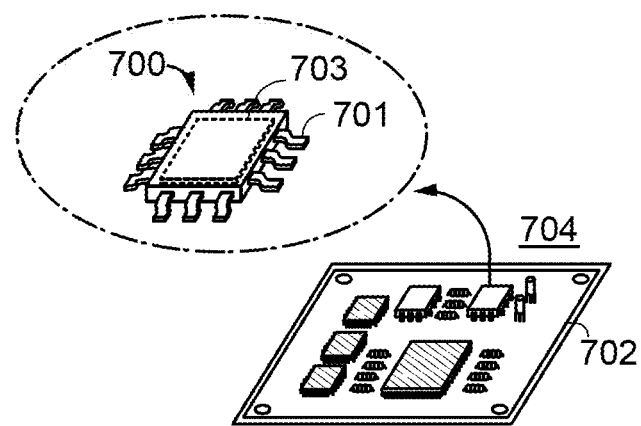

FIG. 56B is a perspective schematic diagram illustrating a quad flat package (QFP) as an example of the completed electronic component. An electronic component 700 in FIG. 56B includes a lead 701 and a circuit portion 703. The electronic component 700 in FIG. 56B is mounted on a printed board 702, for example. A plurality of electronic components 700 which are combined and electrically connected to each other over the printed board 702 can be mounted on an electronic device. A completed circuit board 704 is provided in an electronic device or the like.

<Electronic Device>

Described next are electronic devices including the aforementioned electronic component (memory device).

A semiconductor device of one embodiment of the present invention can be used for display devices, personal computers, or image reproducing devices provided with recording media (typically, devices that reproduce the content of recording media such as digital versatile discs (DVD) and have displays for displaying the reproduced images). Other examples of electronic devices that can include the semiconductor device of one embodiment of the present invention include cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and medical devices. FIGS. 57A to 57F illustrate specific examples of these electronic devices.

Figure 57A:
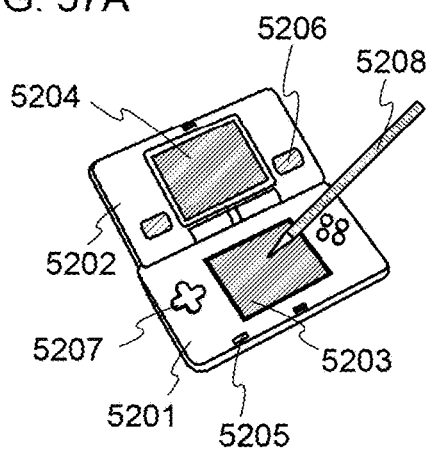
FIGS. 57A to 57F illustrate examples of an electronic device of one embodiment of the present invention.

FIG. 57A illustrates a portable game machine, which includes a housing 5201, a housing 5202, a display portion 5203, a display portion 5204, a microphone 5205, a speaker 5206, an operation key 5207, a stylus 5208, and the like. The semiconductor device of one embodiment of the present invention can be used for a variety of integrated circuits included in portable game machines. Although the portable game machine in FIG. 57A has the two display portions 5203 and 5204, the number of display portions included in a portable game machine is not limited to this.

Figure 57B:
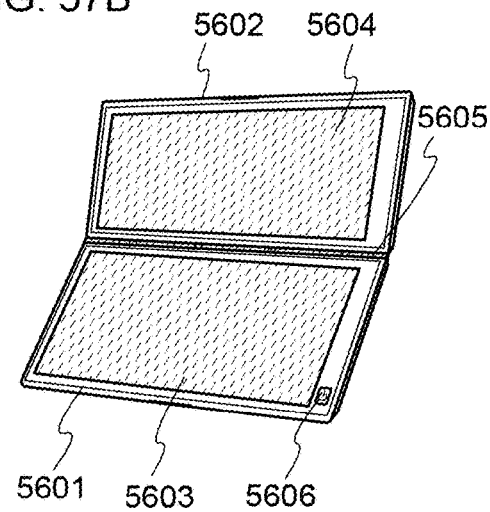

FIG. 57B illustrates a portable information terminal including a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel portion of a display device.

Figure 57C:
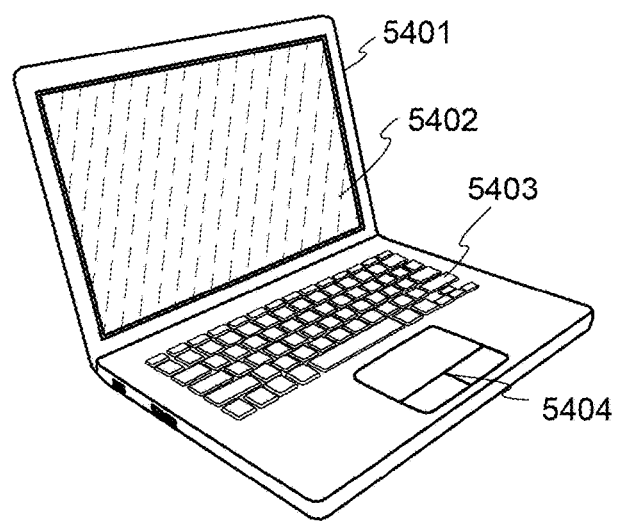

FIG. 57C illustrates a notebook type personal computer including a housing 5401, a display portion 5402, a keyboard 5403, a pointing device 5404, and the like. The semiconductor device of one embodiment of the present invention can be used for a variety of integrated circuits included in notebook type personal computers.

Figure 57D:
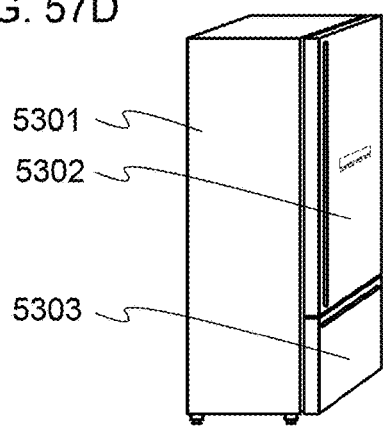

FIG. 57D illustrates an electric refrigerator-freezer including a housing 5301, a refrigerator door 5302, a freezer door 5303, and the like. The semiconductor device of one embodiment of the present invention can be used for a variety of integrated circuits included in electric refrigerator-freezers.

Figure 57E:
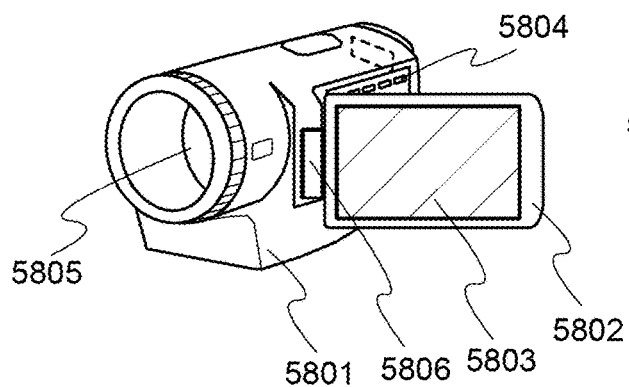

FIG. 57E illustrates a video camera including a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 57F:
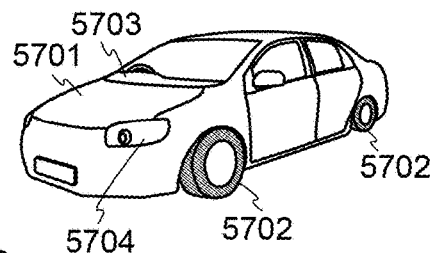

FIG. 57F illustrates a passenger car including a car body 5701, wheels 5702, a dashboard 5703, lights 5704, and the like. The semiconductor device of one embodiment of the present invention can be used for a variety of integrated circuits included in passenger cars.

Example

Described in this example are the measured results of the characteristics of a memory device including an OS transistor.

A possible error in a memory is a soft error due to the entry of radiation. The soft error is a phenomenon in which a malfunction such as inversion of data stored in a memory is caused by electron-hole pair generation when a transistor is irradiated with a rays emitted from a material of a memory or a package or the like, secondary cosmic ray neutrons generated by nuclear reaction of primary cosmic rays entering the Earth's atmosphere from outer space with nuclei of atoms existing in the atmosphere, or the like. In this example, the soft-error tolerance of a memory including an OS transistor was evaluated by radiation irradiation.

The measurement was performed using 8 k-bit memories each including 8192 memory cells 50 shown in FIG. 33F or 8192 memory cells 60 shown in FIG. 33D. In the memory cell 50 shown in FIG. 33F, the capacitance of the capacitors 47 and 48 is set to 30 fF, the transistors 43 and 44 and the transistors 53 to 56 are Si transistors with a channel length of 0.35 μm, and the transistors 41 and 42 are OS transistors with a channel length of 0.8 μm. In the memory cell 60 shown in FIG. 33D, the capacitance of the capacitor 64 is set to 6.7 fF, the transistors 62 and 63 are Si transistors with a channel length of 0.35 μm, and the transistor 61 is an OS transistor with a channel length of 0.8 μm. In either memory cell, an SOI substrate is used for the Si transistors.

The soft-error tolerances of 8 k-bit memories 1 to 3 including the above memory cells were evaluated by radiation irradiation of the memories and by measurement of data retention characteristics thereof at that time. The memory 1 is in a state where data is retained at the node N1 of the memory cell 60 illustrated in FIG. 33D. The memory 2 is in a state where data is retained at the nodes N4 and N5 of the circuit 58 including OS transistors in the memory cell 50 illustrated in FIG. 33F. The memory 3 is in a state where data is retained at the nodes N2 and N3 of the circuit 57 corresponding to an SRAM cell in the memory cell 50 illustrated in FIG. 33F. Two samples (samples A and B) of each of the memories 1 to 3 were measured. A radiation source of the radiation with which the memories 1 to 3 are irradiated is an α-ray source using americium (Am) having a mass number of 241, and the distance between the radiation source and the sample is set to 1 mm. In tests, the number of memory cells 50 or 60 where retained data were varied by radiation irradiation was counted as the number of soft errors. Table 1 shows the test results.

TABLE 1

|  |  | Test No. | | |
| --- | --- | --- | --- | --- |
|  |  | 1 | 2 | 3 |
| Test conditions | Power source voltage | 2 V | Minimum operating voltage | Minimum operating voltage |
|  | Distance to radiation source | 1 mm | 1 mm | 1 mm |
|  | Retention time | 5 min. | 5 min. | 20 min. |
| Memory 1 | Number of soft errors (A) | 0 | 0 | — |
|  | Number of soft errors (B) | 0 | 0 | — |
| Memory 2 | Number of soft errors (A) | 0 | 0 | 0 |
|  | Number of soft errors (B) | 0 | 0 | 0 |
| Memory 3 | Number of soft errors (A) | 0 | 1 | 5 |
|  | Number of soft errors (B) | 0 | 1 | 2 |

The tests were conducted under three kinds of conditions (tests 1 to 3). Through the test 1 in which the memories had a power source voltage of 2 V and retained data for five minutes in the state of being irradiated with radiation, no soft errors occurred in any of the samples.

Next, the test 2 was conducted by changing the operating voltage to the lowest voltage of less than 2 V at which the memories can operate (the minimum operating voltage). As a result, a soft error was observed in each of the samples A and B of the memory 3. That is, a soft error occurred in the circuit 57 corresponding to the SRAM cell in FIG. 33F. On the other hand, no soft errors were observed in the memories 1 and 2 where data was retained with the OS transistor(s).

Next, the test 3 was conducted by extending the data retention time to minutes while keeping the operating voltage at the minimum operating voltage. As a result, the number of soft errors increased in the memory 3. On the other hand, in the memory 2 where data was retained with the OS transistors, no soft errors were observed and data was retained correctly even though the retention time was extended and the amount of radiation irradiation was increased.

The results of the tests 1 to 3 show that the memory cell 60 illustrated in FIG. 33D has a high soft-error tolerance. In addition, in the memory cell 50 illustrated in FIG. 33F, the occurrence of soft errors can be reduced when data stored in the circuit 57 corresponding to an SRAM cell is temporarily stored in the circuit 58 including the OS transistors. That is, the soft-error tolerance of an SRAM cell can be improved by backup using OS transistors.

As described above, a highly reliable memory device having a high soft-error tolerance can be obtained by configuring memory cells using OS transistors.

(Notes on the Description in this Specification and the Like)

The following are notes on the description of the above embodiments and structures in the embodiments.

<Notes on One Embodiment of the Present Invention Described in Embodiments>

One embodiment of the present invention can be constituted by appropriately combining the structure described in an embodiment with any of the structures described the other embodiments. In addition, in the case where a plurality of structure examples are described in one embodiment, some of the structure examples can be combined as appropriate.

Note that what is described (or part thereof) in an embodiment can be applied to, combined with, or replaced with another content in the same embodiment and/or what is described (or part thereof) in another embodiment or other embodiments.

Note that in each embodiment, a content described in the embodiment is a content described with reference to a variety of diagrams or a content described with text disclosed in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

<Notes on Ordinal Numbers>

In this specification and the like, ordinal numbers such as "first", "second", and "third" are used in order to avoid confusion among components. Thus, the terms do not limit the number or order of components. In the present specification and the like, a "first" component in one embodiment can be referred to as a "second" component in other embodiments or claims. Alternatively, in the present specification and the like, a "first" component in one embodiment can be referred to without the ordinal number in other embodiments or claims.

<Notes on the Description for Drawings>

Embodiments are described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the description of the embodiments. Note that in the structures of the invention described below, the same portions or portions having similar functions are denoted by the same reference numerals in different drawings, and the description of such portions is not repeated.

In this specification and the like, the terms for explaining arrangement, such as "over" and "under", are used for convenience to describe the positional relation between components with reference to drawings. The positional relation between components is changed as appropriate in accordance with a direction in which each component is described. Thus, the positional relation is not limited to that described with a term used in this specification and can be explained with another term as appropriate depending on the situation.

The term "over" or "under" does not necessarily mean that a component is placed directly on or directly below and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is associated with a plurality of functions or a case in which a plurality of circuits are associated with one function. Therefore, the segmentation of blocks in a block diagram is not limited by any of the components described in the specification and can be differently determined as appropriate depending on situations.

In the drawings, the size, the layer thickness, or the region is determined arbitrarily for description convenience; therefore, embodiments of the present invention are not limited to such a scale. Note that the drawings are schematically shown for clarity, and embodiments of the present invention are not limited to shapes or values shown in the drawings. For example, the following can be included: variation in signal, voltage, or current due to noise or difference in timing.

In drawings such as a top view (also referred to as a plan view or a layout view) and a perspective view, some of components might not be illustrated for clarity of the drawings.

In the drawings, the same components, components having similar functions, components formed of the same material, or components formed at the same time are denoted by the same reference numerals in some cases, and the description thereof is not repeated in some cases.

<Notes on Expressions that can be Rephrased>

In this specification and the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the term such as "electrode" or "wiring" does not limit a function of a component. For example, an "electrode" is used as part of a "wiring" in some cases, and vice versa. Moreover, the term "electrode" or "wiring" can also mean a combination of a plurality of "electrodes" or "wirings" formed in an integrated manner.

In this specification and the like, voltage and potential can be replaced with each other. The voltage refers to a potential difference from a reference potential. When the reference potential is a ground potential, for example, a voltage can be replaced with a potential. The ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, the term "conductive layer" can be changed into the term "conductive film" in some cases. Moreover, the term "insulating film" can be changed into the term "insulating layer" in some cases, or can be replaced with a word not including the term "film" or "layer". For example, the term "conductive layer" or "conductive film" can be changed into the term "conductor" in some cases. Furthermore, for example, the term "insulating layer" or "insulating film" can be changed into the term "insulator" in some cases.

In this specification and the like, the term "wiring" can be replaced with the term such as "signal line" or "power source line" as appropriate, and vice versa. The term "power source line" can be replaced with the term such as "signal line", and vice versa.

<Notes on Definitions of Terms>

The following are definitions of the terms mentioned in the above embodiments.

<<Semiconductor>>

In this specification, a "semiconductor" includes characteristics of an "insulator" in some cases when the conductivity is sufficiently low, for example. Furthermore, it is difficult to strictly distinguish a "semiconductor" and an "insulator" from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Note that a "semiconductor" includes characteristics of a "conductor" in some cases when the conductivity is sufficiently high, for example. Furthermore, it is difficult to strictly distinguish a "semiconductor" and a "conductor" from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

In this specification, an impurity in a semiconductor refers to, for example, elements other than the main components of a semiconductor layer. For example, an element with a concentration of lower than 0.1 atomic % is an impurity.

When an impurity is contained, the density of states (DOS) may be formed in a semiconductor, the carrier mobility may be decreased, or the crystallinity may be decreased, for example. In the case where the semiconductor is an oxide semiconductor, examples of an impurity which changes the characteristics of the semiconductor include Group 1 elements, Group 2 elements, Group 14 elements, Group 15 elements, and transition metals other than the main components; specific examples are hydrogen (also included in water), lithium, sodium, silicon, boron, phosphorus, carbon, and nitrogen. In the case of an oxide semiconductor, oxygen vacancy may be formed by entry of impurities such as hydrogen. Further, in the case where the semiconductor is a silicon layer, examples of an impurity which changes the characteristics of the semiconductor include oxygen, Group 1 elements except hydrogen, Group 2 elements, Group 13 elements, and Group 15 elements.

<<Transistor>>

In this specification, a transistor is an element having at least three terminals of a gate, a drain, and a source. The transistor has a channel formation region between a drain (a drain terminal, a drain region, or a drain electrode) and a source (a source terminal, a source region, or a source electrode), and current can flow through the drain, the channel formation region, and the source. Note that in this specification and the like, a channel formation region refers to a region through which current mainly flows.

Furthermore, the functions of a source and a drain might be switched when transistors having different polarities are employed or a direction of current flow is changed in circuit operation, for example. Therefore, the terms "source" and "drain" can be switched in this specification and the like.

<<Switch>>

In this specification and the like, a switch is in a conductive state (on state) or in a non-conductive state (off state) to determine whether current flows therethrough or not. Alternatively, a switch has a function of selecting and changing a current path.

Examples of the switch include an electrical switch and a mechanical switch. That is, the switch is not limited to a certain element and any element can be used as long as it can control current.

Examples of the electrical switch include a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source electrode and a drain electrode of the transistor are electrically short-circuited. Furthermore, an "off state" of the transistor refers to a state in which the source electrode and the drain electrode of the transistor are electrically disconnected. In the case where a transistor operates just as a switch, the polarity (conductivity type) of the transistor is not particularly limited to a certain type.

An example of the mechanical switch is a switch formed using a micro electro mechanical system (MEMS) technology, such as a digital micromirror device (DMD). Such a switch includes an electrode which can be moved mechanically, and operates by controlling conduction and non-conduction in accordance with movement of the electrode.

<<Channel Length>>

In this specification and the like, the channel length refers to, for example, the distance between a source (source region or source electrode) and a drain (drain region or drain electrode) in a region where a semiconductor (or a portion where current flows in a semiconductor when a transistor is on) and a gate electrode overlap with each other or a region where a channel is formed in a top view of the transistor.

Note that in one transistor, channel lengths in all regions do not necessarily have the same value. In other words, the channel length of one transistor is not fixed to one value in some cases. Therefore, in this specification, the channel length is any one of values, the maximum value, the minimum value, or the average value, in a region where a channel is formed.

<<Channel Width>>

In this specification and the like, the channel width refers to, for example, the length of a portion where a source and a drain face each other in a region where a semiconductor (or a portion where a current flows in a semiconductor when a transistor is on) and a gate electrode overlap with each other, or a region where a channel is formed in a top view of the transistor.

Note that in one transistor, channel widths in all regions do not necessarily have the same value. In other words, the channel width of one transistor is not fixed to one value in some cases. Therefore, in this specification, the channel width is any one of values, the maximum value, the minimum value, or the average value, in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a top surface of a semiconductor is higher than the proportion of a channel region formed in a side surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is the length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from the one obtained by calculation using an effective channel width is obtained in some cases.

<<Connection>>

In this specification and the like, when it is described that X and Y are connected, the case where X and Y are electrically connected, the case where X and Y are functionally connected, and the case where X and Y are directly connected are included therein. Accordingly, another element may be interposed between elements having a connection relation shown in drawings and texts, without limiting to a predetermined connection relation, for example, the connection relation shown in the drawings and the texts.

Here, X, Y, and the like each denote an object (e.g., a device, an element, a circuit, a line, an electrode, a terminal, a conductive film, or a layer).

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up converter or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that X and Y are electrically connected, the description is the same as the case where it is explicitly only described that X and Y are connected.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

<<Parallel and Perpendicular>>

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

<<Trigonal and Rhombohedral>>

In this specification, trigonal and rhombohedral crystal systems are included in a hexagonal crystal system.

This application is based on Japanese Patent Application serial No. 2015-023048 filed with Japan Patent Office on Feb. 9, 2015, the entire contents of which are hereby incorporated by reference.

What is claimed is:

1. A semiconductor device comprising a plurality of first circuits, a first transistor, and a second transistor in a second circuit, wherein at least one of the plurality of first circuits includes a NAND circuit and an inverter circuit, wherein the inverter circuit includes a first input terminal, a first output terminal, a first potential input terminal, and a second potential input terminal, wherein the NAND circuit includes a second input terminal, a third input terminal, a second output terminal, a third potential input terminal, and a fourth potential input terminal, wherein the second output terminal is electrically connected to the first input terminal, wherein the first potential input terminal is electrically connected to one of a source and a drain of the first transistor, wherein the fourth potential input terminal is electrically connected to one of a source and a drain of the second transistor, wherein a potential from a high potential power source is input to the other of the source and the drain of the first transistor, wherein a potential from a low potential power source is input to the other of the source and the drain of the second transistor, wherein the first transistor is a p-channel transistor and the second transistor is an n-channel transistor, wherein, in the second circuit, a second input terminal of one of NAND circuits is electrically connected to a second input terminal of another NAND circuit, wherein a first potential input terminal of each of inverter circuits is electrically connected to the one of the source and the drain of the first transistor, and wherein a fourth potential input terminal of the one of the NAND circuits is electrically connected to the one of the source and the drain of the second transistor.

2. The semiconductor device according to claim 1, further comprising a plurality of second circuits, wherein the second input terminal of the one of the NAND circuits is electrically connected to the second input terminal of the another NAND circuit.

3. The semiconductor device according to claim 1, wherein the first transistor and the second transistor each include an oxide semiconductor in a channel formation region.

4. A memory device comprising the semiconductor device according to claim 1.

5. An electronic device comprising a housing and the memory device according to claim 4.

* * * * *